(12) United States Patent
Kim

(10) Patent No.: US 10,109,634 B2
(45) Date of Patent: Oct. 23, 2018

(54) SEMICONDUCTOR DEVICE HAVING AIR GAP AND METHOD FOR MANUFACTURING THE SAME, MEMORY CELL HAVING THE SAME AND ELECTRONIC DEVICE HAVING THE SAME

(71) Applicant: SK hynix Inc., Gyeonggi-do (KR)

(72) Inventor: Seung-Hwan Kim, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 43 days.

(21) Appl. No.: 15/258,588

(22) Filed: Sep. 7, 2016

(65) Prior Publication Data

US 2016/0380060 A1    Dec. 29, 2016

Related U.S. Application Data

(63) Continuation-in-part of application No. 14/858,732, filed on Sep. 18, 2015, now Pat. No. 9,799,739.

(30) Foreign Application Priority Data

Apr. 20, 2015  (KR) .................... 10-2015-0055446

(51) Int. Cl.
  *H01L 29/66*  (2006.01)
  *H01L 27/105*  (2006.01)
  (Continued)

(52) U.S. Cl.
  CPC ........ *H01L 27/1052* (2013.01); *H01L 21/764* (2013.01); *H01L 29/0649* (2013.01);
  (Continued)

(58) Field of Classification Search
  CPC ......... H01L 27/10823; H01L 27/10876; H01L 27/1052; H01L 27/10885; H01L 29/1083; H01L 29/407; H01L 29/4236
  See application file for complete search history.

(56) References Cited

U.S. PATENT DOCUMENTS 8,338,875 B2    12/2012  Nakao
2010/0096693 A1*  4/2010  Hong ............... H01L 27/10876
                                                257/331

(Continued)

FOREIGN PATENT DOCUMENTS

KR    1020090036283    4/2009
KR    1020160042561    4/2016

OTHER PUBLICATIONS

Office Action issued by the United States Patent and Trademark Office for a parent U.S. Appl. No. 14/858,732 dated Aug. 25, 2016.

(Continued)

*Primary Examiner* — Frederick B Hargrove
(74) *Attorney, Agent, or Firm* — IP & T Group LLP

(57) ABSTRACT

A method for fabricating a semiconductor device may include: forming a plurality of first isolation trenches and a plurality of line-shaped active regions by etching a semiconductor substrate; forming a line-shaped device isolation region in each of the plurality of first isolation trenches; forming a plurality of second isolation trenches extending in a second direction by etching the plurality of line-shaped active regions and the plurality of line-shaped device isolation regions; forming a connection trench to connect the plurality of second isolation trenches to each other; forming a shielding line in each of the plurality of second isolation trenches; and forming a shielding line interconnection in the connection trench.

9 Claims, 81 Drawing Sheets

(51) Int. Cl.
*H01L 29/49* (2006.01)
*H01L 29/40* (2006.01)
*H01L 29/423* (2006.01)
*H01L 21/764* (2006.01)
*H01L 29/06* (2006.01)
*H01L 29/10* (2006.01)
*H01L 27/108* (2006.01)

(52) U.S. Cl.
CPC ........ *H01L 29/1083* (2013.01); *H01L 29/407* (2013.01); *H01L 29/4236* (2013.01); *H01L 29/4925* (2013.01); *H01L 27/10876* (2013.01); *H01L 27/10885* (2013.01)

(56) References Cited

U.S. PATENT DOCUMENTS

| | | | |
|---|---|---|---|
| 2011/0303974 A1 | 12/2011 | Kim et al. | |
| 2012/0025300 A1* | 2/2012 | Chung | H01L 27/10876 |
| | | | 257/330 |
| 2013/0001675 A1* | 1/2013 | Chung | H01L 27/10823 |
| | | | 257/329 |
| 2013/0105872 A1* | 5/2013 | Kim | H01L 27/10823 |
| | | | 257/296 |
| 2014/0015027 A1 | 1/2014 | Mikasa | |
| 2014/0015034 A1 | 1/2014 | Ryu et al. | |
| 2014/0061850 A1* | 3/2014 | Cho | H01L 27/0203 |
| | | | 257/506 |
| 2014/0117438 A1* | 5/2014 | Meiser | H01L 29/407 |
| | | | 257/330 |

OTHER PUBLICATIONS

Office Action issued by the United States Patent and Trademark Office for U.S. Appl. No. 15/209,502 in the same family tree dated Mar. 13, 2017.

* cited by examiner

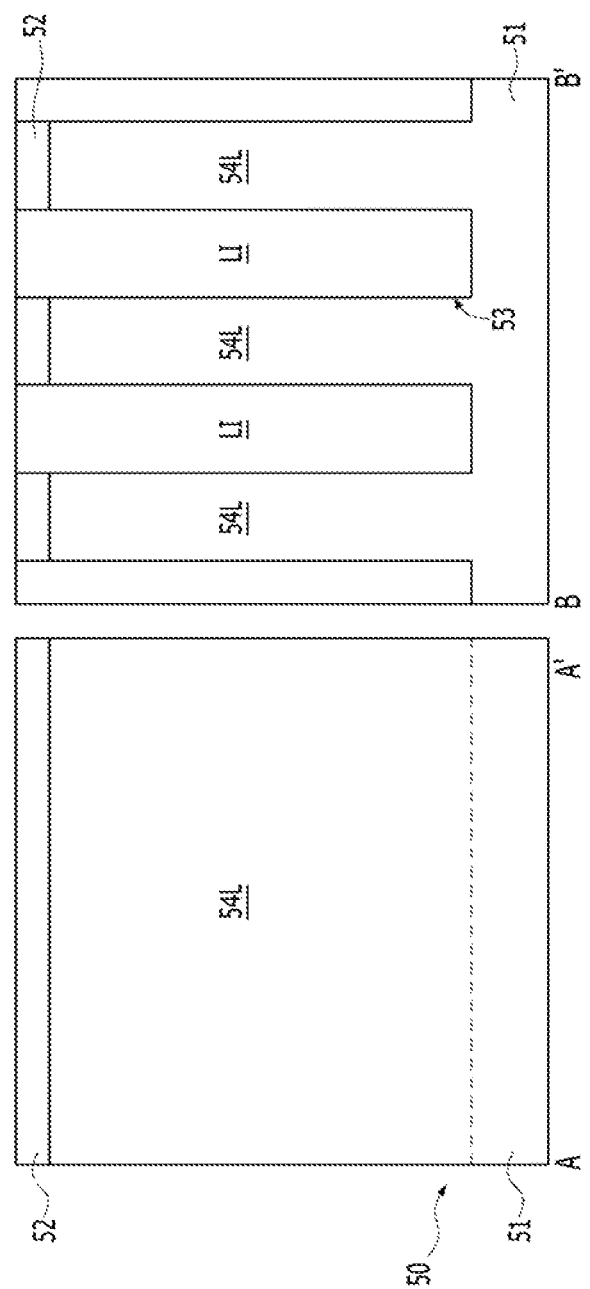

SEMICONDUCTOR DEVICE HAVING AIR GAP AND METHOD FOR MANUFACTURING THE SAME, MEMORY CELL HAVING THE SAME AND ELECTRONIC DEVICE HAVING THE SAME

CROSS-REFERENCE TO RELATED APPLICATIONS

This application is a Continuation-In-Part (CIP) application of U.S. application Ser. No. 14/858,732 filed on Sep. 18, 2015, entitled "SEMICONDUCTOR DEVICE HAVING AIR GAP AND METHOD FOR MANUFACTURING THE SAME, MEMORY CELL HAVING THE SAME AND ELECTRONIC DEVICE HAVING THE SAME", and claims priority thereto. The disclosure of the U.S. application Ser. No. 14/858,732 is hereby incorporated by reference in its entirety. The present application further claims priority to Korean Patent Application No. 10-2015-0055446, filed on Apr. 20, 2015. The disclosure of the Korean Patent Application No. 10-2015-0055446 is herein incorporated by reference in its entirety as well.

BACKGROUND

1. Field

Exemplary embodiments of the present invention relate to a semiconductor device, and more particularly, to a semiconductor device having an air gap, a method for manufacturing the same, a memory cell having the same and an electronic device having the same.

2. Description of the Related Art

As a semiconductor device is highly integrated, parasitic capacitance between neighboring conductive structures exerts a substantial influence on the performance of the semiconductor device.

SUMMARY

An embodiment of the present invention is directed to a semiconductor device capable of suppressing passing gate effect and a method for manufacturing the same.

In accordance with an embodiment of the present invention, a semiconductor device may include a semiconductor substrate including a plurality of active regions and a device isolation region for isolating the plurality of active regions; and a buried bit line and a buried gate electrode which are embedded in the semiconductor substrate, wherein the device isolation region may include a first device isolation region extending in a first direction and a second device isolation region extending in a second direction crossing with the first direction and having an embedded shield pillar. The shield pillar may be electrically coupled to the semiconductor substrate. The shield pillar may include polysilicon doped with boron. The active region may have a minor axis and a major axis, the first device isolation region may be positioned between the minor axes of neighboring active regions, and the second device isolation region may be positioned between the major axes of neighboring active regions. The shield pillar may be independently positioned between the major axes of neighboring active regions.

In accordance with another embodiment of the present invention, a semiconductor device may include a semiconductor substrate including a plurality of active regions and a device isolation region for isolating the plurality of active regions; and a buried bit line and a buried gate electrode which are embedded in the semiconductor substrate, wherein the device isolation region may include a first device isolation region extending in a first direction and a second device isolation region extending in a second direction crossing with the first direction and having an air gap and a conductive shield pillar embedded therein, and the active region may be defined by the first device isolation region and the second device isolation region.

In accordance with yet another embodiment of the present invention, a semiconductor device may include a semiconductor substrate including a plurality of active regions and a device isolation region for isolating the plurality of active regions; and a buried bit line and a buried gate electrode which are embedded in the semiconductor substrate, wherein the device isolation region may include a the first device isolation region extending in a first direction and having an embedded first air gap and a second device isolation region extending in a second direction crossing the first direction and having a second air gap and a conductive shield pillar embedded therein, and the active region may be defined by the first device isolation region and the second device isolation region.

In accordance with still another embodiment of the present invention, a method for manufacturing a semiconductor device may include forming a line type active region by etching a semiconductor substrate; forming a plurality of island type active regions and an isolation trench by cutting the line type active region; forming a device isolation region including a shield pillar which is embedded in the isolation trench and is electrically coupled to the semiconductor substrate; and forming a buried bit line and a buried gate electrode which are embedded in the island type active region.

In accordance with still another embodiment of the present invention, a method for a semiconductor device may include forming a line type active region by etching a semiconductor substrate; forming a plurality of island type active regions and an isolation trench by cutting the line type active region; forming a spacer on sidewalls of the isolation trench; forming a shield pillar partially filling the isolation trench over the spacer; forming an air gap by removing the spacer; forming a device isolation region by filling an isolation dielectric layer over the air gap and the shield pillar; and forming a buried bit line and a buried gate electrode which are embedded in the island type active region.

In accordance with still another embodiment of the present invention, a method for manufacturing a semiconductor device may include forming a line type active region and a first isolation trench by etching a semiconductor substrate; forming a first device isolation region including a dielectric pillar layer in the first isolation region; forming a plurality of island type active regions and a second isolation trench by cutting the line type active region and the first device isolation region; forming a spacer on sidewalls of the second isolation trench; forming a shield pillar partially filling the second isolation trench over the spacer; forming a first air gap by removing the spacer; forming a second device isolation region by filling an isolation dielectric layer over the first air gap and the shield pillar; forming a buried bit line and a buried gate electrode which are embedded in the island type active region; and forming a second air gap by removing the dielectric pillar layer.

In an embodiment, a method for fabricating a semiconductor device may include: forming a plurality of first isolation trenches and a plurality of line-shaped active regions by etching a semiconductor substrate; forming a line-shaped device isolation region in each of the plurality of first isolation trenches; forming a plurality of second isolation trenches extending in a second direction by etching the plurality of line-shaped active regions and the plurality of line-shaped device isolation regions; forming a connection trench to connect the plurality of second isolation trenches to each other; forming a shielding line in each of the plurality of second isolation trenches; and forming a shielding line interconnection in the connection trench. The forming of the plurality of second isolation trenches may include: etching the plurality of line-shaped active regions to define a plurality of island-shaped active regions, and etching the plurality of line-shaped device isolation regions to define a plurality of first device isolation regions. The forming of the plurality of second isolation trenches and the forming of the connection trench are performed substantially at the same time. The forming of the shielding line and the shielding line interconnection may include: forming a line layer to cover the plurality of second isolation trenches and the connection trench; forming a shield layer over the liner layer, wherein the shield layer fills the plurality of second isolation trenches and the connection trench; and etching back the shield layer. The shield layer may include a boron-doped polysilicon layer. The method may further include, after the forming of the shielding line and the shielding line interconnection: forming a gate trench by etching each of the plurality of island-shaped active regions and each of the plurality of first device isolation regions; and forming a gate electrode in the gate trench. The forming of the gate trench may include: forming a vertical trench in a direction crossing the buried bit line; forming a sacrificial spacer over a sidewall of the vertical trench; and forming a bulb-shaped trench by etching the bottom portion of the vertical trench through an isotropic etching process, the bulb-shaped trench communicates with the vertical trench. The forming of the gate electrode may include: forming a first gate conductive layer in the bulb-shaped trench; forming a second gate conductive layer in a lower portion of the vertical trench and over the first gate conductive layer; forming a gate spacer on a sidewall of a upper portion of the vertical trench and over the second gate conductive layer; and etching the second gate conductive layer and the first gate conductive layer using the gate spacer as a barrier. The first gate conductive layer may include a metallic material, and the second gate conductive layer may include polysilicon. The method may further include, after the forming of the shielding line and the shielding line interconnection: forming a bit line trench extending in a first direction by etching the plurality of line-shaped active regions and the plurality of line-shaped device isolation regions; forming a buried bit line in the bit line trench; forming a bulb-shaped body trench by etching the bottom surface of the bit line trench; and forming a punch-through preventing layer in the body trench.

In an embodiment, a semiconductor device may include a substrate; a plurality of first device isolation regions formed in the substrate and extending in a first direction; a plurality of second device isolation regions extending in a second direction crossing the first direction; a plurality of island-shaped active regions defined by the plurality of first device isolation regions and the plurality of second device isolation regions; a plurality of shielding lines each of which is formed in each of the plurality of second device isolation regions; and a shielding line interconnection connecting the plurality of shielding lines to each other. The plurality of shielding lines and the shielding line interconnection may include the same material as each other. The plurality of shielding lines and the shielding line interconnection may include polysilicon. The substrate may include a plurality of first isolation trenches extending in the first direction and a plurality of second isolation trenches extending in the second direction, the plurality of first device isolation regions each of which may be formed in each of the plurality of first isolation trenches, and the plurality of second device isolation regions each of which may be formed in each of the plurality of second isolation trenches. Each of the plurality of second device isolation regions may include (i) a liner layer covering a surface of each of the second isolation trenches and (ii) an isolation dielectric layer over the liner layer and filling each of the second isolation trenches, and the shielding line may be positioned between the liner layer and the isolation dielectric layer. Each of the plurality of island-shaped active regions may have a minor axis extending in the second direction and a major axis extending in the first direction, each of the plurality of first device isolation regions may be arranged along the second direction between the plurality of island-shaped active regions, and each of the plurality of second device isolation regions may be arranged along the first direction between the plurality of island-shaped active regions. Each of the plurality of island-shaped regions may include a body portion, a first pillar, and a second pillar, the first and the second pillars may be formed over the body portion, and the first and the second pillars may be isolated from each other. The semiconductor device may further include: a bulb-shaped body trench formed in the body portion; a punch-through preventing layer formed in the body trench; a bit line trench over the punch-through preventing layer; and a buried bit line formed in the bit line trench and connected to bottom portions of the first and the second pillars. The semiconductor device may further include a gate trench over the buried bit line, the gate trench may be formed between the first pillar and the second pillar; and a gate electrode formed in the gate trench, the gate electrode may include: a first gate electrode overlapping a side surface of the first pillar; and a second gate electrode overlapping a side surface of the second pillar, the first and the second gate electrodes may be isolated from each other. The gate trench may include: a bulb-shaped trench; and a vertical trench extending upward from the bulb-shaped trench, the bulb-shaped trench may have a larger width than the vertical trench. Each of the first and second gate electrodes may include (i) a first electrode portion formed in the bulb-shaped trench and (ii) a second electrode portion formed in the vertical trench and stacked over the first electrode portion. The first electrode portion may include a metallic material, and the second electrode portion may include polysilicon. The first gate electrode may include a first elongated portion extending in the second direction and a plurality of first branch portions extending in the first direction from the first elongated portion, the second gate electrode may include a second elongated portion extending in the second direction and a plurality of second branch portions extending in the first direction from the second elongated portion, the plurality of first branch portions and the first elongated portion may be partially surround the side surface of the first pillar, and the plurality of second branch portions and the second elongated portion partially surround the side surface of the second pillar.

BRIEF DESCRIPTION OF THE DRAWINGS

FIGS. 16A and 16B are cross-sectional views taken along the lines A-A' and B-B' of FIGS. 15A and 15B, respectively.

DETAILED DESCRIPTION

Figure 1:
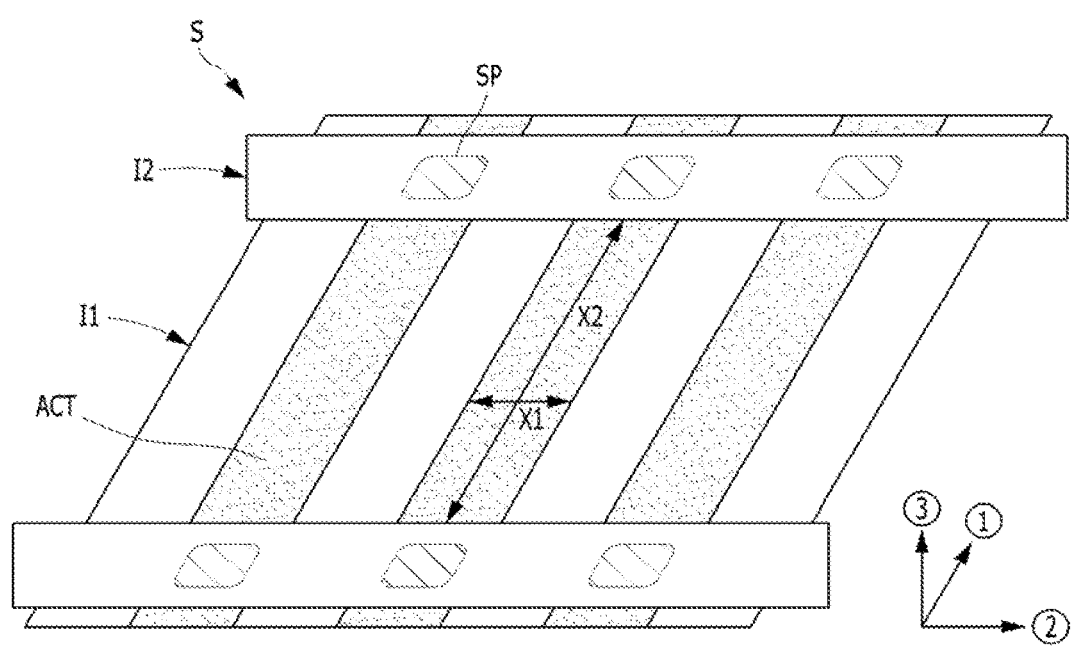
FIG. 1 is a cross-sectional view illustrating a device isolation region in accordance with a first embodiment

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a cross-sectional view illustrating a device isolation region in accordance with a first embodiment.

Referring to FIG. 1, a device isolation region and an active region ACT may be formed in a substrate S. The device isolation region may include a first device isolation region I1 and a second device isolation region I2. The active region ACT may be defined by the first device isolation region I1 and the second device isolation region I2. The first device isolation region I1 may extend in a first direction $\hat{1}$, and the second device isolation region I2 may extend in a second direction $\hat{2}$ crossing with the first direction $\hat{1}$. The first device isolation region I1 may become discontinuous by the second device isolation region I2. The first device isolation region I1 and the second device isolation region I2 may be STI (shallow trench isolation) regions which are formed by trench etching. The first and second device isolation regions I1 and I2 may be formed by filling isolation trenches (not numbered) with a dielectric material, respectively. The first device isolation region I1 and second device isolation region I2 may be formed of the same material or different materials. For example, the first device isolation region I1 and the second device isolation region I2 may include silicon oxide, silicon nitride or a combination thereof. The second device isolation region I2 may have an embedded shield pillar SP.

The active region ACT may be an island type. A plurality of active regions ACT may be arrayed in the second direction $\hat{2}$ and the first device isolation region I1 is interposed therebetween. The plurality of active regions ACT may be arrayed in the same spacing and size as each other. The active region ACT may have a major axis X2 and a minor axis X1. The second device isolation region I2 may be positioned between major axes X2 of each active region ACT. The first device isolation region I1 may be positioned between minor axes X1 of each active region ACT. Hereinafter, descriptions will be made for one active region.

According to FIG. 1, the second device isolation region I2 having an embedded shield pillar SP may be positioned between major axes X2 of the active region ACT.

Various semiconductor devices may be formed in the active region ACT.

Hereinafter, an example of a semiconductor device in accordance with the first embodiment will be described.

Figure 2A:
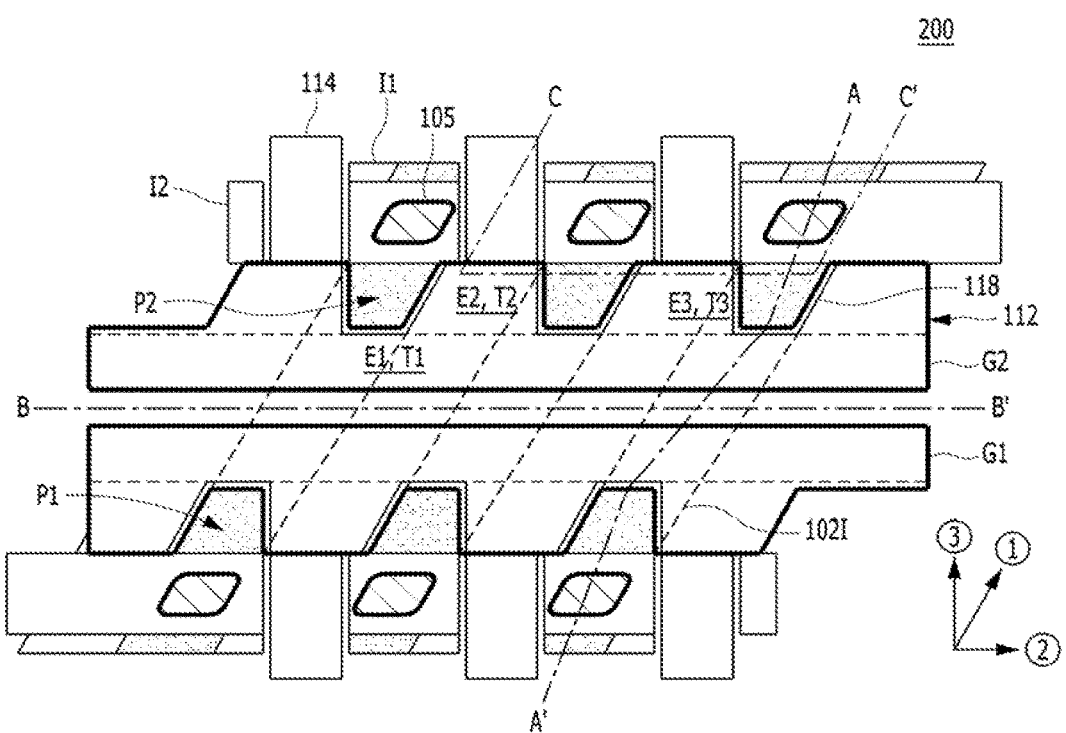
FIG. 2A is a plan view illustrating a semiconductor device in accordance with the first embodiment.
Figure 2B:
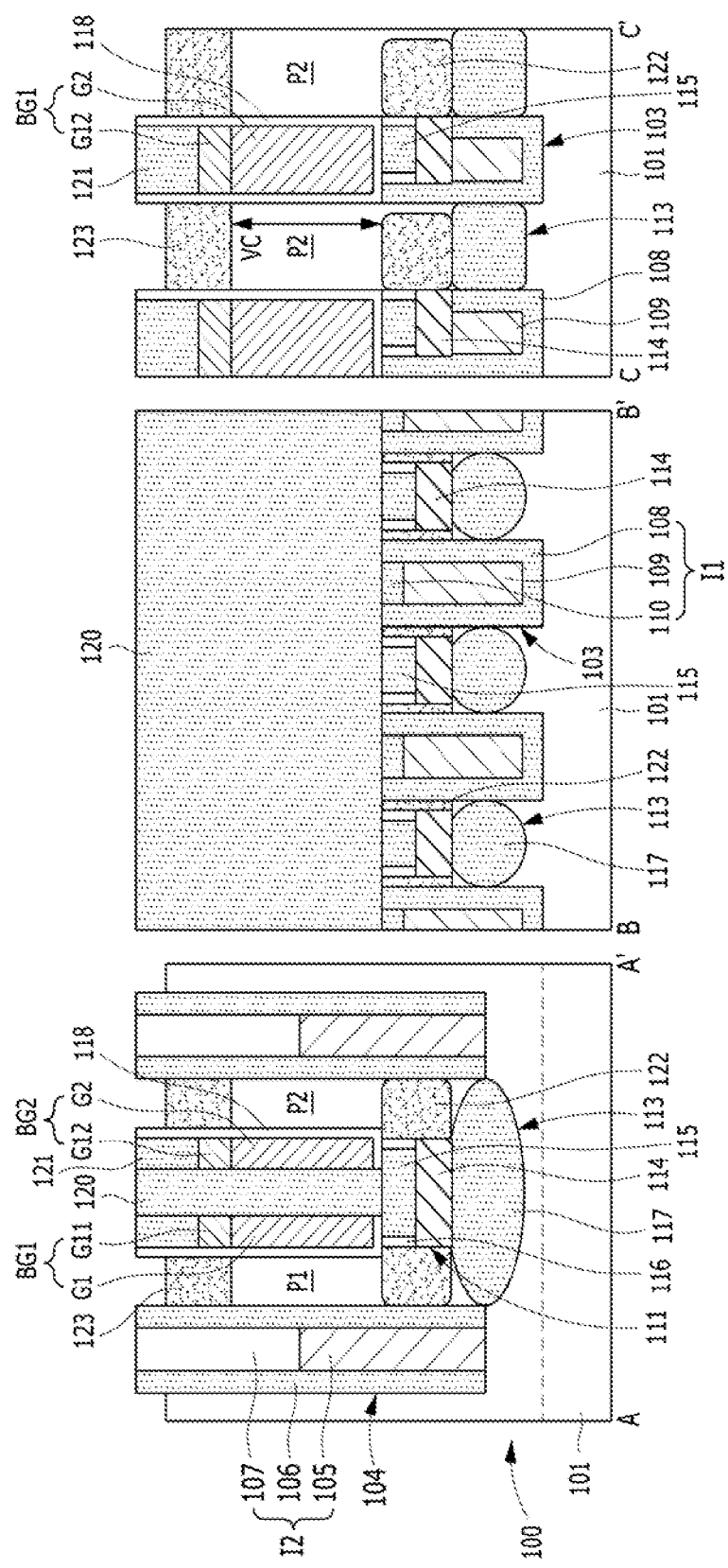
FIG. 2B is a cross-sectional view taken along the lines A-A', B-B' and C'C' of FIG. 2A.

FIG. 2A is a plan view illustrating a semiconductor device in accordance with a first embodiment. FIG. 2B is a cross-sectional view taken along the line A-A', B-B' and C'C' of FIG. 2A. A semiconductor device 200 may include a memory cell.

The semiconductor device 200 may include a substrate 100. The substrate 100 may include a semiconductor substrate. The substrate 100 may be formed of a silicon-containing material. The substrate 100 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. In another embodiment, the substrate 100 may include semiconductor material such as germanium. The substrate 100 may include III/V group semiconductor materials, for example, a compound semiconductor substrate such as GaAs. Further, the substrate 100 may include a silicon-on-insulator (SOI) substrate.

A device isolation region and an active region 102I may be formed in the substrate 100. The device isolation region may include a first device isolation region I1 and a second device isolation region I2. The active region 102I may be defined by the first device isolation region I1 and the second device isolation region I2. A part of the substrate 100 under the active region 102I may become a bulk 101. The first device isolation region I1 may extend in a first direction $\hat{1}$, and the second device isolation region I2 may extend in a second direction $\hat{2}$ crossing with the first direction $\hat{1}$. The first device isolation region I1 may become discontinuous by the second device isolation region I2. The first device isolation region I1 and the second device isolation region I2 may be STI regions which are formed by trench etching. The first and second device isolation regions I1 and I2 may be formed by filling first and second isolation trenches 103 and 104 with a dielectric material, respectively. The first device isolation region I1 and the second device isolation region I2 may be formed of the same material or different materials. For example, the first device isolation region I1 and the second device isolation region I2 may include silicon oxide, silicon nitride or a combination thereof. The second device isolation region I2 may include a spacer 106, a shield pillar 105 and a second isolation dielectric layer 107. The second device isolation region I2 may be formed in a second isolation trench 104. Thus, the shield pillar 105 may be embedded in the second device isolation region I2. The shield pillar 105 may be electrically coupled to the substrate 100. The first device isolation region I1 may include a liner 108, a dielectric pillar 109 and a first isolation dielectric layer 110.

The active region 102I may be an island type. A plurality of active regions 102I may be arrayed in a second direction $\hat{2}$ and the first device isolation region I1 may be interposed therebetween. The plurality of active region 102I may be arrayed in the same spacing and size as each other. The active region 102I may have a major axis and a minor axis (see, FIG. 1). The second device isolation region I2 may be positioned between the major axes X2 of each active region 102I. The first device isolation region I1 may be positioned between the minor axes X1 of each active region 102I. Hereinafter, descriptions will be made for one active region 102I. The active region 102I may include a first pillar P1 and a second pillar P2. The first pillar P1 and the second pillar P2 may form a pair and be symmetrical to each other. One side surface of each of the first pillar P1 and the second pillar P2 may contact the second device isolation region I2.

The substrate 100 may include a plurality of trenches. The trenches may include a bit line trench 111, a gate trench 112 on the bit line trench 111, and a body trench 113 under the bit line trench 111. The bit line trench 111 may extend in a third direction $\hat{3}$. The third direction $\hat{3}$ may be a direction crossing with the first direction $\hat{1}$ and the second direction $\hat{2}$. The gate trench 112 may extend in the second direction $\hat{2}$. The second direction $\hat{2}$ may be a direction crossing with the first direction $\hat{1}$ and the third direction $\hat{3}$. The body trench 113 may extend in the first direction $\hat{1}$ and the extending length thereof may be the same as the active region 102I.

The first pillar P1 and the second pillar P2 may be spaced from each other by the gate trench 112.

A buried bit line 114 may be embedded in the bit line trench 111. A bit line capping layer 115 may be formed on the buried bit line 114. The buried bit line 114 may include a low resistivity metal. The buried bit line 114 may include tungsten. A bit line capping liner 116 may be positioned between the bit line capping layer 115 and the bit line trench 111. The bit line capping layer 115 and the bit line capping liner 116 may include a dielectric material. The bit line capping layer 115 and the bit line capping liner 116 may include silicon oxide, silicon nitride or a combination thereof. The bit line capping layer 115 may cover the top surface of the buried bit line 114. Accordingly, the buried bit line 114 may be referred to as an embedded buried bit line in the substrate 100. An anti-punch layer 117 may be formed under the buried bit line 114. The anti-punch layer 117 may be formed of a dielectric material. The anti-punch layer 117 may prevent punch between neighboring buried bit lines 114. The buried bit line 114 may float from a bulk 101 of the substrate 100 by the anti-punch layer 117.

The gate trench 112 may be a separated space between the first pillar P1 and the second pillar P2. A pair of gate electrodes BG1 and BG2 may be embedded in the gate trench 112. In the pair of gate electrodes, a first gate electrode BG1 may overlap with the side surface of the first pillar P1 and a second gate electrode BG2 may overlap with the side surface of the second pillar P2. The first gate electrode BG1 and the second gate electrode BG2 may be symmetrical to each other.

A gate dielectric layer 118 may be formed on sidewalls of the first pillar P1 and the second pillar P2. The first gate electrode BG1 and the second gate electrode BG2 may be covered by first and second gate capping layers 120 and 121. The top surfaces of the first and second gate electrodes BG1 and BG2 may be positioned at a level lower than the top surfaces of the first pillar P1 and the second pillar P2. The top surfaces of the first and second gate capping layer 120 and 121 may be at the same level as the top surfaces of the first pillar P1 and second pillar P2. Since the first and second gate electrodes BG1 and BG2 are positioned within the gate trench 112 and the top and side surfaces thereof are covered by the first and second gate capping layers 120 and 121, the first and second gate electrodes BG1 and BG2 may become buried structures. It may be referred to as buried gate electrodes. The semiconductor device 200 may be applied to a memory cell. Therefore, the first and second gate electrodes BG1 and BG2 may become buried word lines.

A gate dielectric layer 118 may be formed on sidewalls of the gate trench 112. That is, the gate dielectric layer 118 may cover the gate trench 112. Moreover, the gate dielectric layer 118 may cover the lower side surfaces and the upper side surfaces of the first pillar P1 and second pillar P2. The gate dielectric layer 118 may include silicon oxide, silicon nitride, silicon oxynitride, a high-k material or a combination thereof. The high-k material may include a material which has a dielectric constant higher than the dielectric constant of silicon oxide. For example, the high-k material may include a material which has a dielectric constant higher than 3.9. For another example, the high-k material may include a material which has a dielectric constant higher than 10. Yet in another example, the high-k material may include a material which has a dielectric constant of 10 to 30. The high-k material may include at least one metallic element. The high-k material may include a hafnium-containing material. The hafnium-containing material may include hafnium oxide, hafnium silicon oxide, hafnium silicon oxynitride or a combination thereof. In another embodiment, the high-k material may include lanthanum oxide, lanthanum aluminum oxide, zirconium oxide, zirconium silicon oxide, zirconium silicon oxynitride, aluminum oxide or a combination thereof. In another embodiment, other high-k materials known in the art may be used.

The bottom surfaces of the first and second gate electrodes BG1 and BG2 may contact the bit line capping layer 115. That is, the bit line capping layer 115 may be positioned between the first and second gate electrodes BG1 and BG2 and the bit line 114. The first and second gate electrodes BG1 and BG2 may overlap with the side surfaces of the first and second pillars P1 and P2, respectively.

A second junction region 123 and a first junction region 122 may be formed in the first and second pillars P1 and P2. The first junction region 122 may be positioned at the bottom of the first and second pillars P1 and P2, and the second junction region 123 may be positioned at the top of the first and second pillars P1 and P2. The first junction region 122 may be electrically coupled to the buried bit line 114. The first junction region 122 may be positioned at a level lower than the second junction region 123. A vertical channel VC may be vertically formed between the first junction region 122 and the second junction region 123. The first junction region 122 and the second junction region 123 may be regions where a conductive type impurity is doped. For example, the conductive type impurity may include phosphorus (P), arsenic (As), antimony (Sb) or boron (B). The first junction region 122 and the second junction region 123 may be doped with the same conductive type impurity as each other. The first junction region 122 and the second junction region 123 may respectively correspond to a source region and a drain region.

The first and second gate electrodes BG1 and BG2 may be a stack of lower gate electrodes G1 and G2 and upper gate electrodes G11 and G12, respectively. The first gate electrode BG1 may include the first lower gate electrode G1 and the first upper gate electrode G11. The second gate electrode BG2 may include the second lower gate electrode G2 and the second upper gate electrode G12. The lower gate electrodes G1 and G2 may include a high work function material. The upper gate electrodes G11 and G12 may include a low work function material. Threshold voltage may be controlled by the lower gate electrodes G1 and G2 with the high work function. Gate-induced drain leakage may be improved by the upper gate electrodes G11 and G12 with the low work function.

The first and second gate electrodes BG1 and BG2 may respectively include a first electrode E1, a second electrode E2 and a third electrode E3. The first electrode E1 may extend in the second direction $\hat{2}$, and the second electrode E2 and the third electrode E3 may stem from the first electrode E1. The second electrode E2 and the third electrode E3 may extend in the first direction $\hat{1}$. The first electrode E1, the second electrode E2 and the third electrode E3 may surround at least three side surfaces of the first and second pillars P1 and P2. The first electrode E1 may be in a direction crossing with the buried bit line 114, and the second electrode E2 and the third electrode E3 may be positioned between neighboring first pillars P1 or between neighboring second pillars P2.

The gate trench 112 may be a line type extending in any one direction. The gate trench 112 may include a first trench T1, a second trench T2 and a third trench T3. The first electrode E1 may be embedded in the first trench T1, and the second and third electrodes E2 and E3 may be embedded in the second trench T2 and third trench T3, respectively.

Hereinafter, a second device isolation region I2 will be described in detail.

The second device isolation region I2 may include a spacer 106, a shield pillar 105 and a second isolation dielectric layer 107. The second device isolation layer I2 may be formed in the second isolation trench 104. The second device isolation region I2 may have the shield pillar 105 therein. The shield pillar 105 may be formed of a silicon-containing material. The shield pillar 105 may include polysilicon layer. The shield pillar 105 may be doped with an impurity. The shield pillar 105 may include a polysilicon layer doped with boron. The shield pillar 105 may be independently positioned between the major axes of the active region 102I. That is, neighboring shield pillars 105 may be formed separately from each other. The shield pillar 105 may be recessed such that the surface height thereof is lower than that of the top surface of the active region 102I. The spacer 106 may be positioned between the sidewall of the shield pillar 105 and the sidewall of the second isolation trench 104. The bottom of the shield pillar 105 may contact the substrate 100.

According to the first embodiment, the shield pillar 105 may be positioned between the major axes X2 of the active region 102I. Thus, passing gate (PG) effect may be suppressed. That is, field shielding of the passing gate may result in suppressing PG effect. Moreover, since the shield pillar 105 functions as a back gate, threshold voltage may be increased.

Hereinafter, a method for manufacturing the semiconductor in accordance with the first embodiment will be described. For the sake of convenience, the description will be made for production part 1, production part 2 and production part 3. The production part 1 relates to a method for forming parallel active regions, the production part 2 relates to a method for forming a buried bit line (BBL) and the production part 3 relates to a method for forming a buried gate electrode (BG).

FIGS. 3A to 3H are cross-sectional views illustrating an example of a method for forming parallel active regions of the semiconductor device in accordance with the first embodiment. FIGS. 4A to 4H are cross-sectional views taken along the lines A-A', B'-B and C-C' of FIG. 3I.

Figure 3A:
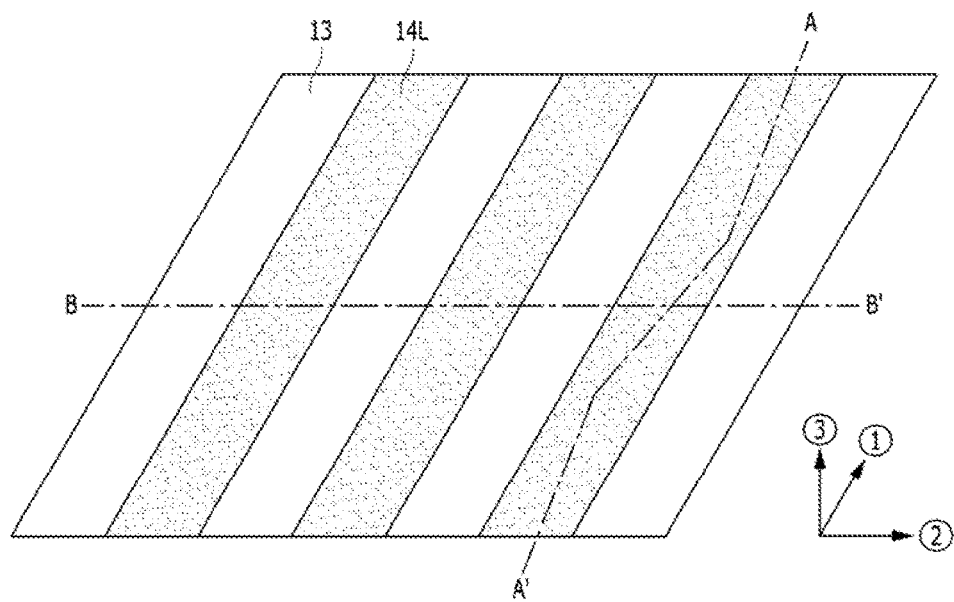
FIGS. 3A to 3H are views illustrating an example of a method for forming parallel active regions of the semiconductor device in accordance with the first embodiment.
Figure 4A:
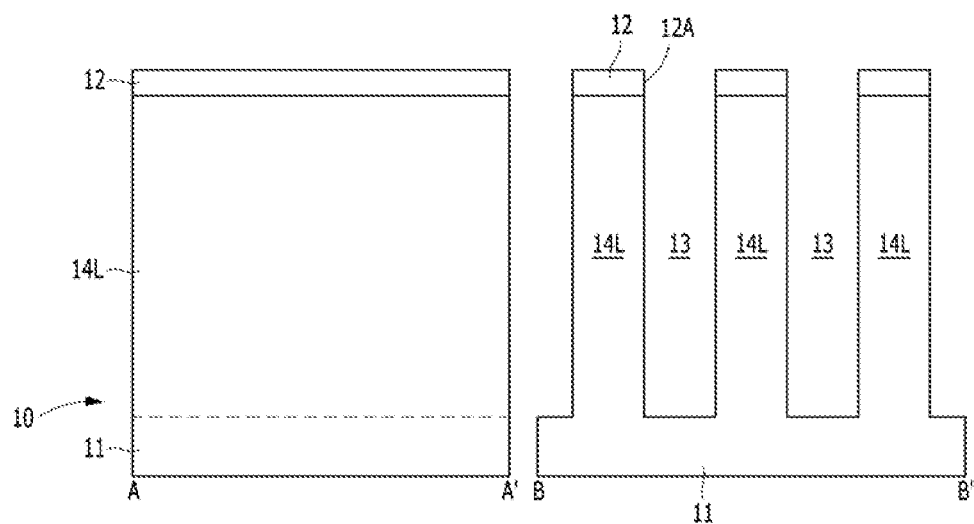
FIGS. 4A to 4H are cross-sectional views taken along the lines A-A', B'-B and C-C' of FIG. 3I.

As shown in FIGS. 3A and 4A, a substrate 10 may be prepared. The substrate 10 may include a material suitable for a semiconductor processing. The substrate 10 may include a semiconductor substrate. The substrate 10 may include a silicon-containing material. The substrate 10 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. In another embodiment the substrate 10 may include semiconductor material such as germanium. Also, the substrate 10 may include III/V group semiconductor materials, for example, a compound semiconductor substrate such as GaAs. Further, the substrate 10 may include a silicon-on-insulator (SOI) substrate.

A first hard mask layer 12 may be formed on the substrate 10. A plurality of line type openings 12A may be formed in the first hard mask layer 12. In order to form the plurality of line type openings 12A, the first hard mask layer 12 may be etched by using a mask (not shown). The plurality of line type openings 12A may be formed by a spacer pattern technology (SPT). The first hard mask layer 12 may be formed of a material having etch selectivity with respect to the substrate 10. For example, the first hard mask layer 12 may include silicon nitride. Although it is not shown, a buffer layer or a pad layer may be formed between the first hard mask layer 12 and the substrate 10. The buffer layer may be formed of silicon oxide.

A first isolation trench 13 may be formed. The substrate 10 may be etched by using the first hard mask layer 12 having the line type opening 12A as an etch mask. Thus, the first isolation trench 13 may be formed in a line type. A line type active region 14L may be defined in the substrate 10 by the first isolation trench 13. A space between the line type active regions 14L may become the first isolation trench 13. The line type active region 14L and the first isolation trench 13 may extend in the first direction $\hat{1}$. For the sake of convenience, the first direction $\hat{1}$ may be referred to as an oblique direction. The bottom of the substrate 10 where the process for forming the line type active region 14L and the first isolation trench 13 are not performed is referred to as a bulk 11.

Figure 3B:
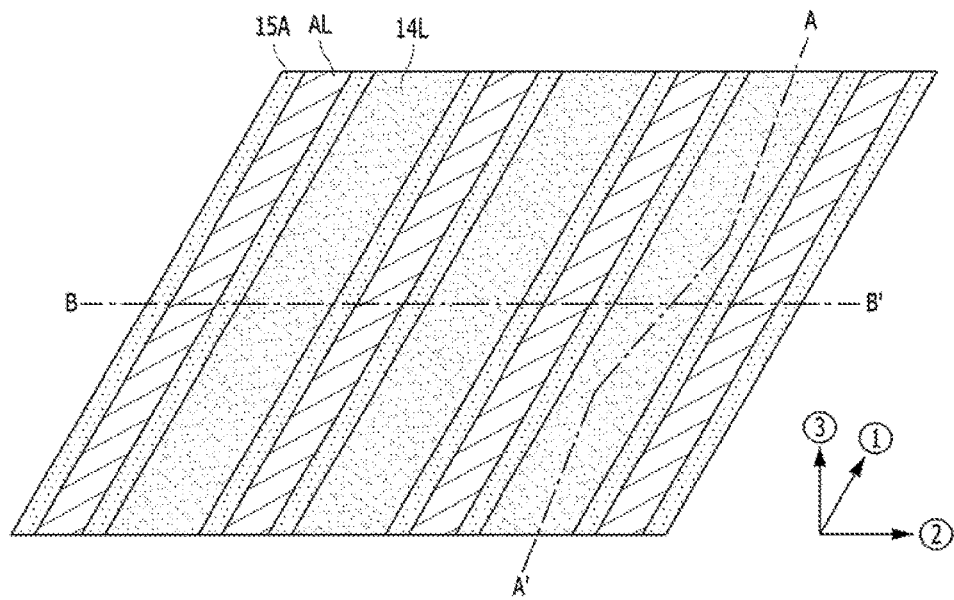
Figure 4B:
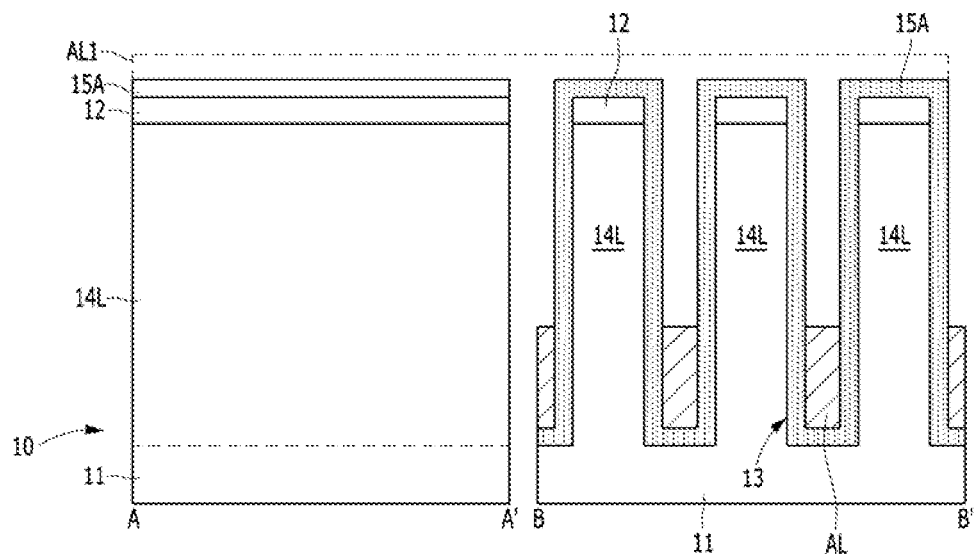

As shown in FIGS. 3B and 4B, a first liner layer 15A may be formed in the first isolation trench 13. The first liner layer 15A may be formed of silicon oxide. The first liner layer 15A may be formed by a thermal oxidation process or a deposition process. In another embodiment, the first liner layer 15A may be formed in a double layer structure. For example, the first liner layer 15A may be formed as a stack of silicon oxide and silicon nitride.

A dielectric pillar layer AL1 may be formed on the first liner layer 15A. The dielectric pillar layer AL1 may be formed of a material having etch selectivity with respect to the first liner layer 15A. The dielectric pillar layer AL1 may include a silicon-containing material. The dielectric pillar layer AL1 may include silicon germanium (SiGe).

The dielectric pillar layer AL1 may be recessed. The dielectric pillar layer AL1 may be recessed in the first isolation trench 13 to form a dielectric pillar AL. The dielectric pillar AL may have a recessed surface. The recessed surface of the dielectric pillar AL may be lower than the top surface of the line type active region 14L.

Figure 3C:
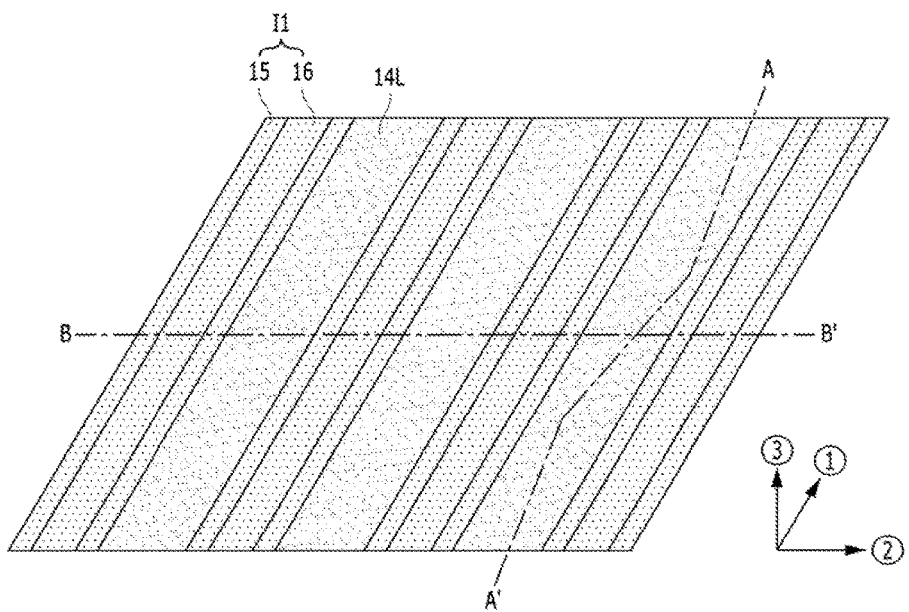
Figure 4C:
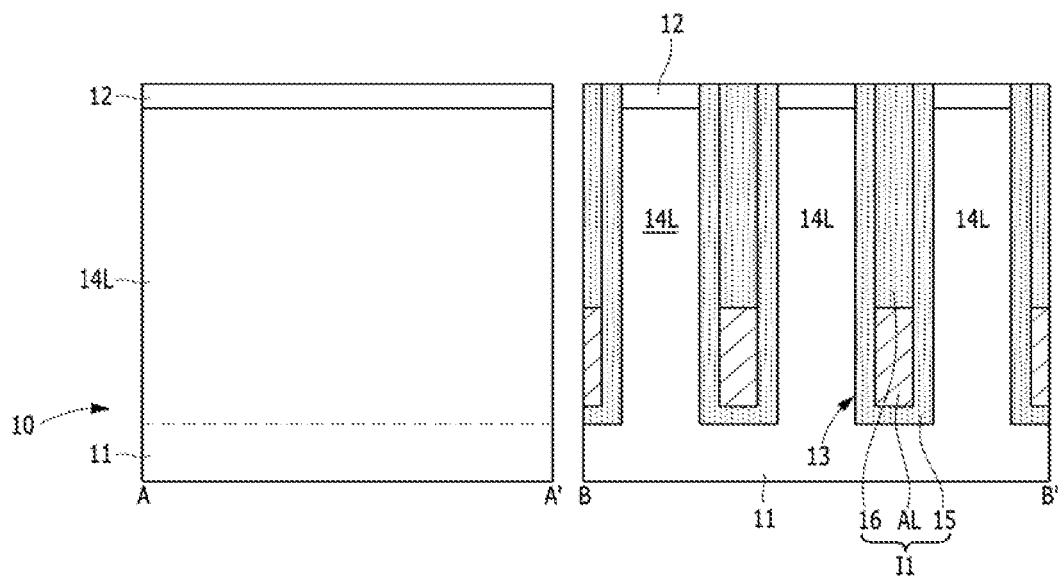

As shown in FIGS. 3C and 4C, a first isolation dielectric layer 16 may be formed on the dielectric pillar AL. The first isolation dielectric layer 16 may be formed of a dielectric material. The first isolation dielectric layer 16 may include silicon oxide, silicon nitride or a combination thereof. A chemical vapor deposition (CVD) process or another deposition process may be used to fill the first isolation trench 13 with the dielectric material. The first isolation dielectric layer 16 may include a spin-on-dielectric (SOD).

A planarization process such as chemical mechanical polishing (CMP) may be performed with respect to the first isolation dielectric layer 16. Thus, the first isolation dielectric layer 16 filling the first isolation trench 13 may be formed. In the planarization process of the first isolation dielectric layer 16, a part of the first liner layer 15A may be planarized. For example, the first isolation dielectric layer 16 and the first liner layer 15A may be planarized until the top surface of the first hard mask layer 12 is exposed. Thus, the first isolation dielectric layer 16 and a first liner 15 may remain in the first isolation trench 13.

According to the above processes, a first device isolation region I1 may be formed. The first device isolation region I1 may include the first liner 15, the dielectric pillar AL and the first isolation dielectric layer 16. The first device isolation region I1 may be embedded in the first isolation trench 13. The dielectric pillar AL may be embedded in the first device isolation region I1. The line type active region 14L and the first device isolation region I1 may be alternately formed.

The line width of the line type active region 14L may be the same as that of the first device isolation region I1. The line type active region 14L and the first device isolation region 13 may extend in the first direction $\hat{1}$.

Figure 3D:
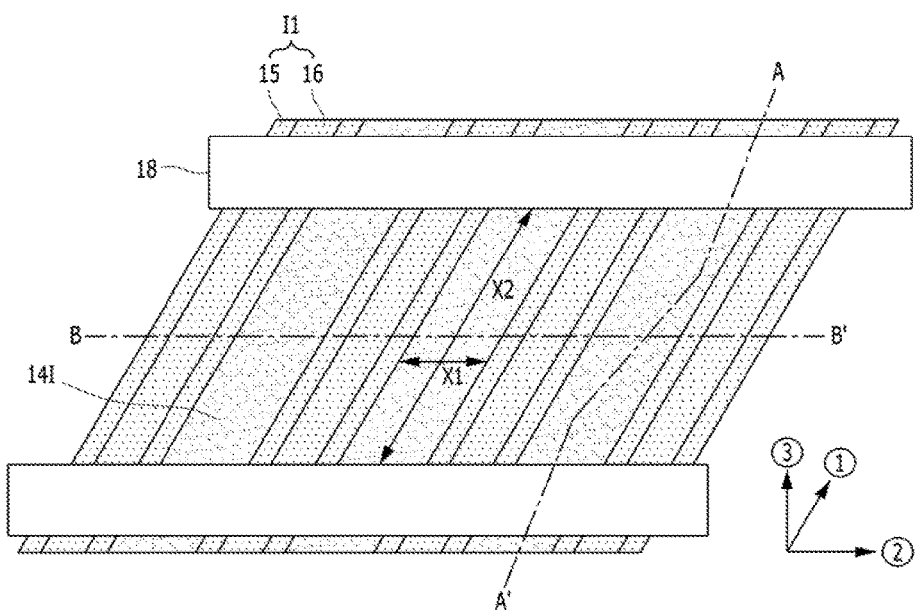
Figure 4D:
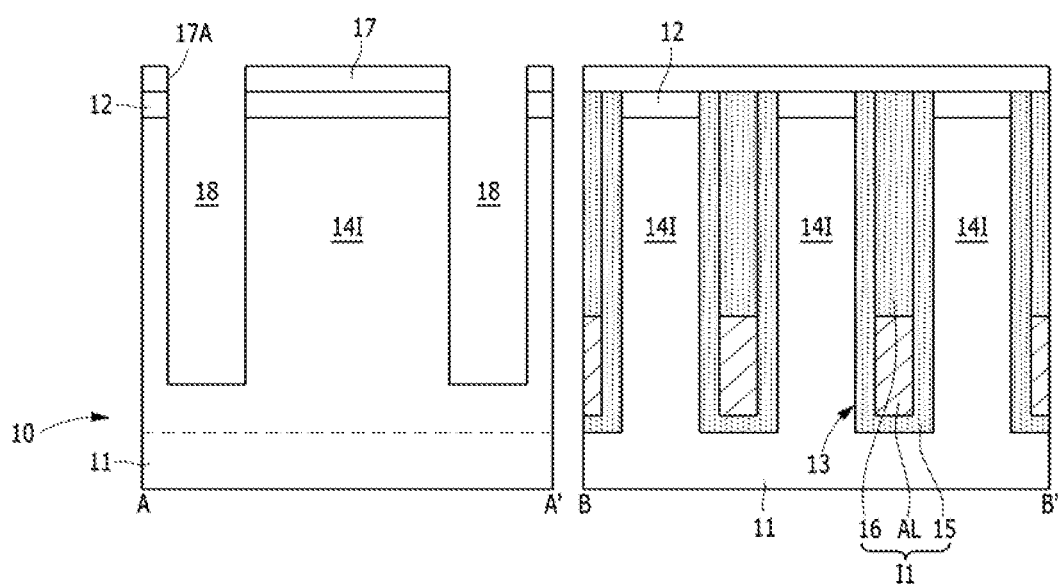

As shown in FIGS. 3D and 4D, the line type active region 14L may be cut in a uniform length unit. In order to cut the line type active region 14L, a cutting mask 17 may be used. The cutting mask 17 may have a plurality of line type openings 17A. The plurality of line type openings 17A may extend in the second direction $\hat{2}$. The cutting mask 17 may extend in a direction crossing with the line type active region 14L. The cutting mask 17 may include a photosensitive film pattern.

The first hard mask layer 12, the line type active region 14L and the first device isolation region I1 may be etched by using the cutting mask 17 as an etch mask. Thus, the line type active region 14L may be cut to form a second isolation trench 18. The second isolation trench 18 may extend in the second direction $\hat{2}$.

A plurality of island type active regions 14I may be formed by the second isolation trench 18.

According to the above processes, the line type active region 14L may be cut to form the independent island type active region 14I. When viewed in the first direction $\hat{1}$, neighboring island type active regions 14I may be uniform in length and spacing, and may be separated from each other by the second isolation trench 18. The island type active region 14I may have a minor axis X1 and a major axis X2. The plurality of island type active regions 14I may be repeatedly formed and spaced from each other along the first direction $\hat{1}$ and the second direction $\hat{2}$. The second isolation trench 18 may be formed between the major axes X2 of neighboring island type active regions 14I, and the first device isolation region I1 may be positioned between the minor axes X1 of neighboring island type active regions 14I. The second isolation trench 18 may extend in the second direction $\hat{2}$.

Figure 3E:
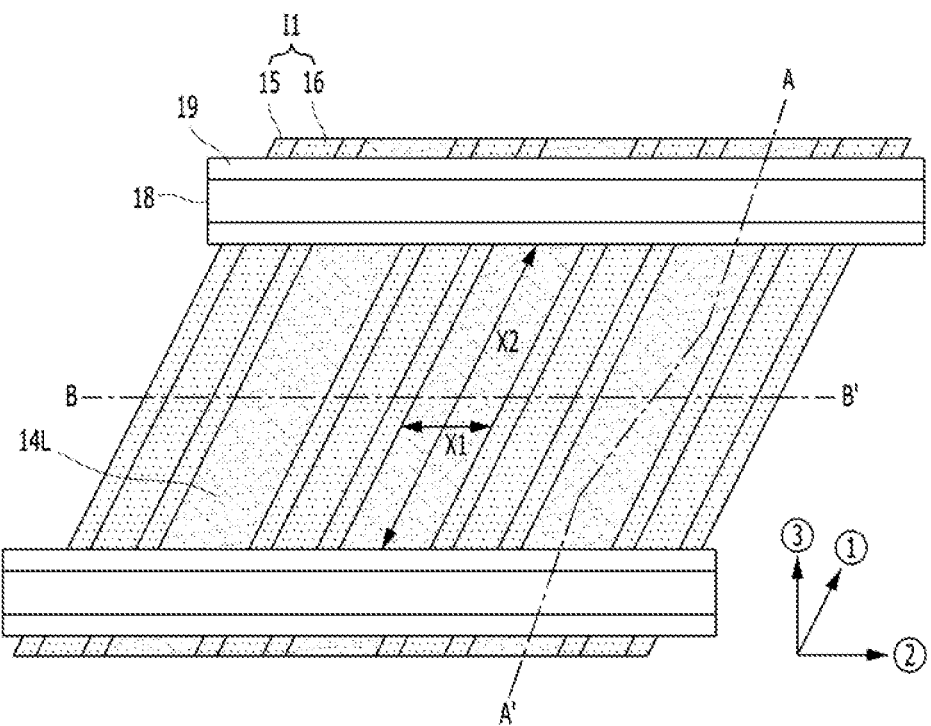
Figure 4E:
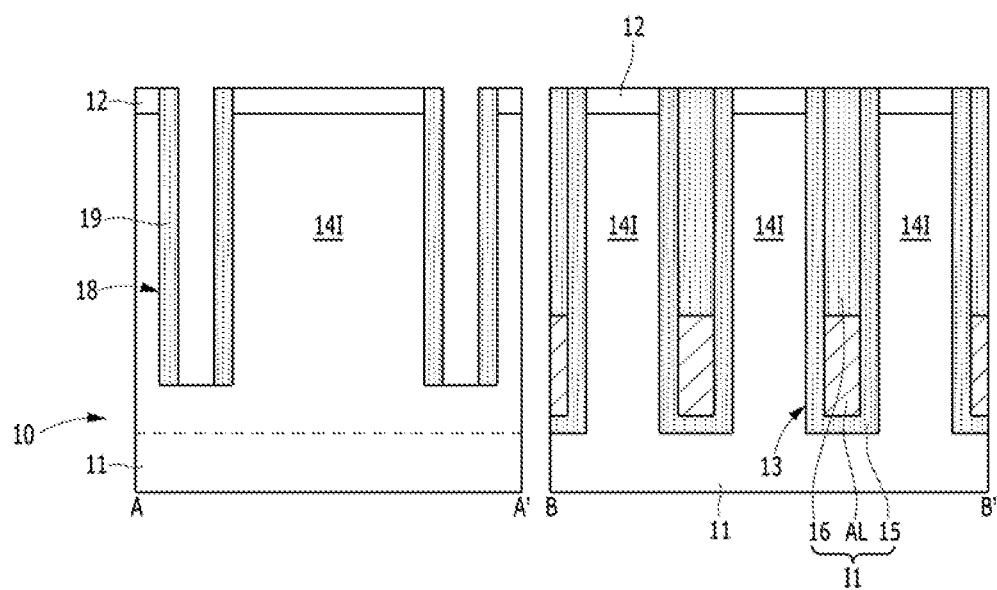

As shown in FIGS. 3E and 4E, the cutting mask 17 may be removed.

A spacer 19 may be formed on the sidewalls of the second isolation trench 18. In order to form the spacer 19, a dielectric material may be deposited followed by an etch-back process. The spacer 19 may be formed of a material having etch selectivity with respect to the substrate 10. The spacer 19 may include silicon oxide.

The bottom surface of the second isolation trench 18 may be exposed by the spacer 19.

Figure 3F:
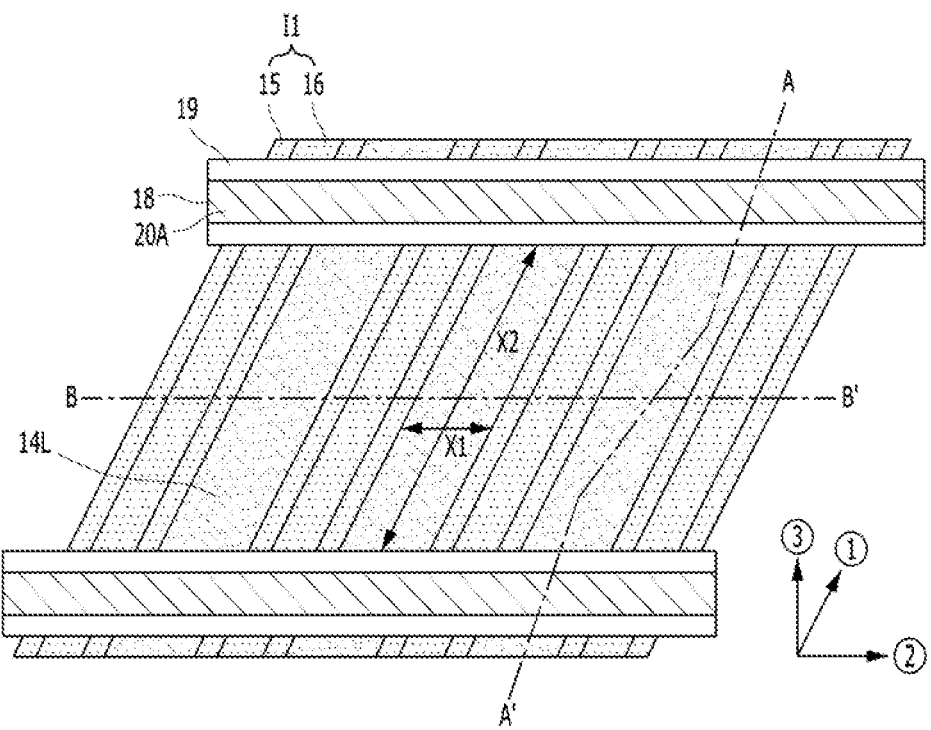
Figure 4F:
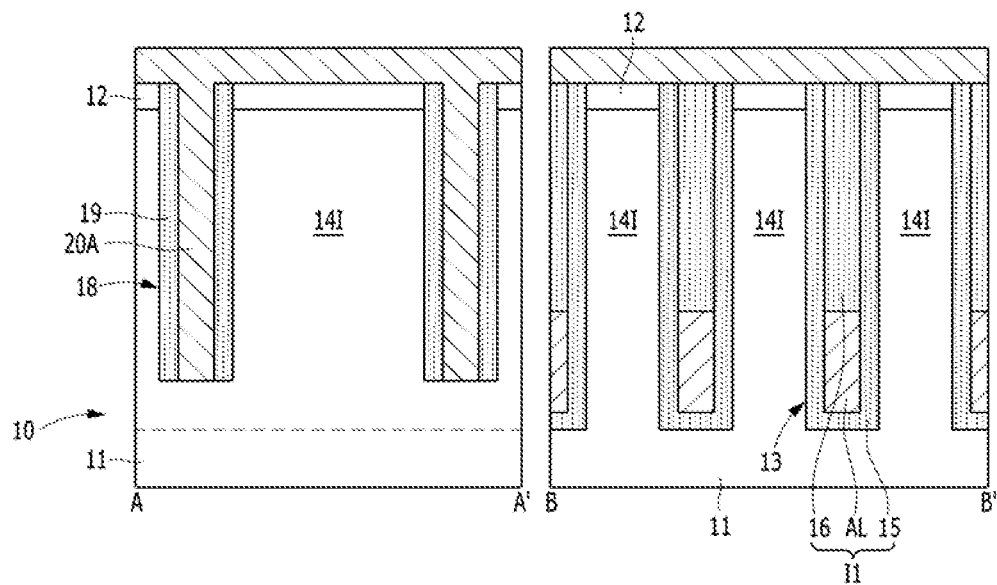

As shown in FIGS. 3F and 4F, a shield layer 20A may be formed. The shield layer 20A may include a conductive material. The shield layer 20A may be formed of a silicon-containing material. The shield layer 20A may include a polysilicon layer. The shield layer 20A may be doped with an impurity to have conductivity. The shield layer 20A may include a polysilicon layer doped with boron.

Figure 3G:
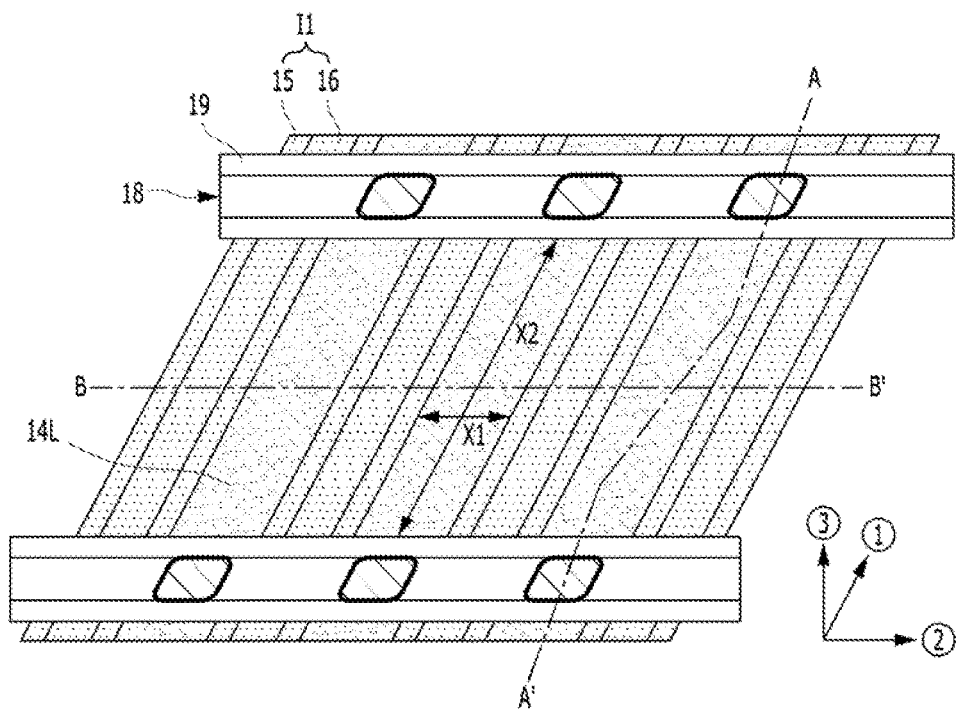
Figure 4G:
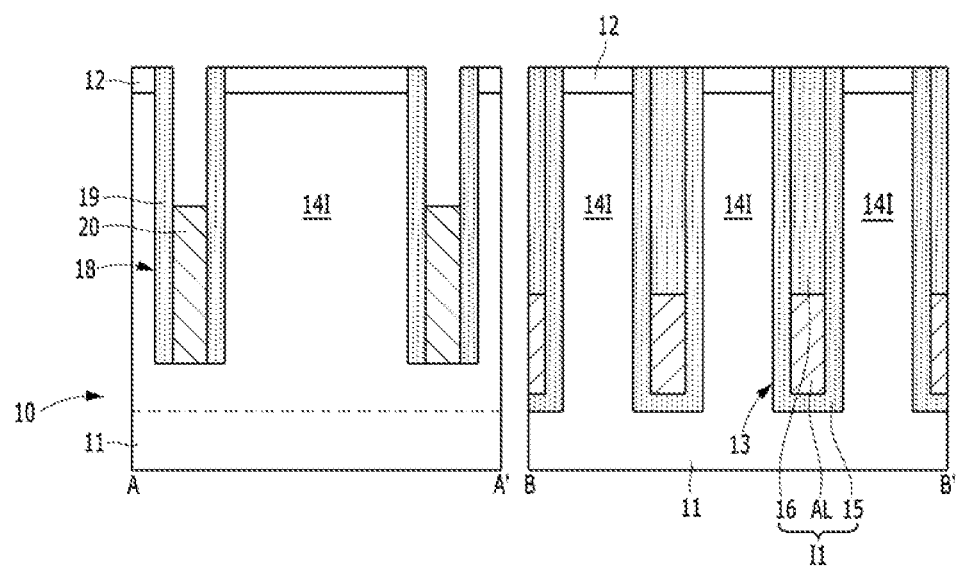

As shown in FIGS. 3G and 4G, a shield pillar 20 may be formed. The shield pillar 20 may be formed by selectively etching the shield layer 20A. For example, the shield layer 20A may be etched by an etch-back process. Thus, the shield pillar 20 may be formed in the second isolation trench 18. The shield pillar 20 may be independently positioned between the major axes of the active region 14I. That is, neighboring shield pillars 20 may be formed separately from each other. The shield pillar 20 may be recessed such that the surface height thereof is lower than that of the top surface of the active region 14I. The spacer 19 may be formed between the sidewalls of the shield pillar 20 and the sidewalls of the second isolation trench 18. The bottom of the shield pillar 20 may contact the substrate 10.

Figure 3H:
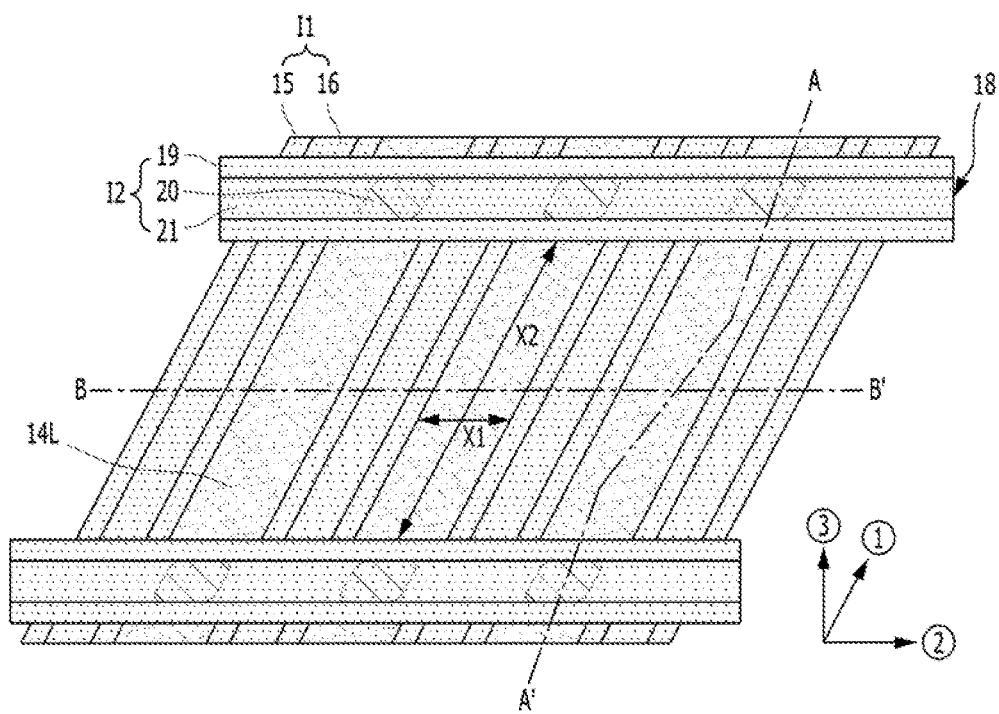
Figure 4H:
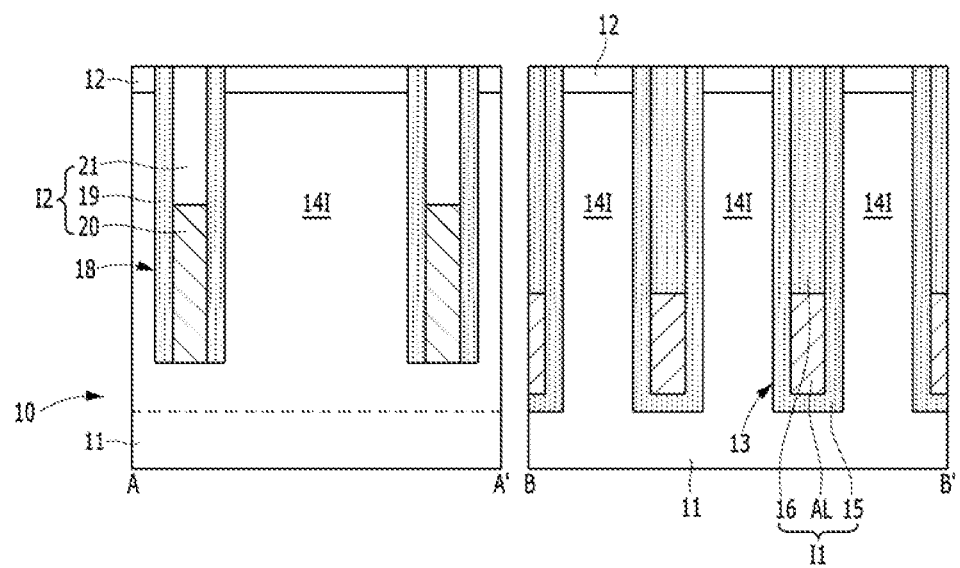

As shown in FIGS. 3H and 4H, a second isolation dielectric layer 21 may be formed. The second isolation dielectric layer 21 may be formed of silicon oxide. The second isolation dielectric layer 21 may fill the recessed region of the shield pillar 20. Subsequently, the second isolation dielectric layer 21 may be planarized. Thus, the second isolation dielectric layer 21 may remain to fill the recessed region of the shield pillar 20. The planarized surface of the second isolation dielectric layer 21 may be at the same level as the top surface of the first hard mask layer 12.

As above, a second device isolation region I2 may be formed by planarizing the second isolation dielectric layer 21. The second device isolation region I2 may include the spacer 19, the shield pillar 20 and the second isolation dielectric layer 21. The second device isolation region I2 may be embedded in the second isolation trench 18. The second device isolation region I2 may have the embedded shield pillar 20.

The island type active region 14I may be defined by the first device isolation region I1 and the second device isolation region I2. A plurality of island type active regions 14I may be defined by a plurality of first device isolation regions I1 and a plurality of second device isolation regions I2. The plurality of island type active regions 14I may be disposed in parallel with each other. It may be referred to as parallel active regions.

The shield pillar 20 may be positioned between major axes of the island type active region 14I. Thus, PG effect may be suppressed.

FIGS. 5A to 5H are views illustrating an example of a method for forming a buried bit line of the semiconductor in accordance with the first embodiment. FIGS. 6A to 6H are cross-sectional views taken along the lines A-A, B-B' and C-C' of FIG. 5H. Hereinafter, for the sake of convenience, in FIGS. 5A to 5H, the first device isolation region I1 and the second device isolation region I2 are shown. That is, the first liner 15, the dielectric pillar AL, the spacer 19 and the second isolation dielectric layer 21 are omitted. However, the shield pillar 20 embedded in the second device isolation region I2 is shown.

Figure 5A:
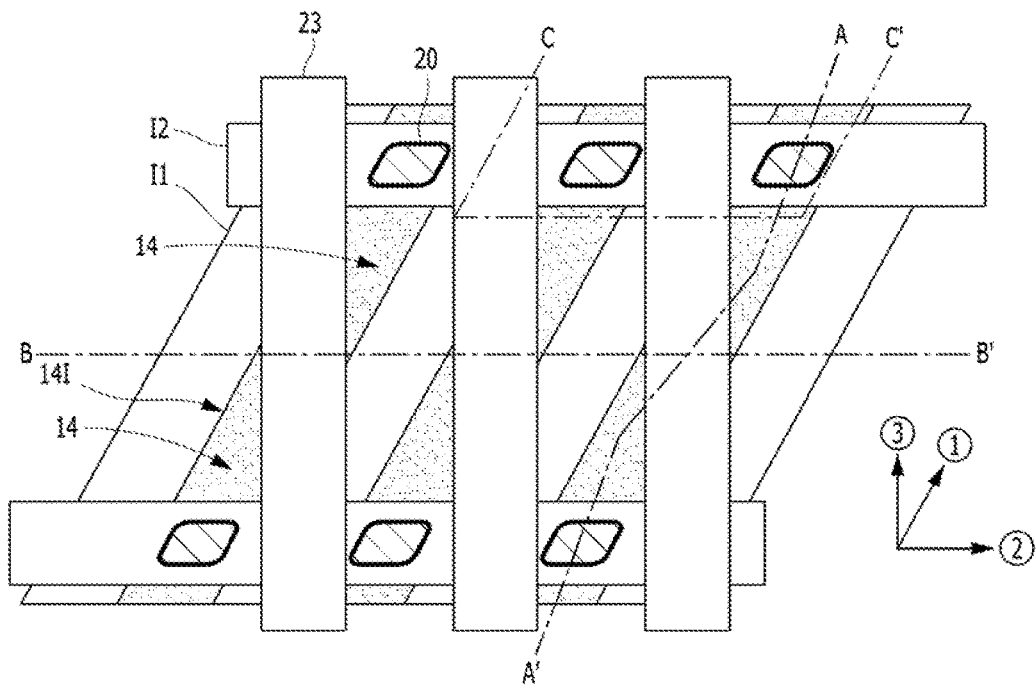
FIGS. 5A to 5H are views illustrating an example of a method for forming a buried bit line of the semiconductor in accordance with the first embodiment.
Figure 6A:
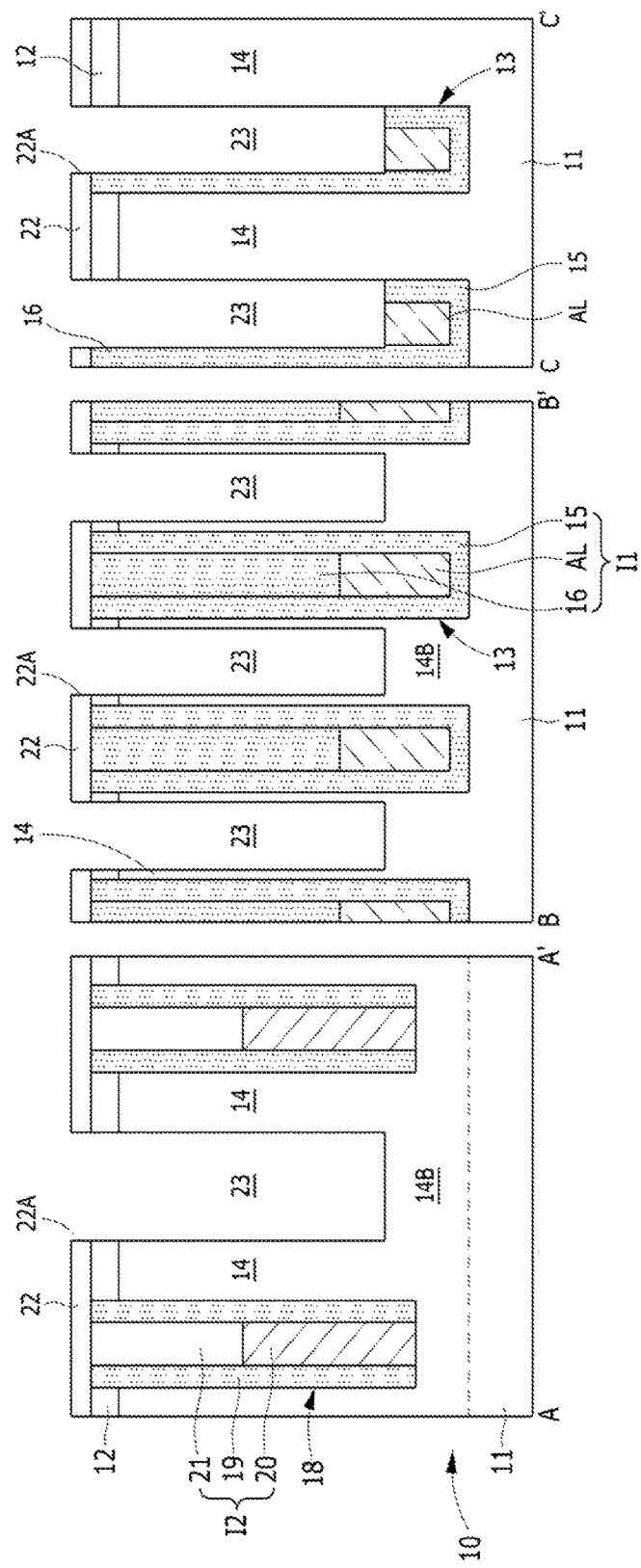
FIGS. 6A to 6H are cross-sectional views taken along the lines A-A', B-B' and C-C' of FIG. 5H.

As shown in FIGS. 5A and 6A, a second hard mask layer 22 may be formed. A plurality of line type openings 22A may be formed in the second hard mask layer 22. The second hard mask layer 22 may be formed of a material having etch selectivity with respect to the substrate 10. For example, the second hard mask layer 22 may include silicon nitride.

A bit line trench 23 may be formed. The island type active region 14I may be etched by using the second hard mask layer 22 having the line type openings by an etch mask. Thus, the line type bit line trench 23 may be formed. The bit line trench 23 may be a line type extending in a third direction 3̂. The line trench 23 may extend in a direction crossing with the second isolation trench 18. The bit line trench 23 may be formed to be shallower than the first and second isolation trenches 13 and 18. The bit line trench 23 may have a depth sufficient to increase the average cross-sectional area of a subsequent gate electrode. In order to form the bit line trench 23, in addition to the island type active region 14I, the first device isolation region I1 and the second device isolation region I2 may also be etched. A part of island type active region 14I may be divided into preliminary pillars 14 by the bit line trench 23. A remaining portion 14B of the island type active region 14I may be formed under the preliminary pillar 14. The remaining portion 14B may be referred to as a body 14B.

Figure 5B:
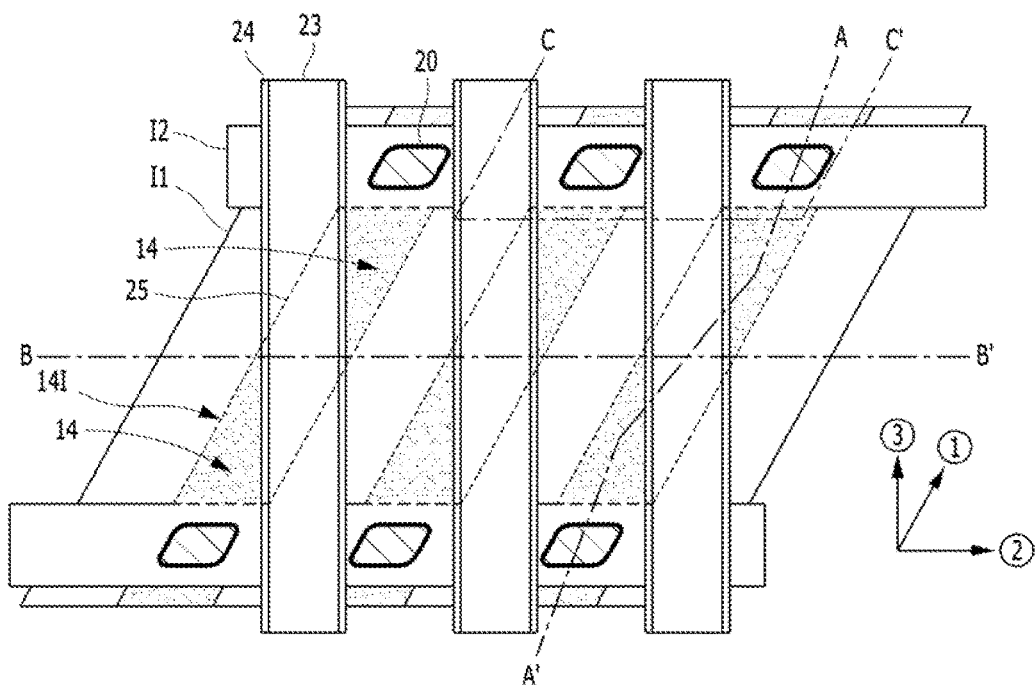
Figure 6B:
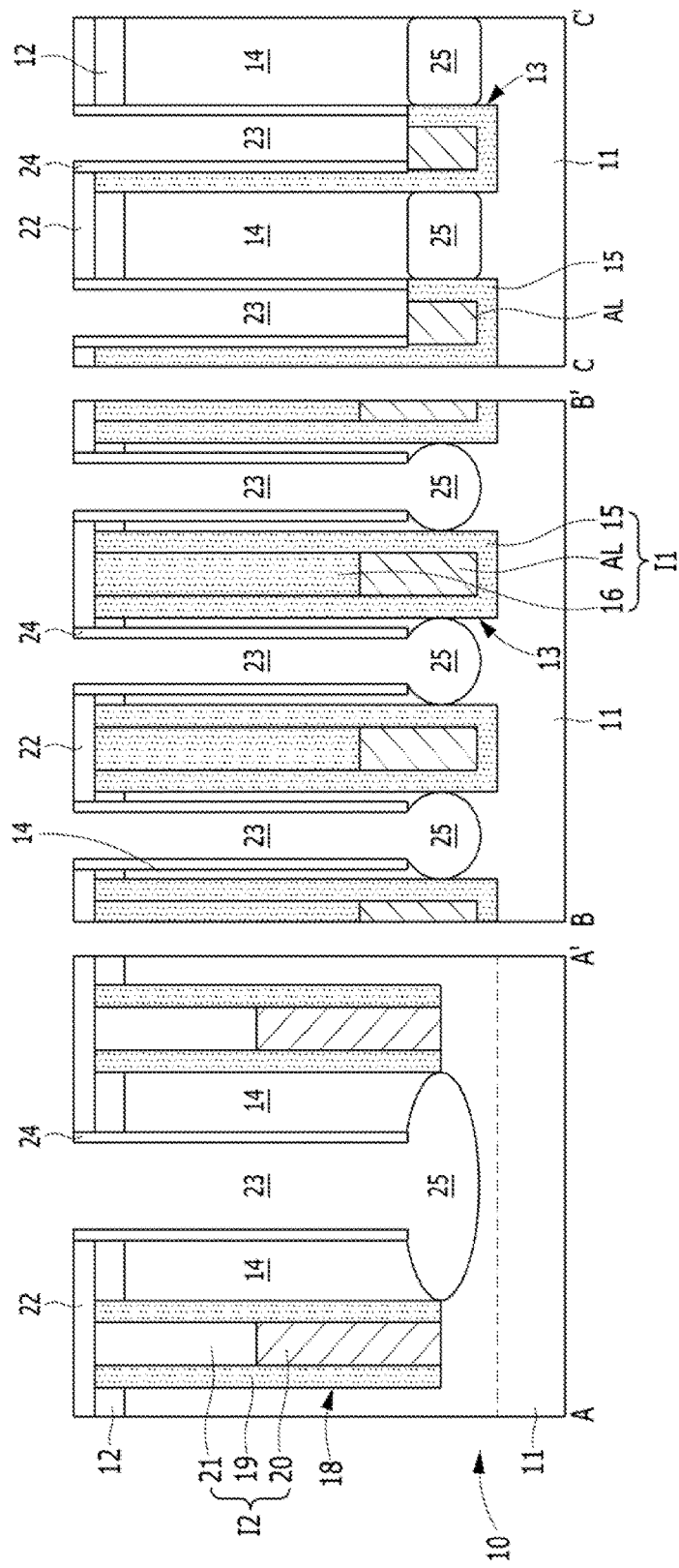

As shown in FIGS. 5B and 6B, a liner spacer 24 may be formed. The liner spacer 24 may be formed on both sidewalls of the bit line trench 23. The liner spacer 24 may be formed by depositing silicon oxide followed by an etch-back process.

A body trench 25 may be formed. The body trench 25 may be formed by etching the bottom surface of the bit line trench 23 to a given depth. The bottom surface of the bit line trench 23 may be extended by using the second hard mask layer 22 and the liner spacer 24 as etch masks. Thus, a part of the body 14B may be etched to form the body trench 25. In order to form the body trench 25, isotropic etching may be performed. According to the isotropic etching, the body trench 25 may be a bulb type. The line width of the body trench 25 may be larger than that of the bit line trench 23. The depth of the body trench 25 may be shallower than those of the first and second isolation trenches 13 and 18. The body trench 25 may extend in the first direction 1̂ under the preliminary pillar 14. For example, the side surface of the body trench 25 may be extended to be adjacent to the sidewalls of the second isolation trench 18.

As above, as the bit line trench 23 and the body trench 25 are formed, the island type active region 14I may be divided into a pair of preliminary pillars 14. That is, the pair of preliminary pillars 14 may be spaced from each other by the bit line trench 23 and the body trench 25.

Figure 5C:
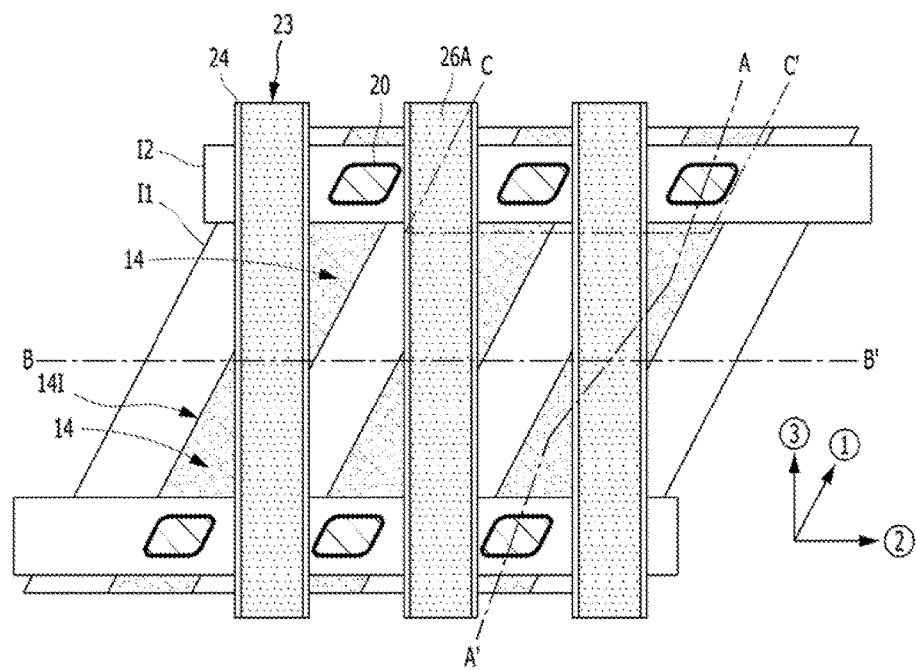
Figure 6C:
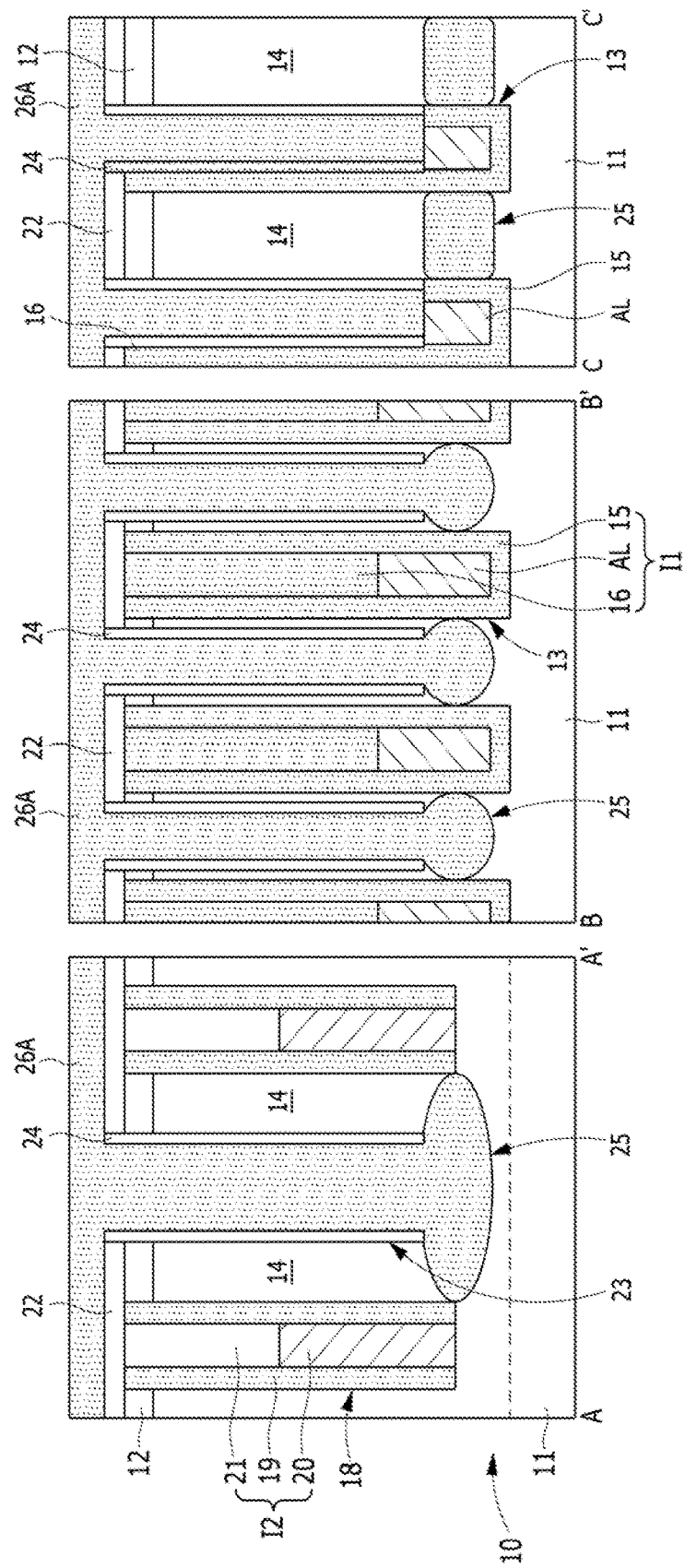

As shown in FIGS. 5C and 6C, a preliminary anti-punch layer 26A may fill the body trench 25 and the bit line trench 23. The preliminary anti-punch layer 26A may be formed of a dielectric material. In order to form the preliminary anti-punch layer 26A, the bit line trench 23 and the body trench 25 may be filled with a spin-on-dielectric (SOD).

Figure 5D:
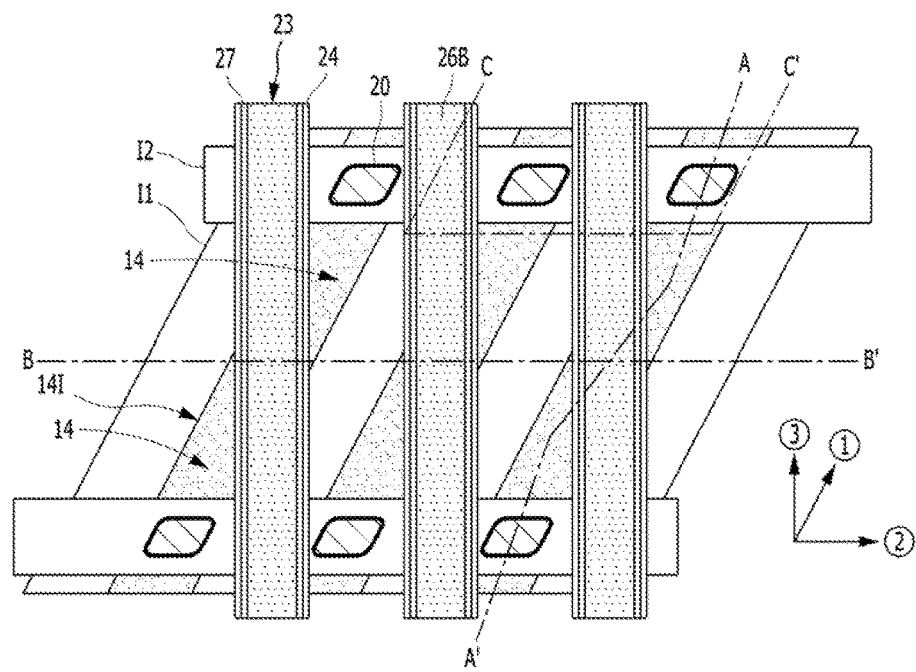
Figure 6D:
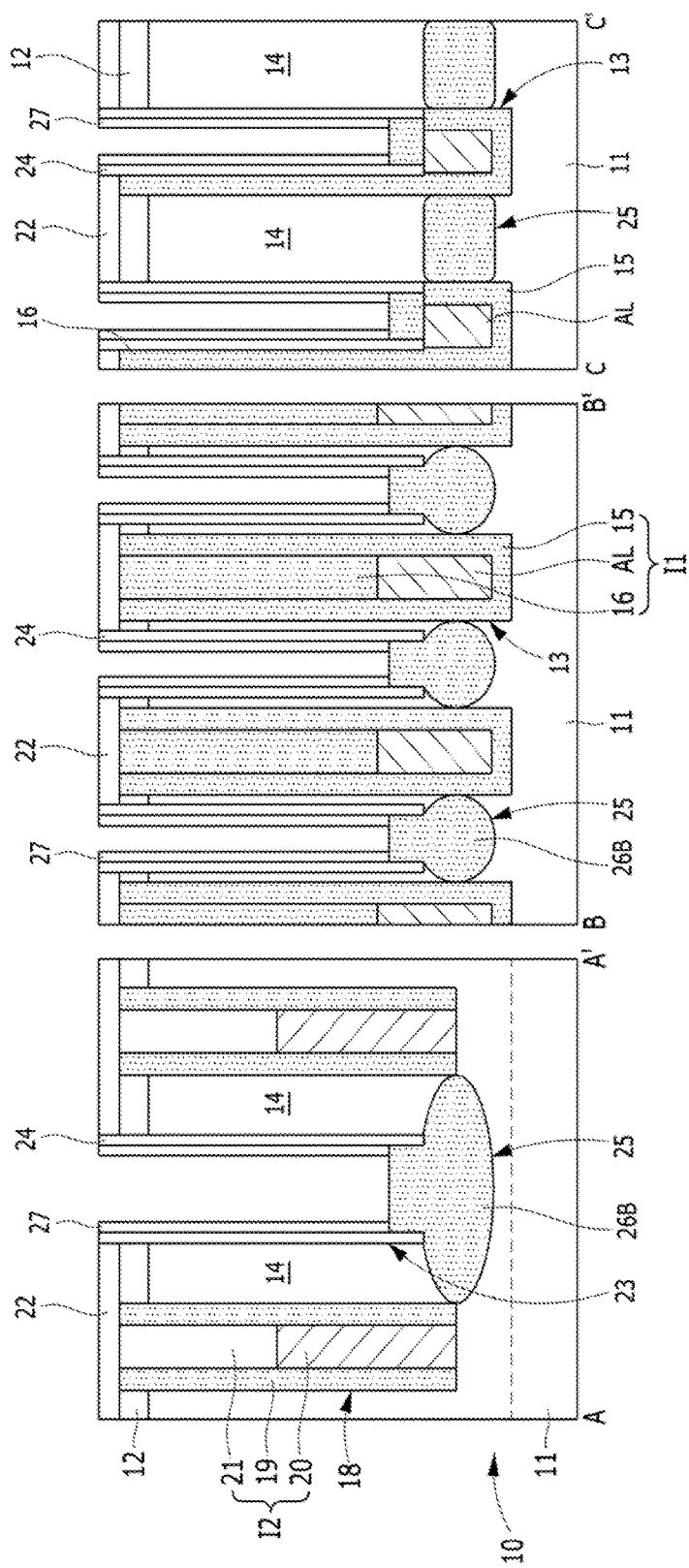

As shown in FIGS. 5D and 6D, a recessed anti-punch layer 26B may be formed. For example, the preliminary anti-punch layer 26A may be recessed to a given depth. The recessed anti-punch layer 26B may fill at least the body trench 25. The height of the recessed anti-punch layer 26B may be controlled such that the top surface thereof is positioned at the bottom of the bit line trench 23. The pair of preliminary pillars 14 may float from the bulk 11 by the recessed anti-punch layer 26B. Moreover, electrical connection between the pair of the preliminary pillars 14 may be suppressed by the recessed anti-punch layer 26B. In order to form the recessed anti-punch layer 26B, a planarization process and then an etch-back process may be performed.

Then, a sacrificial spacer 27 may be formed. The sacrificial spacer 27 may cover the sidewalls of the liner spacer 24. The sacrificial spacer 27 may be formed of titanium nitride. For example, the sacrificial spacer 27 may be formed by conformally depositing titanium nitride followed by an etch-back process.

Figure 5E:
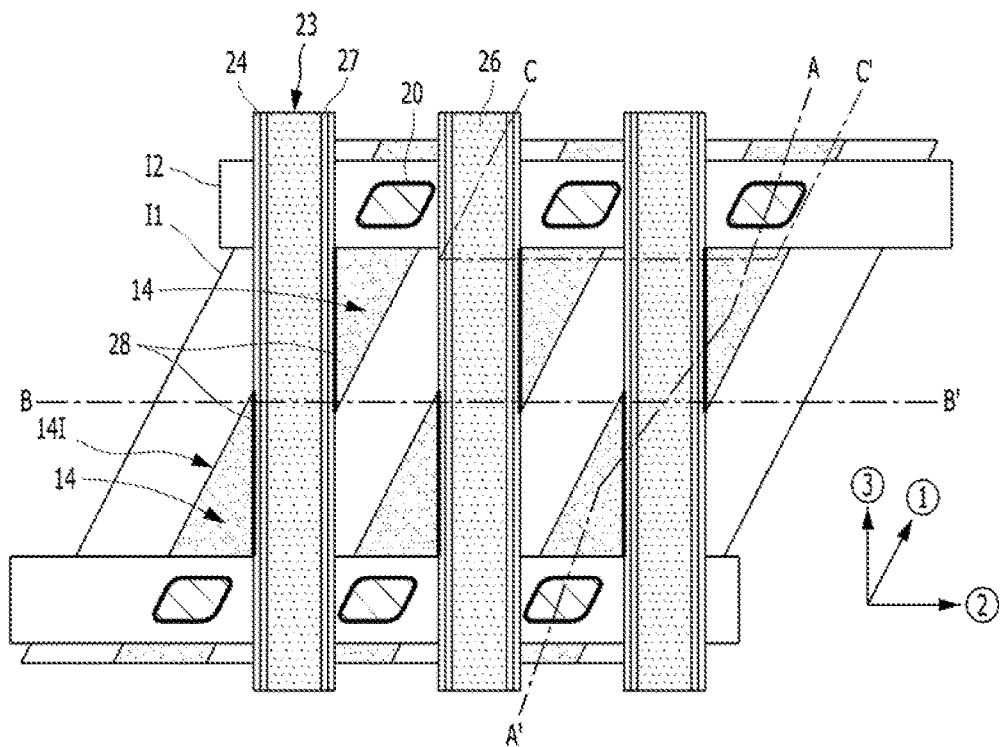
Figure 6E:
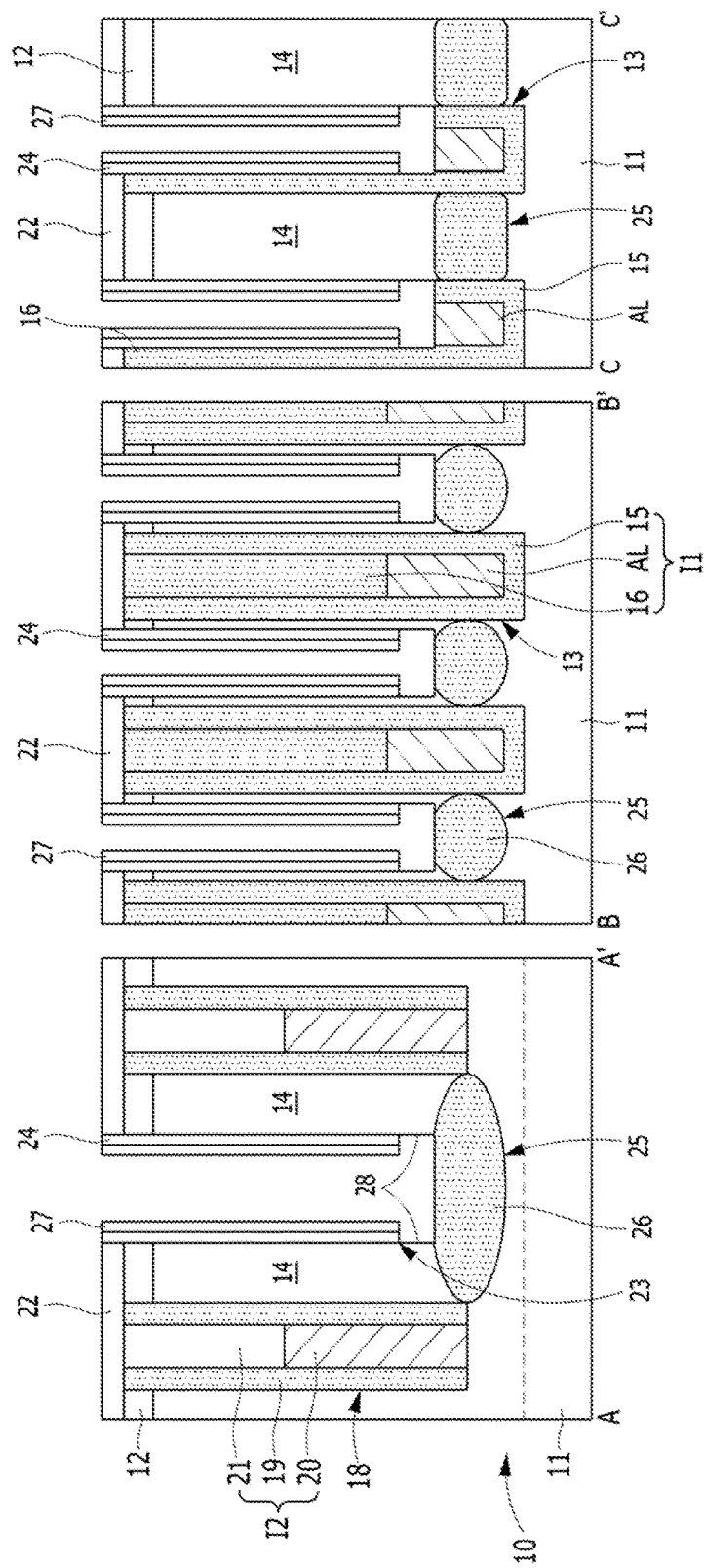

As shown in FIGS. 5E and 6E, an opening 28 exposing the bottom sidewall of the preliminary pillar 14 may be formed. In order to form the opening 28, the recessed anti-punch layer 26B may be recessed to a given depth by using the sacrificial spacer 27 as a barrier. Thus, an anti-punch layer 26 may be formed. The anti-punch layer 26 may fill the body trench 25. As the anti-punch layer 26 is recessed, a part of the liner spacer 24 may be exposed. Then, the exposed portion of the liner spacer 24 may be selectively removed. Thus, the opening 28 exposing the bottom sidewall of the preliminary pillar 14 may be formed. The opening 28 is a region contacting a subsequent buried bit line and may be both side contact (BSC) exposing bottom sidewalls of neighboring preliminary pillars 14 simultaneously. For example, both bottom sidewalls of the bit line trench 23 may be simultaneously exposed by the opening 28. The sidewalls of the preliminary pillar 14 which are not exposed by the opening 28 may be covered by the liner spacer 24.

Thus, this embodiment does not require additional contact masks for forming the opening 28.

Figure 5F:
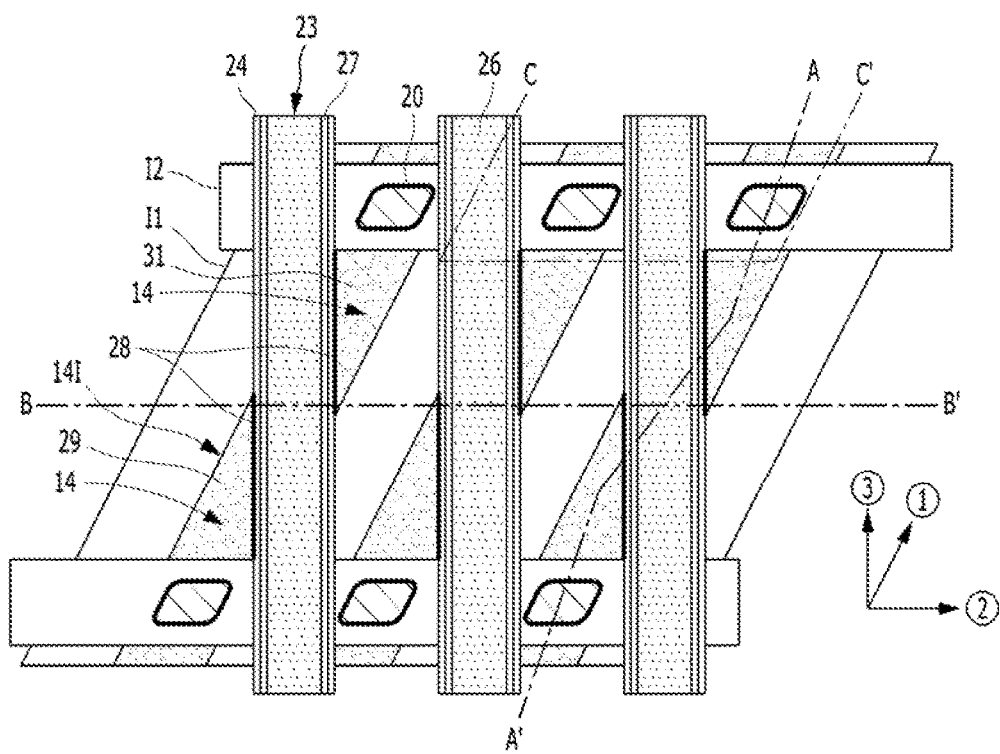
Figure 6F:
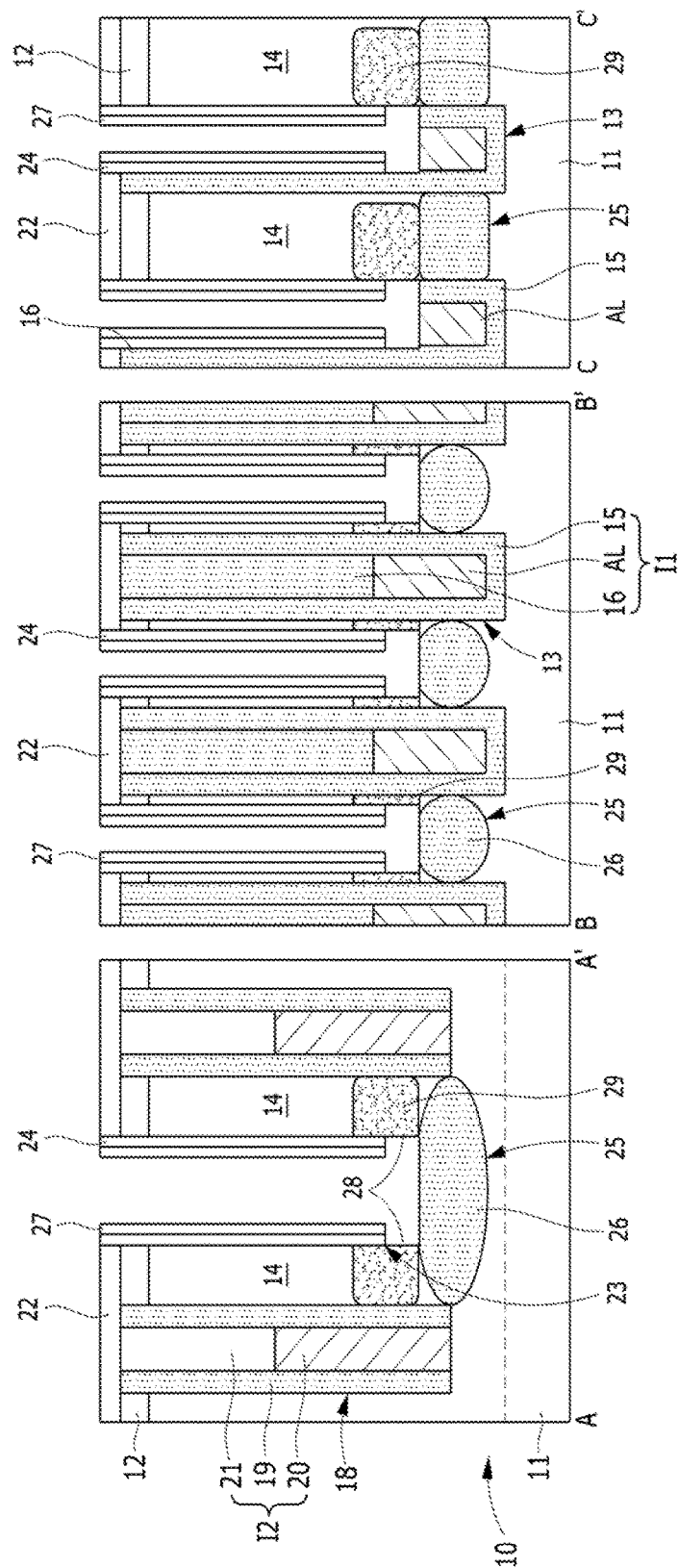

As shown in FIGS. 5F and 6F, a first junction region 29 may be formed. In order to form the first junction region 29, an impurity doping process may be performed by a plasma doping technology. For example, the impurity may be plasma doped through the opening 28 to form the first junction region 29. In the doping process, the impurity may include an N-type impurity or a P-type impurity. For example, phosphorous (P) or arsenic (As) may be used as the impurity. The first junction region 29 may be formed at the bottom of the preliminary pillar 14. The first junction region 29 may be formed floating from the bulk 11. That is, it may be separated from the bulk 11 by the anti-punch layer 26. Moreover, lateral diffusion of the first junction region 29 may be suppressed by the second device isolation region I2.

Figure 5G:
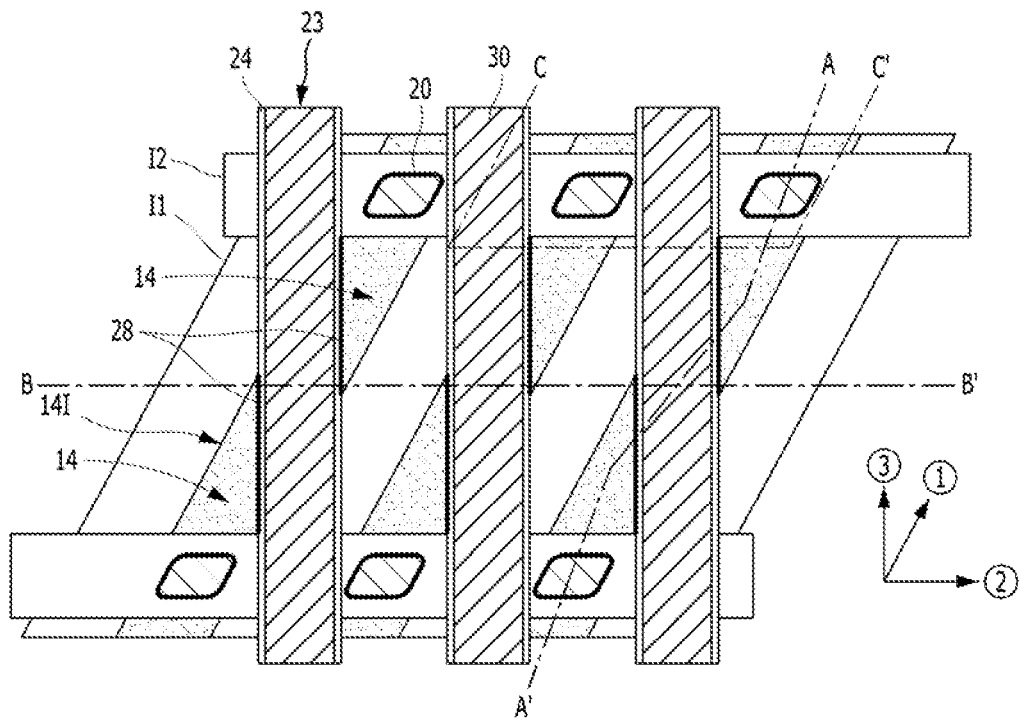
Figure 6G:
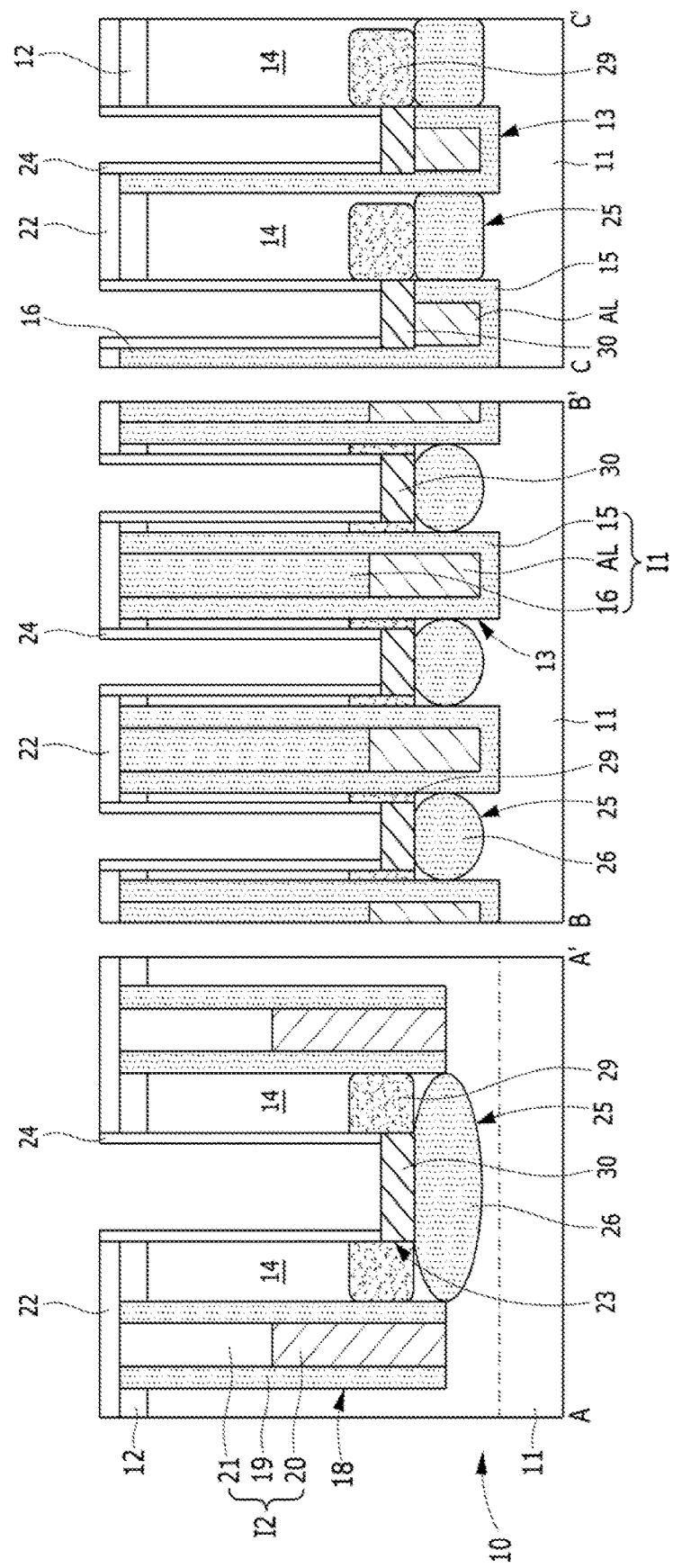

As shown in FIGS. 5G and 6G, a bit line 30 may be formed. For example, the bit line 30 may be formed by forming a metal layer (not shown) to bury the bit line trench 23 and then etching back the metal layer. Here, the bit line 30 may include tungsten (W). Both ends of the bit line 30 may be electrically coupled to the first junction region 29 by filling the opening 28. The anti-punch layer 26 may be positioned between the bit line 30 and the bulk 11. Before forming the bit line 30, an omic contact layer (not shown) for an omic contact between the first junction region 29 and the bit line 30 may be formed. The omic contact layer may include metal silicide. For example, the omic contact layer may include cobalt silicide. In order to form cobalt silicide, a cobalt layer may be deposited on the whole surface of the structure having the first junction region 29 and then a thermal treatment may be performed. Subsequently, unreacted cobalt layer may be removed.

As above, the bit line 30 may contact the first junction region 29 without a plug. It may be referred to as a plugless contact.

Figure 5H:
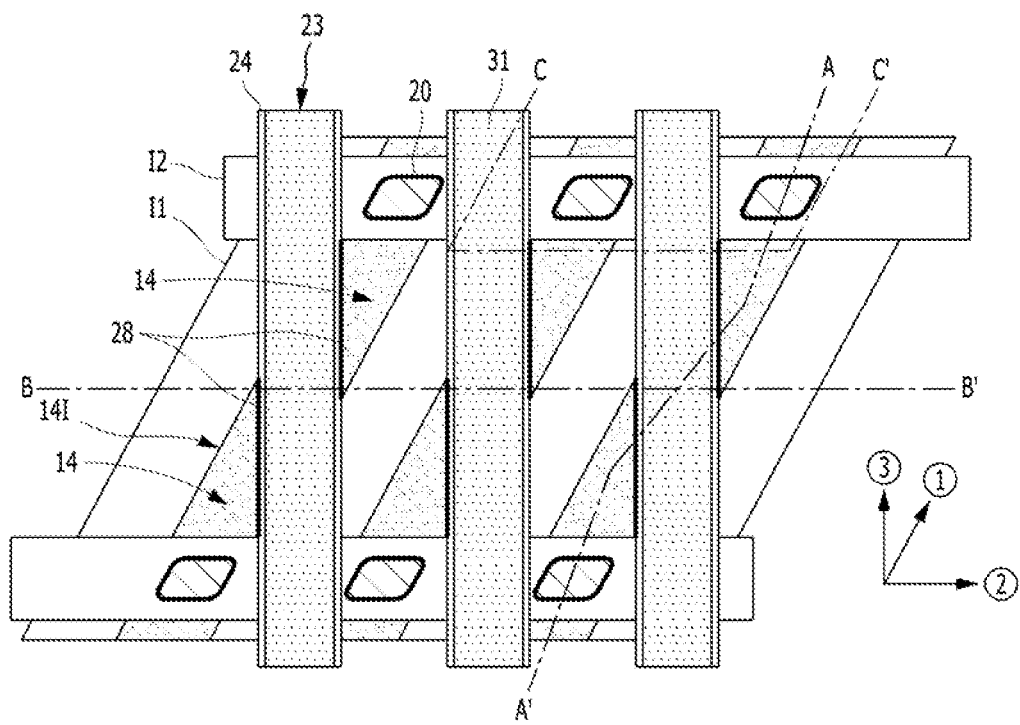
Figure 6H:
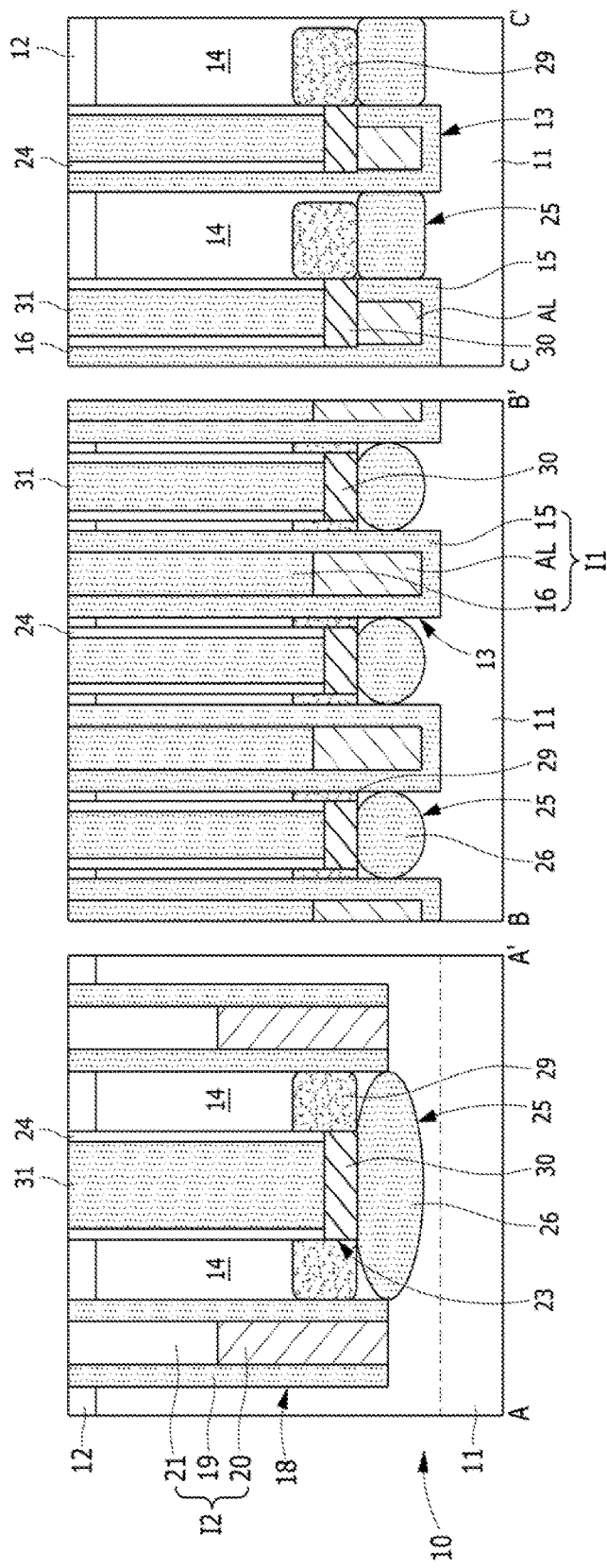

As shown in FIGS. 5H and 6H, the sacrificial spacer 27 may be selectively removed.

In order to cover the bit line 30, a bit line capping layer 31 may be formed to bury the bit line trench 23. Here, the bit line capping layer 31 may include silicon oxide.

Subsequently, the bit line capping layer 31 may be planarized until the surface of the first hard mask layer 12 is exposed.

FIGS. 7A to 7H are views illustrating an example of a gate electrode of the semiconductor device in accordance with the first embodiment. FIGS. 8A to 8H are cross-sectional views taken along the lines A-A', B-B' and C-C' of FIG. 7H.

Figure 7A:
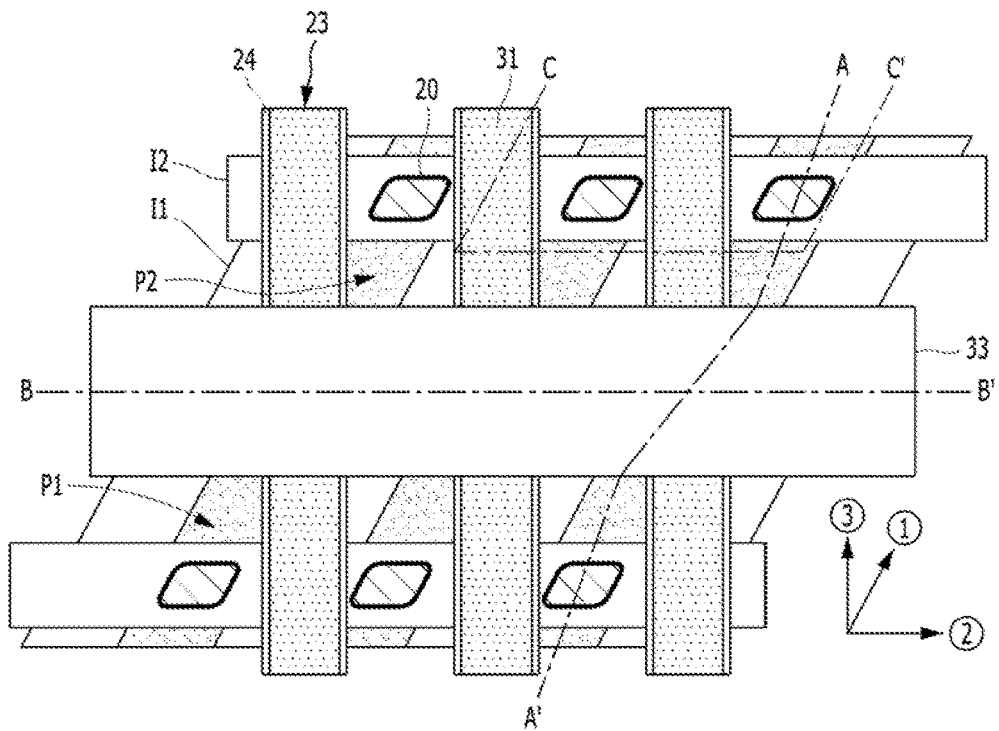
FIGS. 7A to 7H are views illustrating an example of a gate electrode of the semiconductor device in accordance with the first embodiment.
Figure 8A:
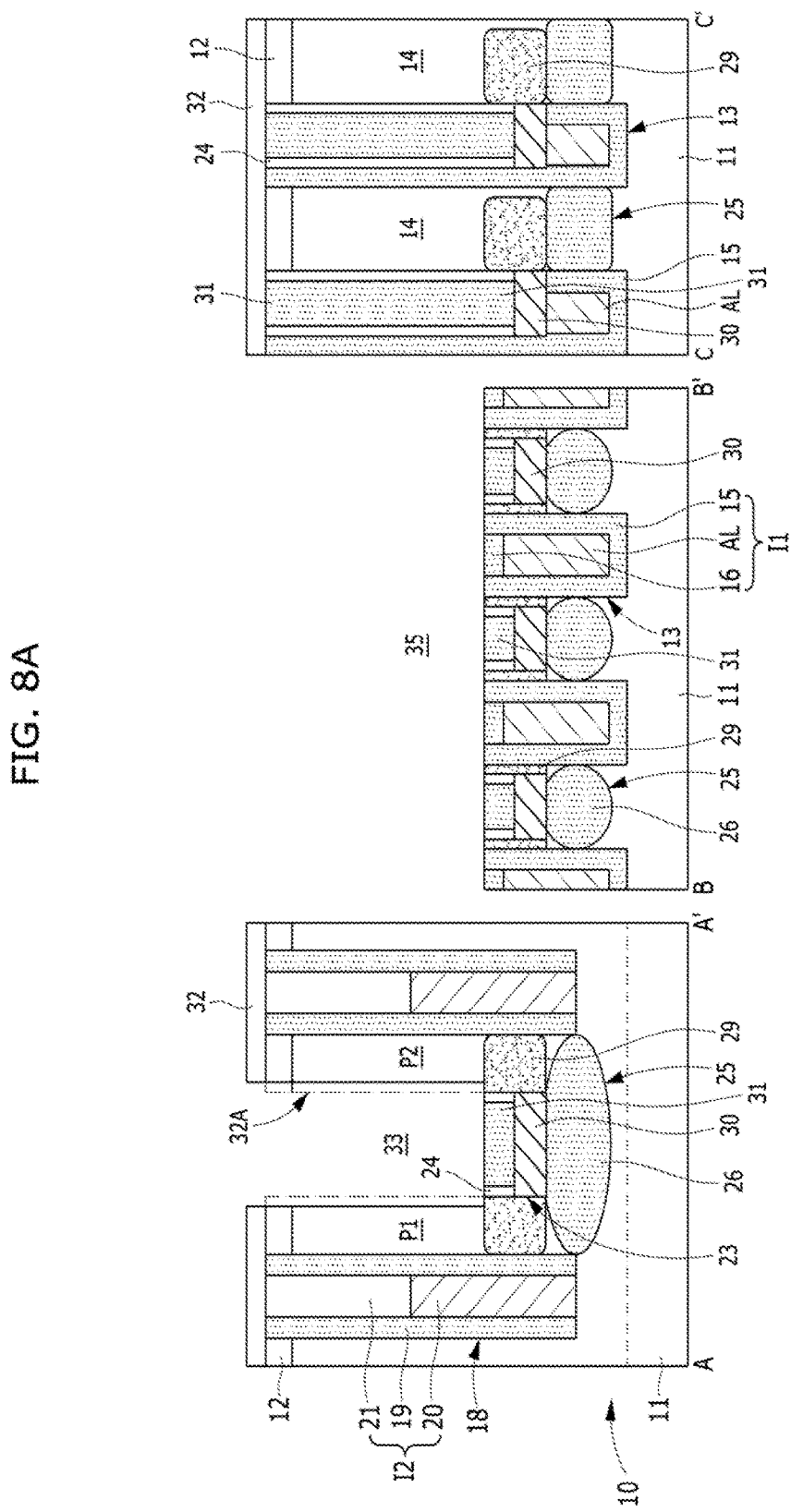
FIGS. 8A to 8H are cross-sectional views taken along the lines A-A', B-B' and C-C' of FIG. 7H.

As shown in FIGS. 7A and 8A, a preliminary gate trench 33 may be formed. For example, the preliminary gate trench 33 may be formed by etching the bit line capping layer 31, the first device isolation region I1 and the preliminary pillar 14 by using a third hard mask layer 32 as an etch mask (see, reference number 32A). An etch process for forming the preliminary gate trench 33 may be performed until the bit line capping layer 31 remains to a given thickness. The preliminary gate trench 33 may extend in a direction crossing with the bit line 30. The preliminary gate trench 33 may extend in the second direction $\hat{2}$. The first junction region 29 may be exposed at the bottom of the preliminary gate trench 33.

A pair of first and second pillars P1 and P2 may be formed by the preliminary gate trench 33. The first and second pillars P1 and P2 may be formed by etching the preliminary pillar 14. Each of the first and second pillars P1 and P2 may become a structure having multi-sidewalls. During the etch process for forming the preliminary gate trench 33, a part of the liner spacer 24 may be etched. Along the line B-B', under the preliminary gate trench 33, the top surfaces of the liner spacer 24, the first device isolation region I1 and the bit line capping layer 31 may be at the same level to one another. The liner spacer 24 may be referred to as a bit line capping liner 24.

Figure 7B:
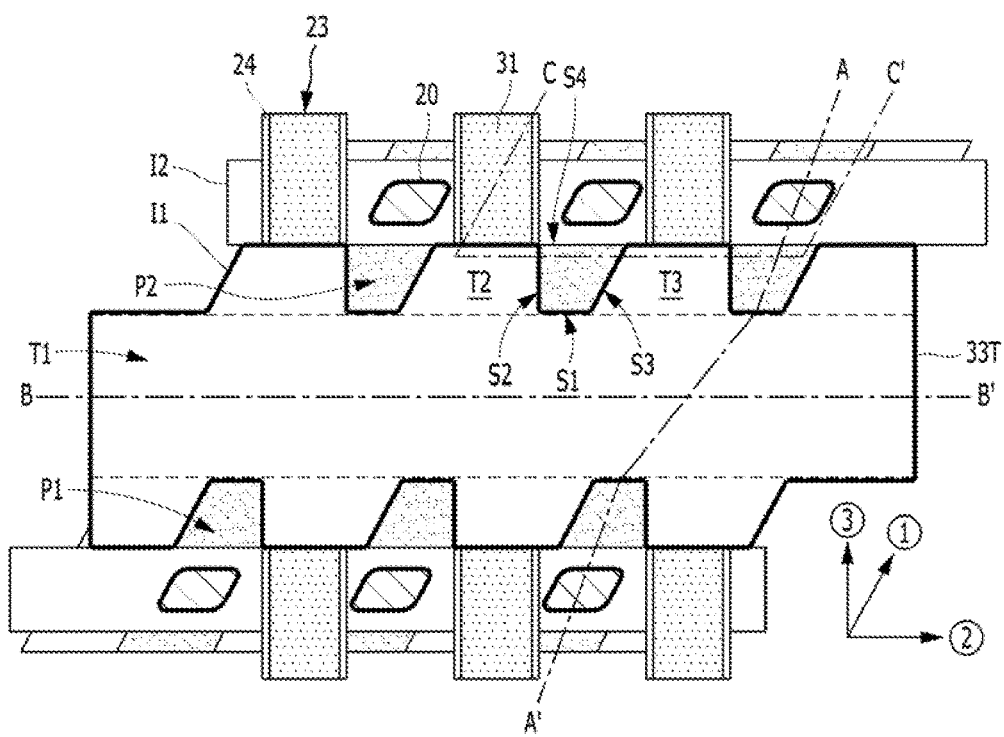
Figure 8B:
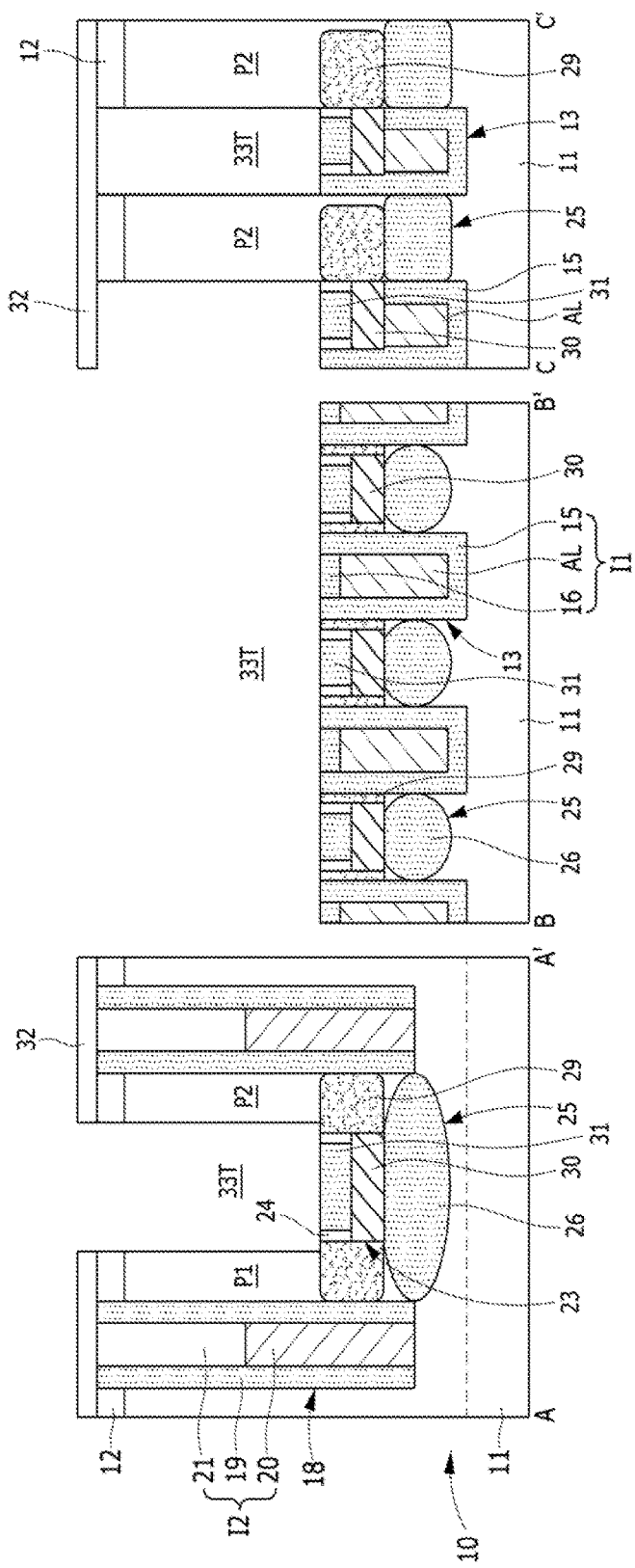

As shown in FIGS. 7B and 8B, an extending process of the preliminary gate trench 33 may be performed. For example, the bit line capping layer 31 and the first device isolation region I1 may be selectively etched by a wet etch process. It may be referred to as a widening process. The widening process may use wet etching. The preliminary gate trench 33 may extend in the first direction $\hat{1}$ by etching a part of the first device isolation region I1 and a part of the bit line capping layer 31 are etched by wet widening. According to the wet widening process, oxides may be selectively removed. For example, the first liner 15, the first isolation dielectric layer 16, the bit line capping liner 24 and the bit line capping layer 31 may be selectively removed.

A preliminary gate trench extended by the wet widening process may be referred to as a gate trench 33T. The gate trench 33T may include a first trench T1, a second trench T2 and a third trench T3. The first trench T1 may extend in the second direction $\hat{2}$. The first trench T1 may be positioned between the first pillar P1 and the second pillar P2. The second trench T2 and the third trench T3 may stem from the first trench T1. The second trench T2 and the third trench T3 may extend in the first direction $\hat{1}$ crossing with the second direction $\hat{2}$.

Side surfaces of the first and second pillars P1 and P2 may be exposed by the first trench T1, the second trench T2 and the third trench T3. For example, a first side surface S1, a second side surface S2 and a third side surface S3 may be exposed. The first side surface S1 may be exposed by the first trench T1, and the second side surface S2 and the third side surface S3 may be exposed by the second trench T2 and the third trench T3, respectively. The second trench T2 and the third trench T3 may be the same as each other in terms of size and shape. The first and second pillars P1 and P2 may include a fourth side surface S4, the fourth side surface S4 may contact the second device isolation region I2. The second device isolation region I2 may contact the second trench T2 and the third trench T3.

After the wet widening process, the bit line capping layer 31 and the bit line capping liner 24 may remain to a given thickness on the bit line 30.

Figure 7C:
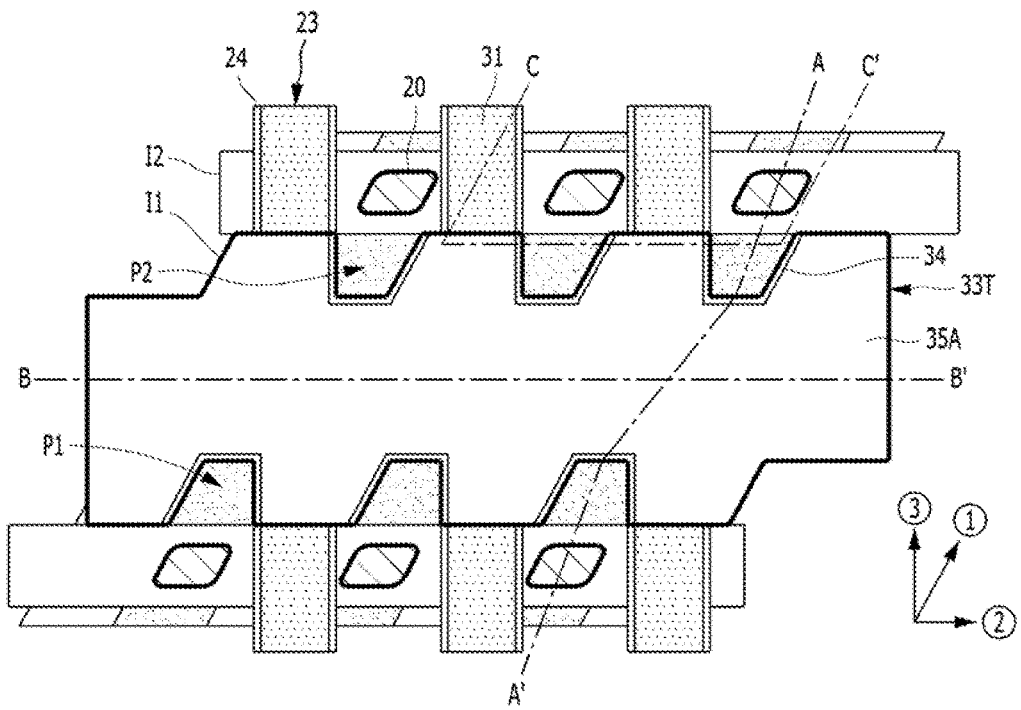
Figure 8C:
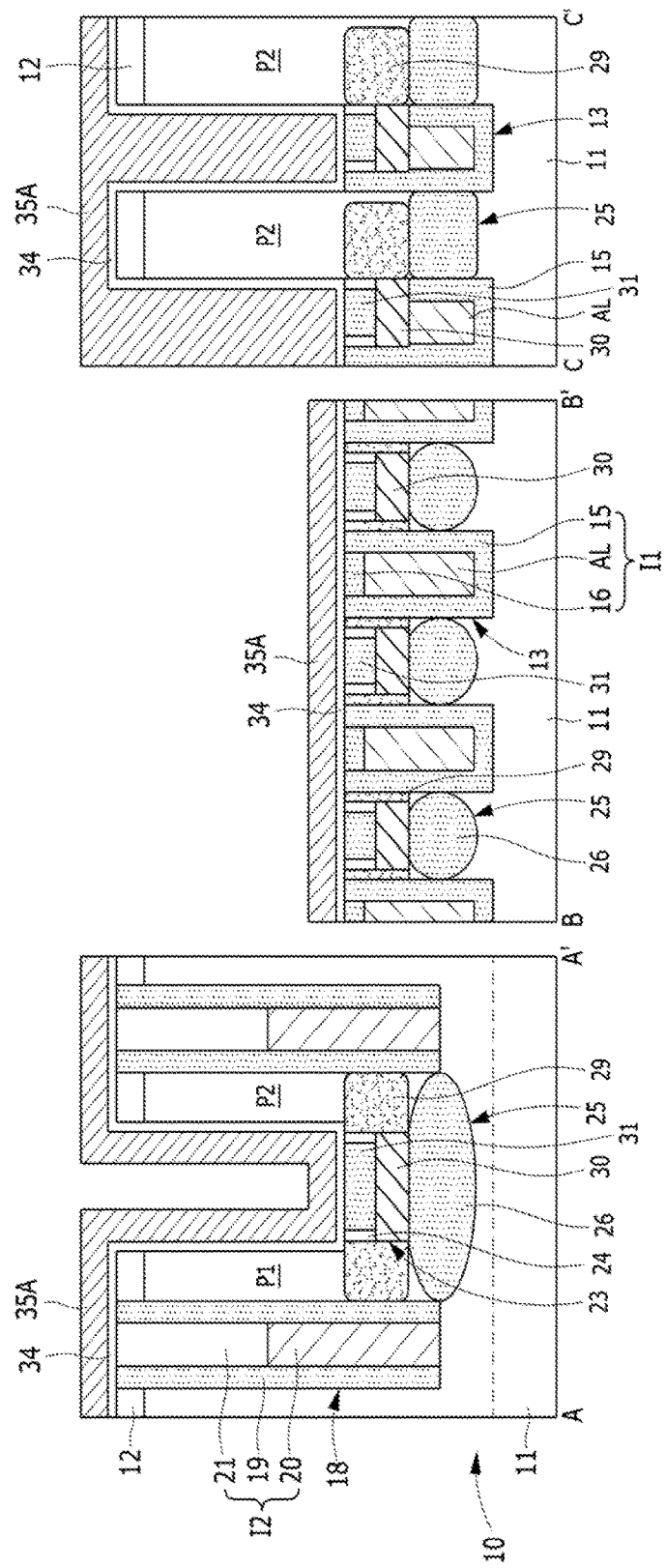

As shown in FIGS. 7C and 8C, the third hard mask layer 32 may be removed.

Then, a gate dielectric layer 34 may be formed on the surface of the gate trench 33T.

The gate dielectric layer 34 may be formed by a thermal oxidation process. In another embodiment, the gate dielectric layer 34 may be formed by chemical vapor deposition (CVD) or atomic layer deposition (ALD). The gate dielectric layer 34 may include a high-k material, an oxide, a nitride, an oxynitride or a combination thereof. The high-k material may include a hafnium-containing material. The hafnium-containing material may include hafnium oxide, hafnium silicon oxide, hafnium silicon oxynitride or a combination thereof. In another embodiment, the high-k material may include lanthanum oxide, lanthanum aluminum oxide, zirconium oxide, zirconium silicon oxide, zirconium silicon oxynitride, aluminum oxide or a combination thereof. As the high-k material, other high-k materials known in the art may be selectively used.

A first gate conductive layer 35A may be formed on the gate dielectric layer 34. The first gate conductive layer 35A may be conformally formed on the gate trench 33T. The first gate conductive layer 35A may include a low resistivity metal material. The first gate conductive layer 35A may be formed of titanium nitride, tungsten, and so on. In one embodiment, the first gate conductive layer 35A may include a lower barrier layer and a low resistivity layer. Moreover, the first gate conductive layer 35A may include a high work function material in order to control threshold voltage gate. The conductive layer 35A may include TiAlN as the high work function material.

Figure 7D:
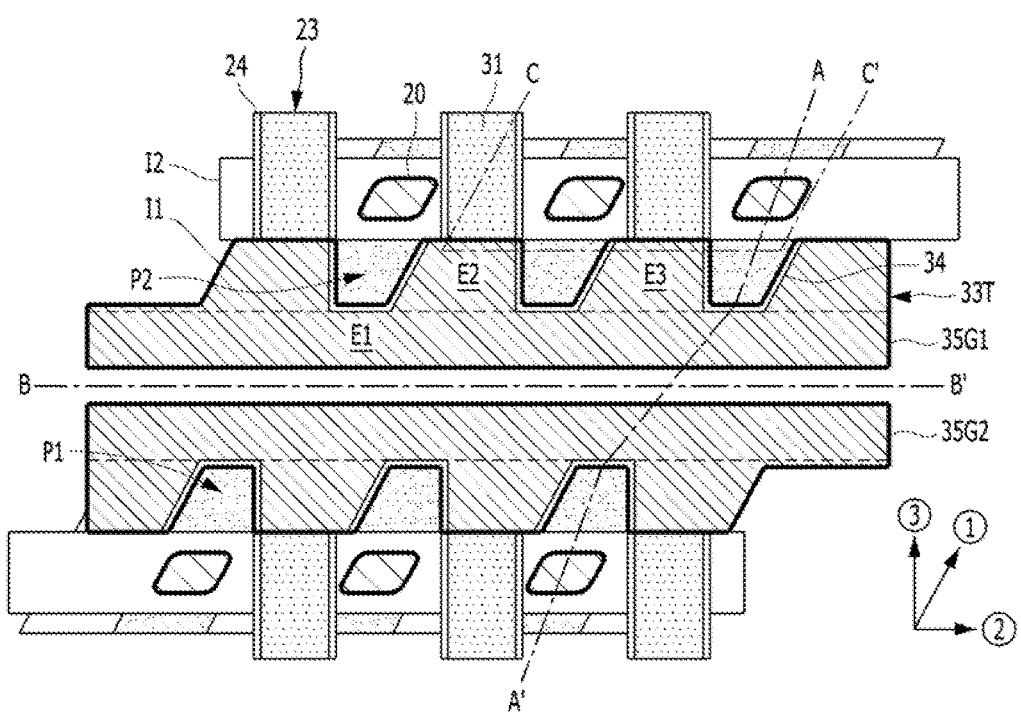
Figure 8D:
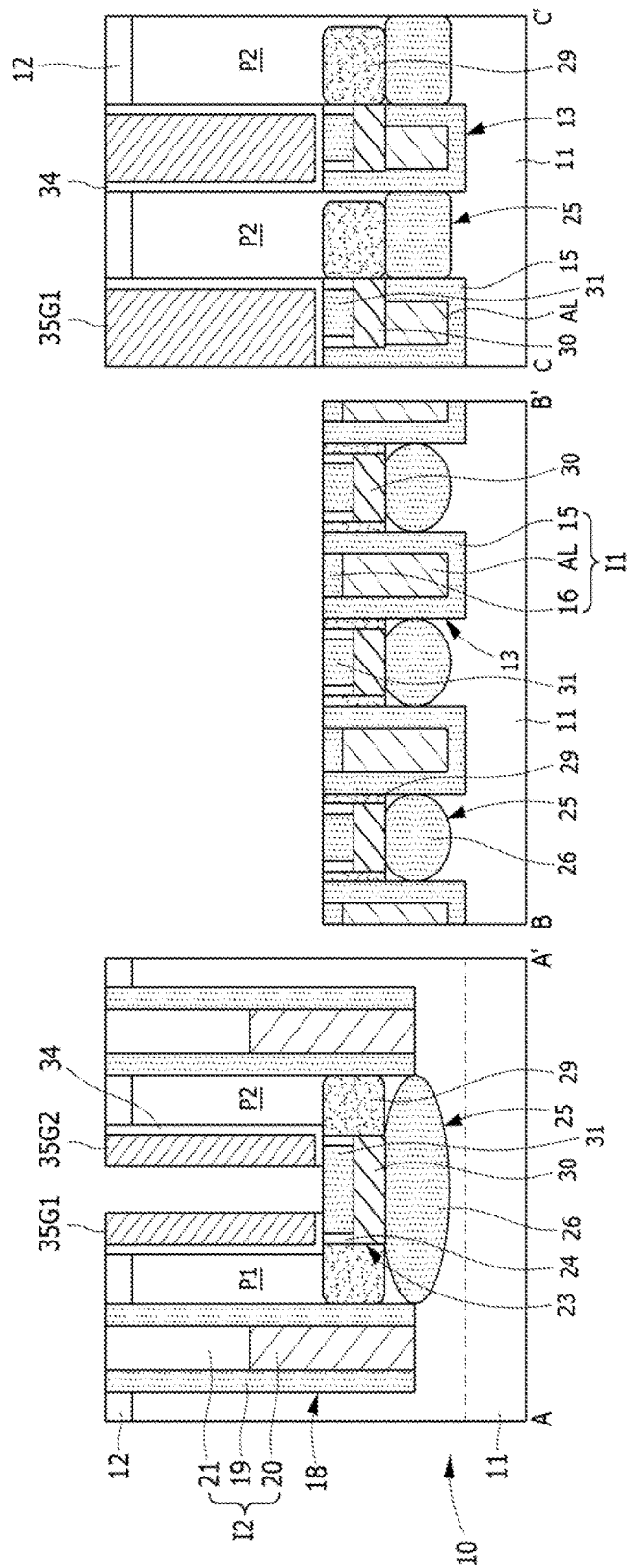

As shown in FIGS. 7D and 8D, a dry etch process may be performed such that preliminary lower gate electrodes 35G1 and 35G2 remain on the sidewalls of the gate trench 33T. For example, it may be performed by an etch-back process. The preliminary lower gate electrodes 35G1 and 35G2 may be formed by etching back the first gate conductive layer 35A. The preliminary lower gate electrodes 35G1 and 35G2 may have a spacer shape surrounding the sidewalls of the first and second pillars P1 and P2. The preliminary lower gate electrodes 35G1 and 35G2 may respectively include a first electrode E1, a second electrode E2 and a third electrode E3. The first electrode E1 may extend in the second direction $\hat{2}$, and the second electrode E2 and the third electrode E3 may stem from the first electrode E1. second electrode E2 and the third electrode E3 may extend in the first direction $\hat{1}$. The first electrode E1, the second electrode E2 and the third electrode E3 may be a shape surrounding at least three sidewalls of the first and second pillars P1 and P2. The first electrode E1 may be in a direction crossing with the buried bit line 30, and the second electrode E2 and the third electrode E3 may be positioned between neighboring first pillars P1 or between neighboring second pillars P2.

Figure 7E:
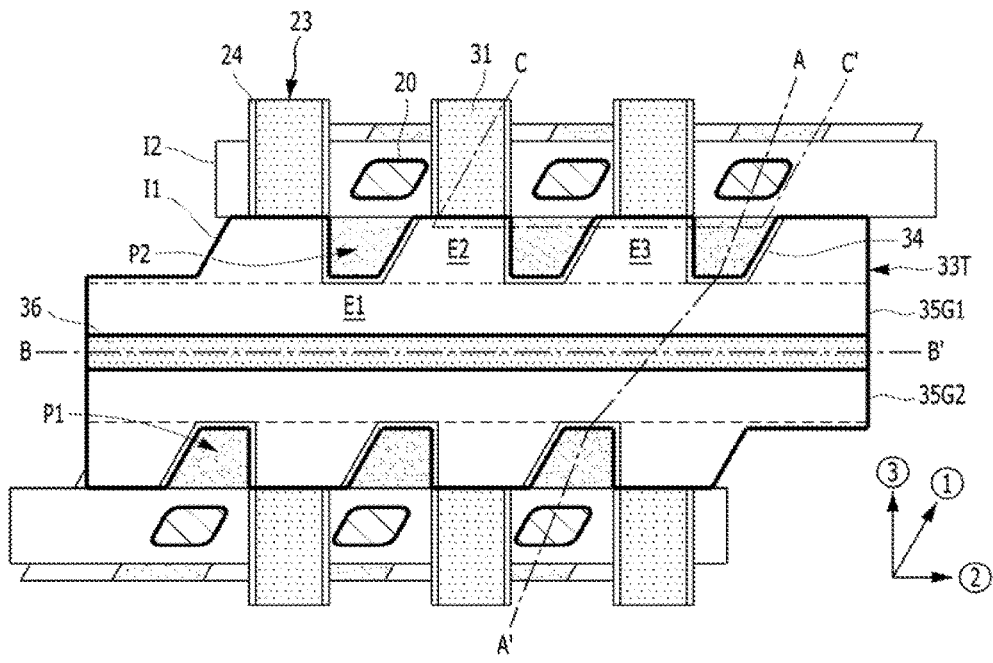
Figure 8E:
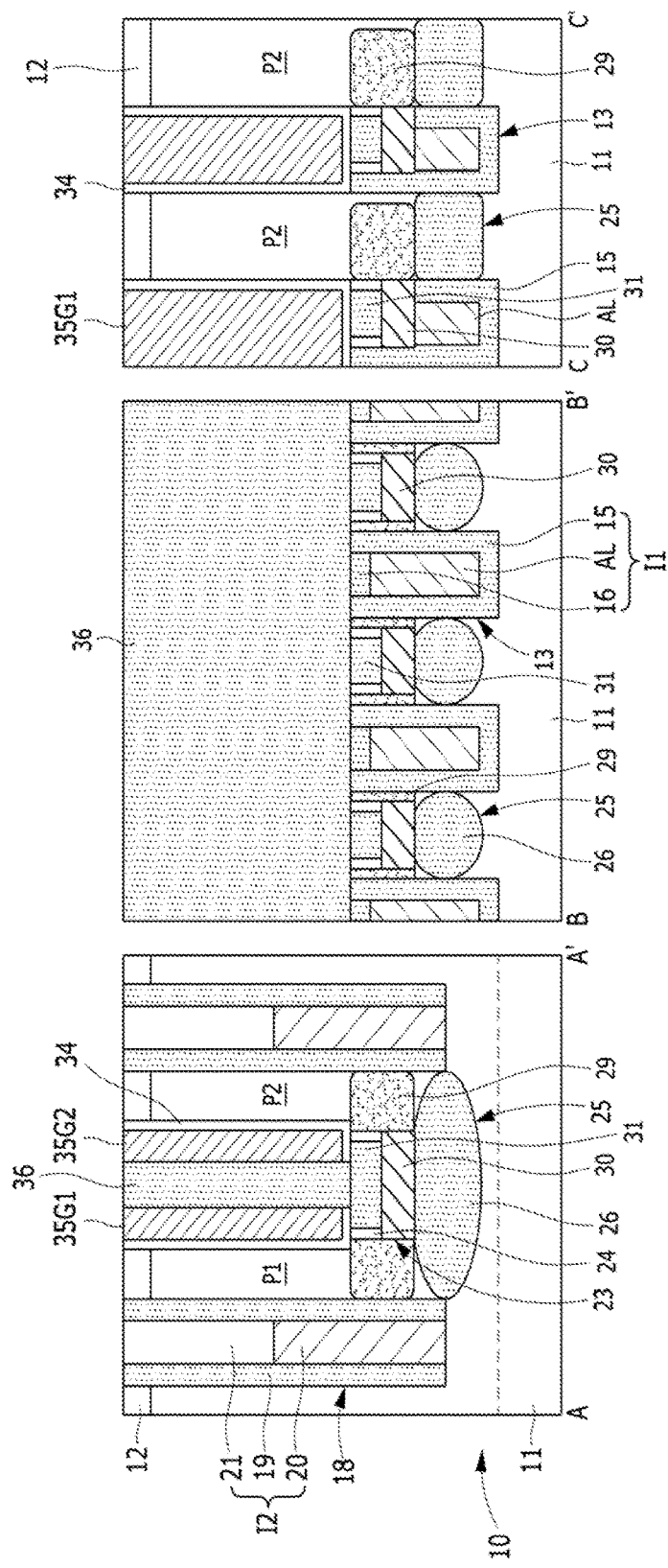

As shown in FIGS. 7E and 8E, a first gate capping layer 36 may be formed. The first gate capping layer 36 may fill the space between the preliminary lower gate electrodes 35G1 and 35G2. The first gate capping layer 36 may be planarized to expose the surfaces of the preliminary lower gate electrodes 35G1 and 35G2.

Figure 7F:
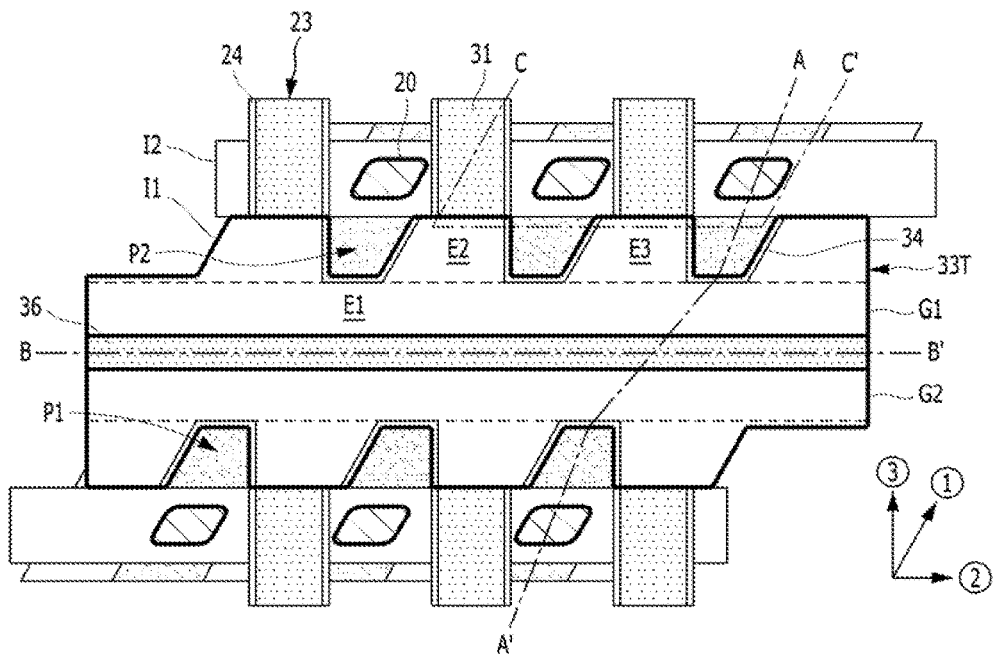
Figure 8F:
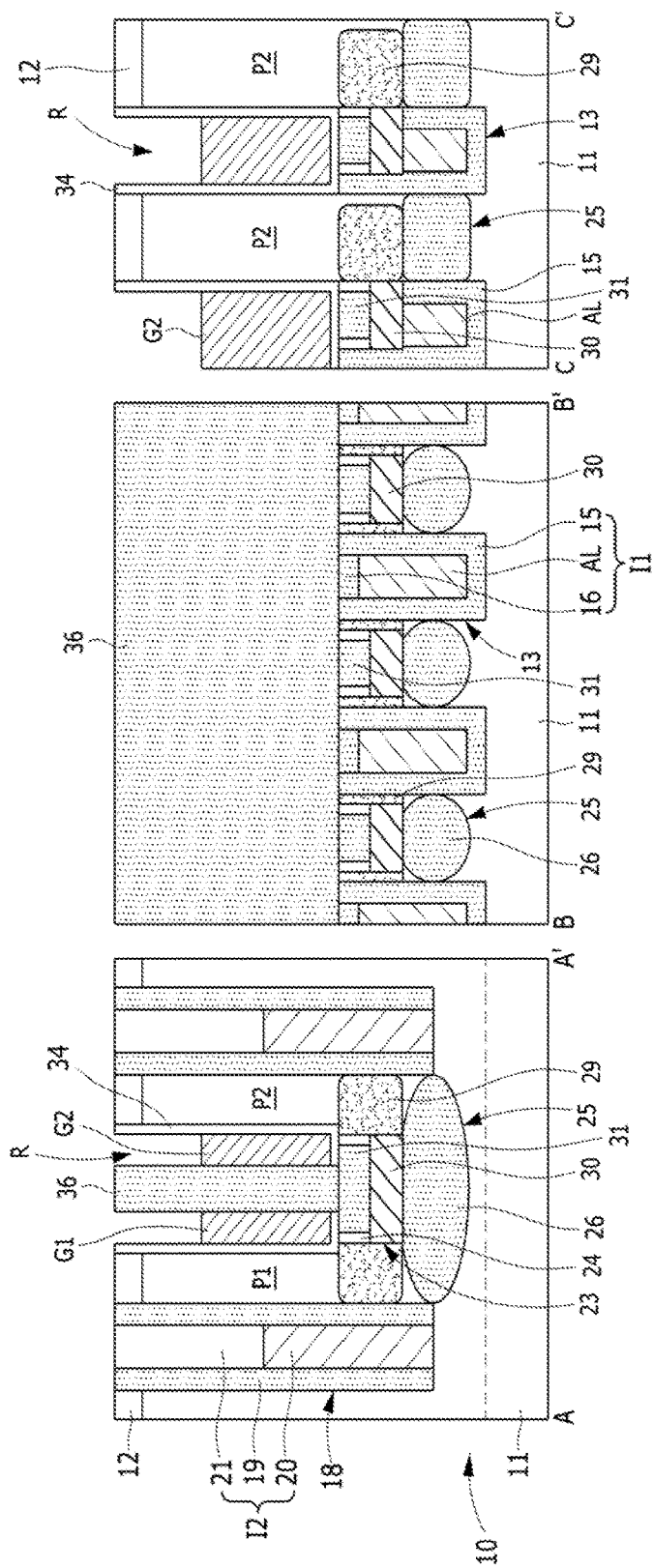

As shown in FIGS. 7F and 8F, the preliminary lower gate electrodes 35G1 and 35G2 may be recessed (see, reference number R). Thus, lower gate electrodes G1 and G2 may be formed.

Thus, the lower gate electrodes G1 and G2 may be embedded in the gate trench 33T. The lower gate electrodes G1 and G2 may be recessed such that the top surfaces thereof are lower than the top surfaces of the pillars P1 and P2. The first gate capping layer 36 may be positioned between neighboring low gate electrodes G1 and G2.

Figure 7G:
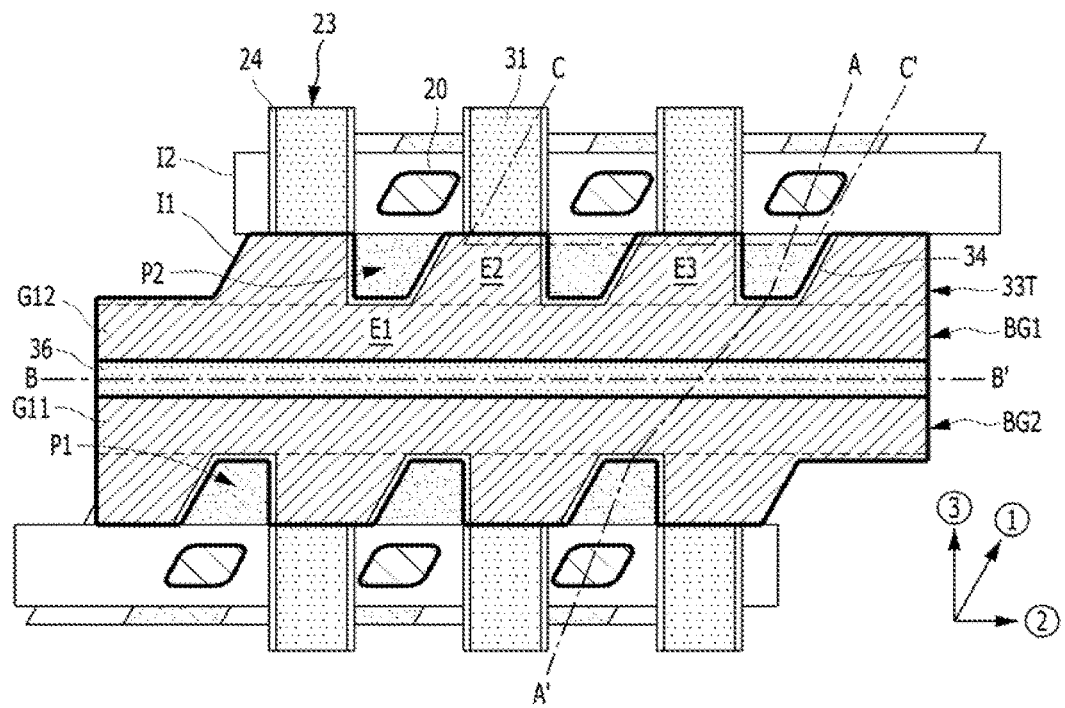
Figure 8G:
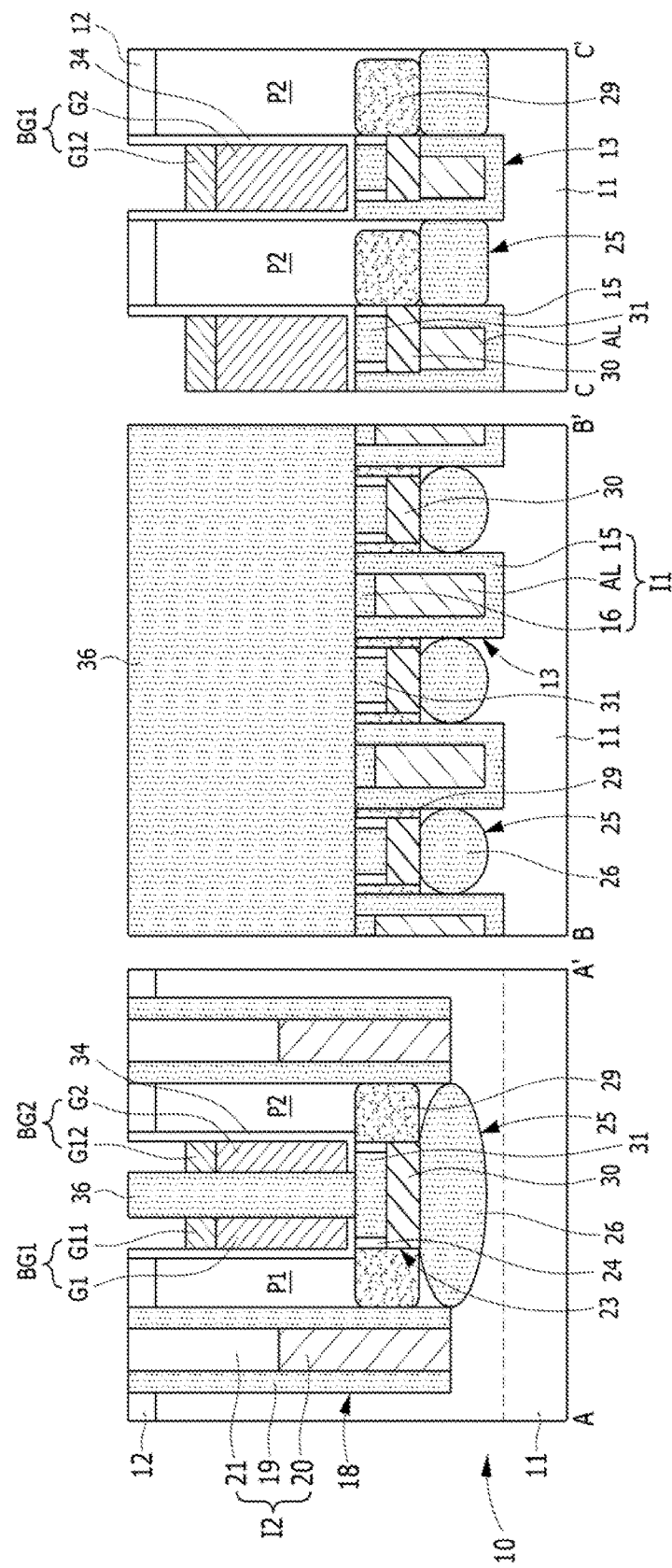

As shown in FIGS. 7G and 8G, upper gate electrodes G11 and G12 may be formed. The upper gate electrodes G11 and G12 may fill the upper portions of the lower gate electrodes G1 and G2, respectively. The upper gate electrodes G11 and G12 may have a recessed surface lower than the top surface of the first gate capping layer 36. For this, a second gate conductive layer (not shown) may be filled and then an etch-back process may be performed. The upper gate electrodes G11 and G12 may include a low resistivity material. The upper gate electrodes G11 and G12 may be formed of a low work function material to improve gate-induced drain leakage. Moreover, an intermediate barrier may be further formed to prevent a reaction between the lower gate electrodes G1 and G2 and the upper gate electrodes G11 and G12.

According to above description, gate electrodes BG1 and BG2 may include the low gate electrodes G1 and G2 and the upper gate electrodes G11 and G12.

The gate electrodes BG1 and BG2 may be a structure symmetrical to each other. The gate electrodes BG1 and BG2 may include a first electrode E1 extending in the second direction $\hat{2}$, and a second electrode E2 and a third electrode E3 extending in the first direction $\hat{1}$ crossing with the second direction $\hat{2}$ and stemming from the first electrode E1, respectively. The first electrode E1, the second electrode E2 and the third electrode E3 may be embedded in the first trench T1, the second trench T2 and the third trench T3, respectively.

The first, second and third electrodes E1, E2 and E3 may overlap with at least three side surfaces of the first and second pillars P1 and P2. The fourth side surfaces S4 of the first and second pillars P1 and P2 may not overlap with the gate electrodes BG1 and BG2.

Figure 7H:
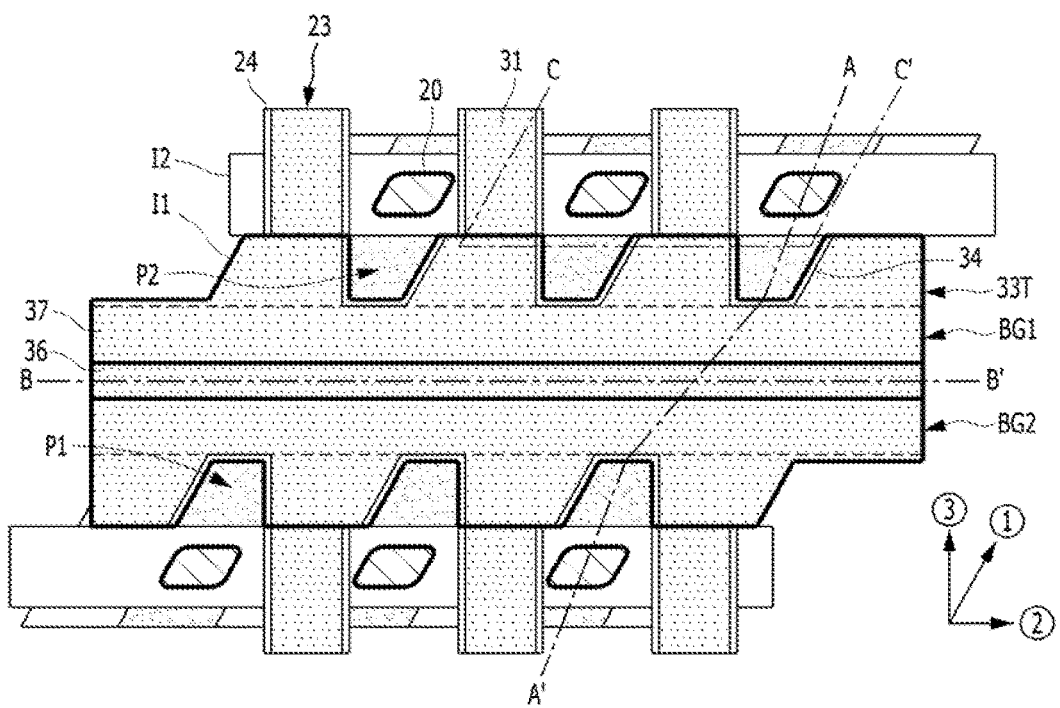
Figure 8H:
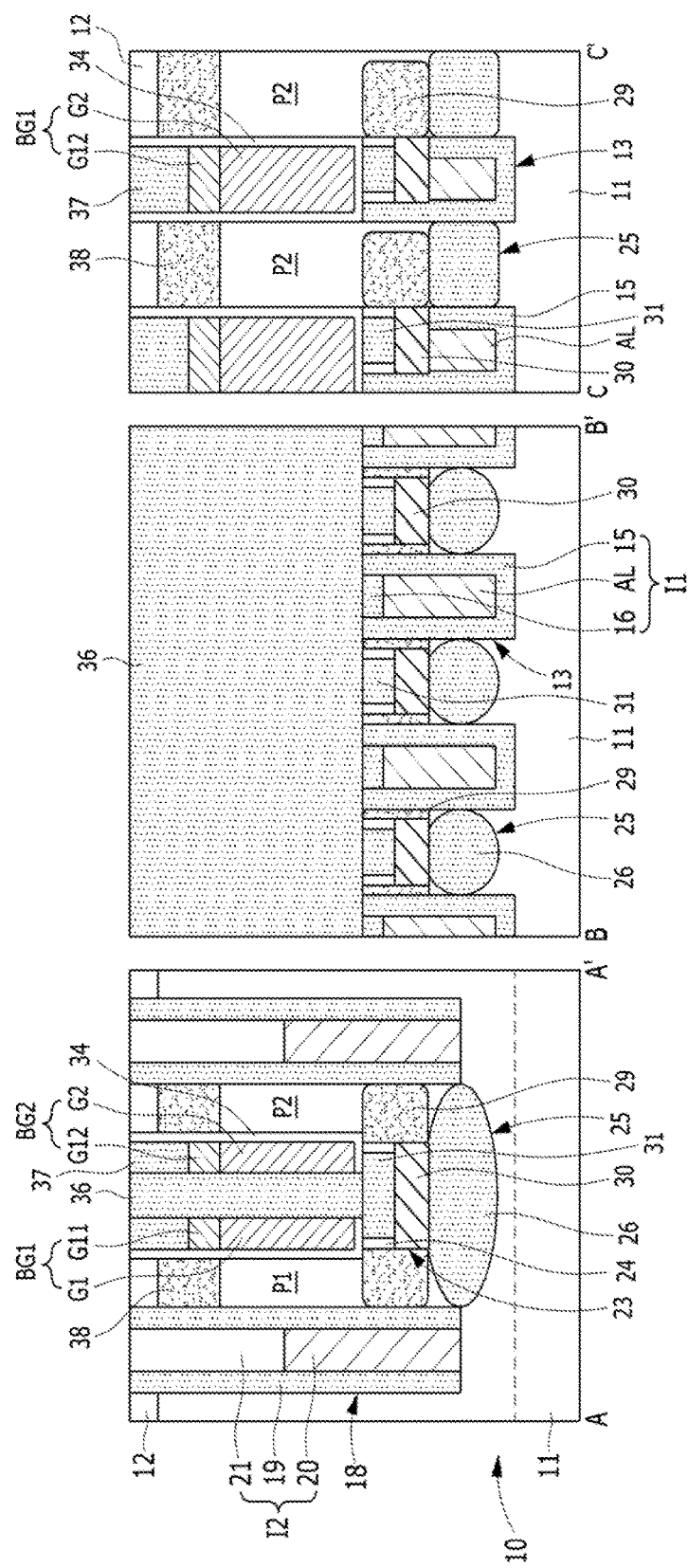

As shown in FIGS. 7H and 8H, a second gate capping layer 37 may be formed. The second gate capping layer 37 may include a dielectric material. The second gate capping layer 37 may fill the upper portion of the upper gate electrodes G11 and G12. The second gate capping layer 37 may include silicon oxide. Subsequently, the second gate capping layer 37 may be planarized such that the top surface of the first hard mask layer 12 is exposed.

After forming the second gate capping layer 37, an impurity doping process may be performed by implantation or another doping techniques. Thus, a second junction region 38 may be formed in the first and second pillars P1 and P2. When performing the impurity doping process, the first and second gate capping layers 36 and 37 may be used as a barrier. The second junction region 38 may become either a source region or a drain region. A vertical channel may be defined between the first junction region 29 and the second junction region 38.

As above, the first gate electrode BG1, the first junction region 29 and the second junction region 38 may compose a first transistor Tr1. The second gate electrode BG2, the first junction region 29 and the second junction region 38 may compose a second transistor Tr2.

Although it is not shown, a memory element may be electrically coupled to the second junction region 38.

In another embodiment, the second junction region 38 may be formed by an impurity doping process after forming a contact hole. Here, the contact hole may expose the top surfaces of the first and second pillars P1 and P2.

Hereinafter, a semiconductor device and a method for manufacturing the same in accordance with a second embodiment will be described.

Figure 9:
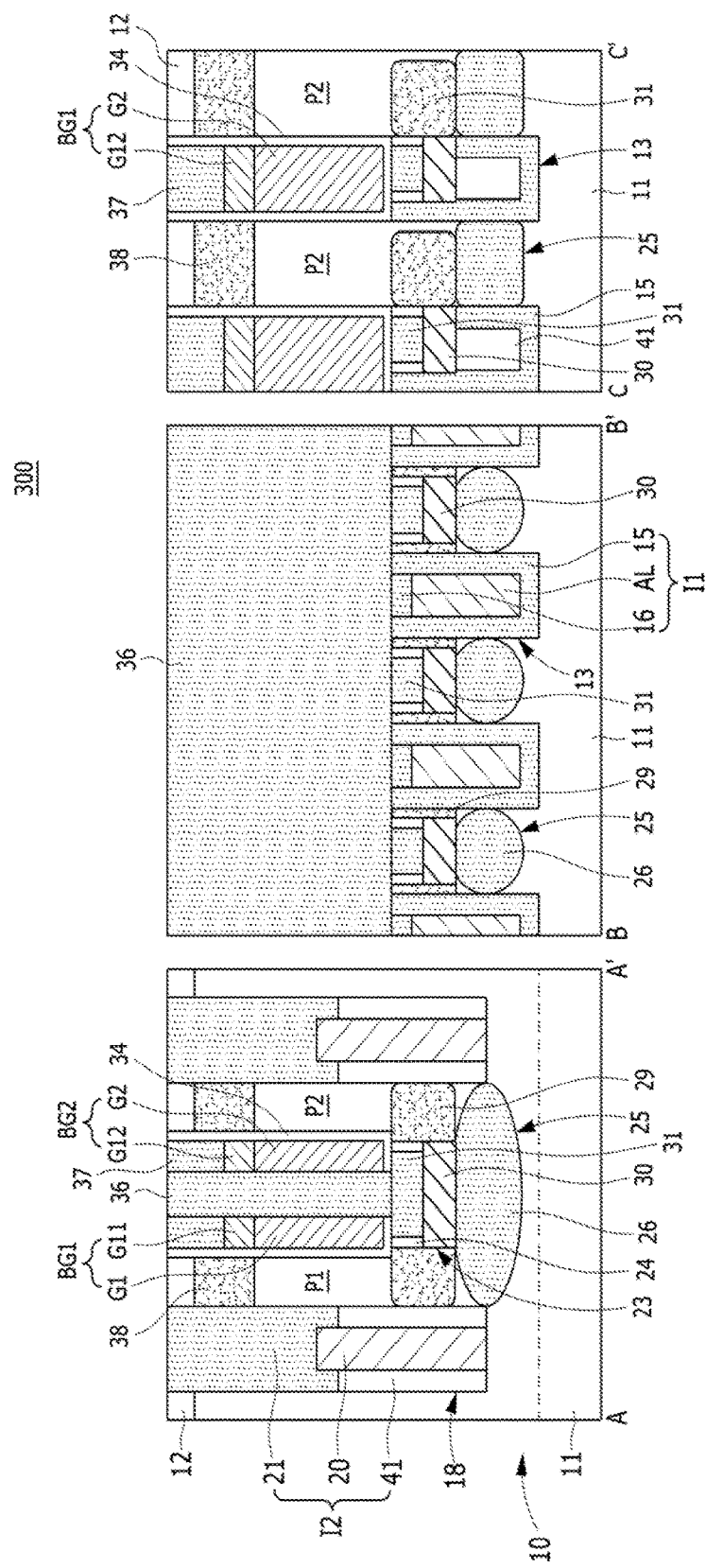
FIG. 9 is a view illustrating a semiconductor device in accordance with a second embodiment

FIG. 9 is a view illustrating a semiconductor device in accordance with the second embodiment. A semiconductor device 300 in accordance with the second embodiment may be the same as the first embodiment except for a second device isolation region I2.

Referring to FIG. 9, an air gap 41 may be embedded in a second device isolation region I2. The air gap 41 may be formed between a shield pillar 20 and a second isolation trench 18. Therefore, the second device isolation region I2 may include the shield pillar 20, the air gap 41 and a second isolation dielectric layer 21. The air gap 41 may be capped by the second isolation dielectric layer 21.

Parasitic capacitance between neighboring buried bit lines 30 may be reduced by the air gap 41. Moreover, PG effect may be further suppressed.

Figure 10A:
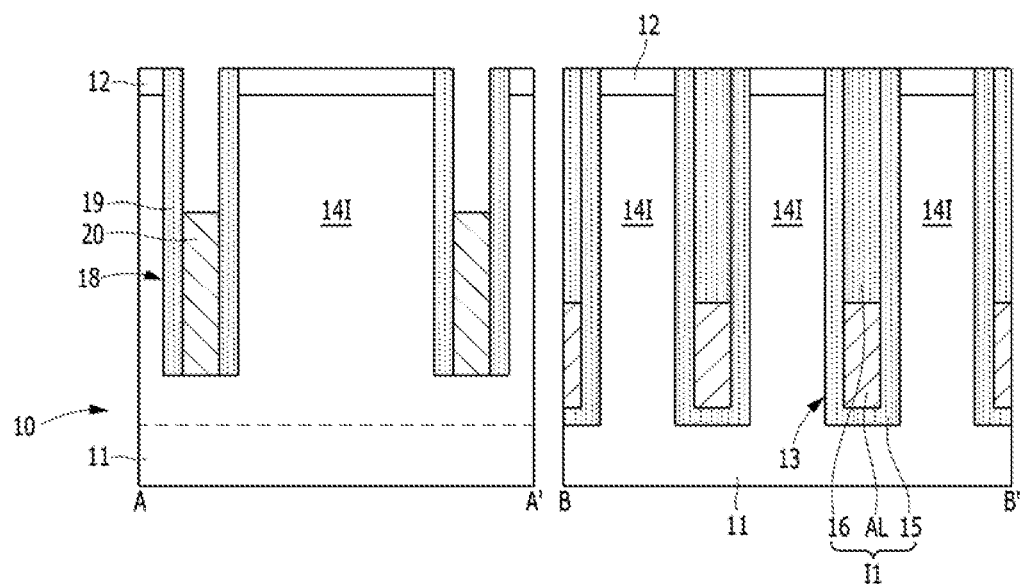
FIGS. 10A to 10C are views illustrating an example of a method for manufacturing the semiconductor in accordance with the second embodiment.
Figure 10B:
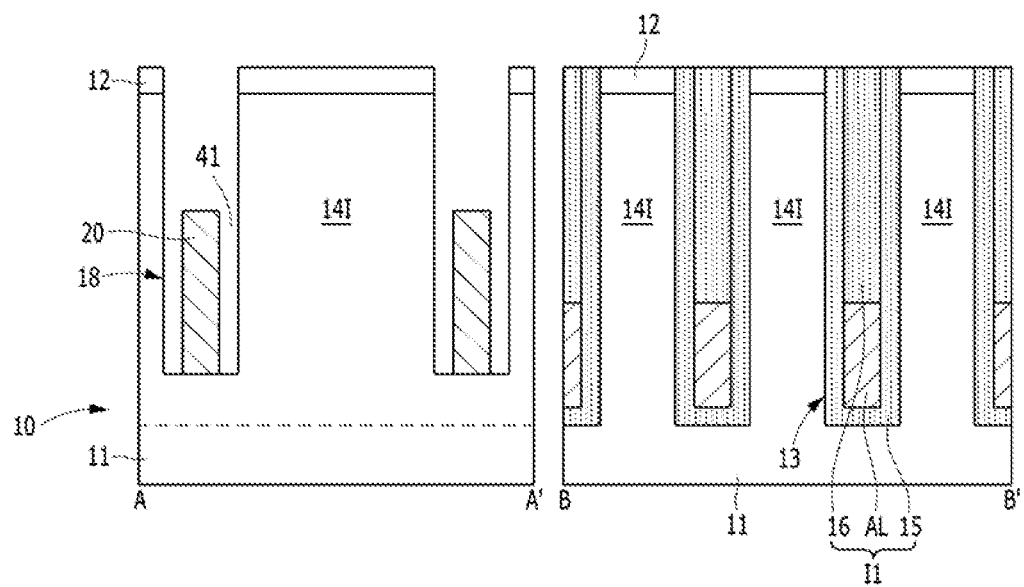
Figure 10C:
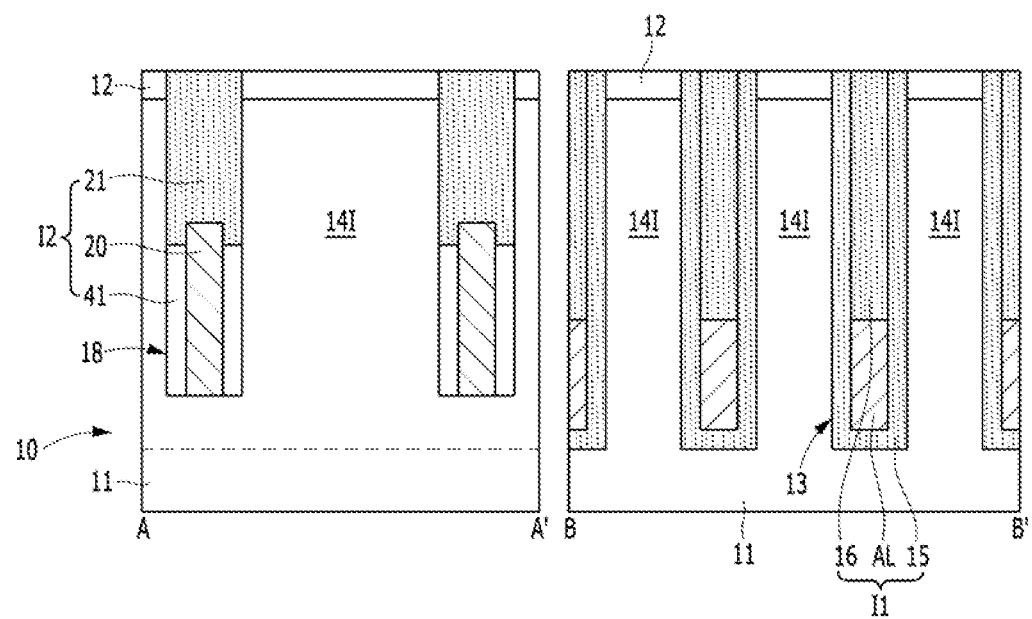

FIGS. 10A to 10C are cross-sectional views illustrating an example of a method for manufacturing the semiconductor in accordance with the second embodiment. In the second embodiment, the method may be the same as or similar to the first embodiment except for a second device isolation region I2 having an embedded air gap 41.

As shown in FIG. 10A, a spacer 19 may be formed on the sidewalls of a second isolation trench 18. In order to form the spacer 19, a dielectric material may be deposited followed by an etch-back process. The spacer 19 may be formed of a material having etch selectivity with respect to a substrate 10. The spacer 19 may include silicon oxide.

The bottom surface of the second isolation trench 18 may be exposed by the spacer 19.

A shield pillar 20 may be formed. The shield pillar 20 may be formed by selectively etching a shield layer (20A in FIG. 4F). For example, the shield layer 20A may be etched by an etch-back process. Thus, the shield pillar 20 may be formed in the second isolation trench 18. The shield pillar 20 may be independently positioned between the major axes of an active region 14I. That is, neighboring shield pillar 20 may be formed separately from each other. The shield pillar 20 may be recessed such that the top surface thereof is lower than that of the active region 14I. The spacer 19 may be positioned between the sidewalls of the shield pillar 20 and the sidewalls of the second isolation trench 18. The bottom of the shield pillar 20 may contact the substrate 10.

As shown in FIG. 10B, the spacer 19 may be selectively removed. The spacer 19 may be removed by wet etching. Thus, an air gap 41 may be formed.

As shown in FIG. 10C, a second isolation dielectric layer 21 may be formed. The second isolation dielectric layer 21 may be formed of silicon oxide. The second isolation dielectric layer 21 may fill the upper portion of the shield pillar 20. Subsequently, the second isolation dielectric layer 21 may be planarized. Thus, the second isolation dielectric layer 21 may remain to fill the recessed region on the shield pillar 20. The planarized surface of the second isolation dielectric layer 21 may be at the same level as the top surface of the first hard mask layer 12. The air gap 41 may be capped by the second isolation dielectric layer 21.

As above, a second device isolation region I2 may be formed by forming the second isolation dielectric layer 21. The second device isolation region I2 may include the shield pillar 20, the air gap 41 and the second isolation dielectric layer 21. The second device isolation region I2 may be embedded in the second isolation trench 18. The second device isolation region I2 may have the embedded shield pillar 20 and the embedded air gap 41.

Hereinafter, a semiconductor device and a method for manufacturing the same in accordance with a third embodiment will be described.

Figure 11:
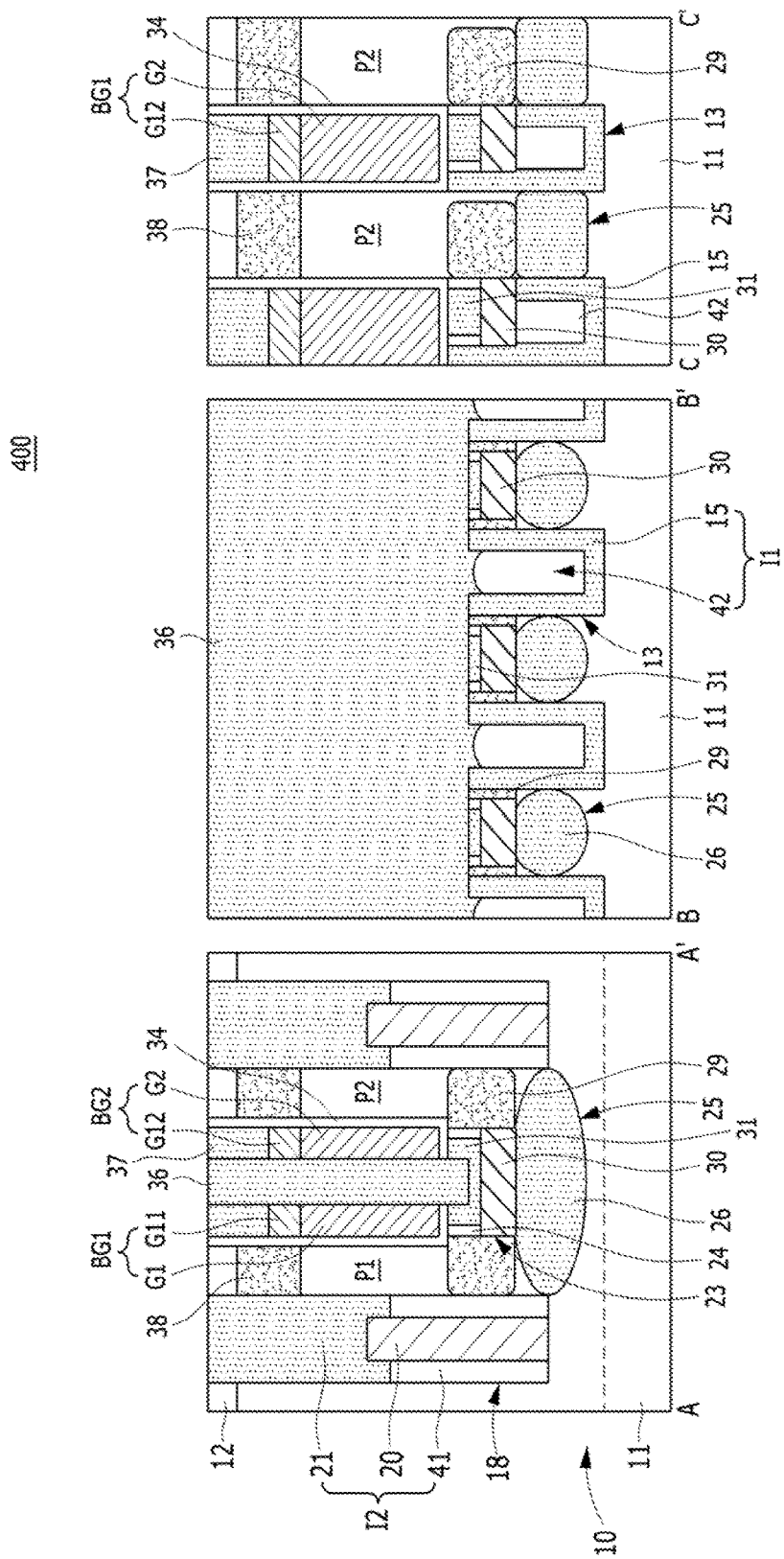
FIG. 11 is a view illustrating a semiconductor device in accordance with a third embodiment.

FIG. 11 is a view illustrating a semiconductor device in accordance with a third embodiment. A semiconductor device 400 in accordance with a third embodiment may be the same as the second embodiment except for a first device isolation region I1.

Referring to FIG. 11, a first air gap 42 may be embedded in the first device isolation region I1. The first air gap 42 may be formed in the first isolation trench 13. Therefore, the first device isolation region I1 may include the first air gap 42 and a first liner 15. The first air gap 42 may be capped by the first gate capping layer 36.

A second air gap 41 may be embedded in the second device isolation region I2. The second air gap 41 may be formed in the space between a shield pillar 20 and a second isolation trench 18. Therefore, the second device isolation region I2 may include the shield pillar 20, the second air gap 41 and a second isolation dielectric layer 21. The second air gap 41 may be capped by the second isolation dielectric layer 21.

Parasitic capacitance between neighboring buried bit lines 30 may be reduced by the first air gap 42 and the second air gap 41. Moreover, PG effect may be increased.

FIGS. 12A to 12D are views illustrating an example of a method for manufacturing the semiconductor in accordance with the third embodiment. In the third embodiment, the method may be the same as or similar to the first and second embodiments except for a first device isolation region I1 having an embedded first air gap 42. For example, the first air gap 42 may be formed between a process for forming pillars P1 and P2 and a process for forming gate electrodes BG1 and BG2.

Figure 12A:
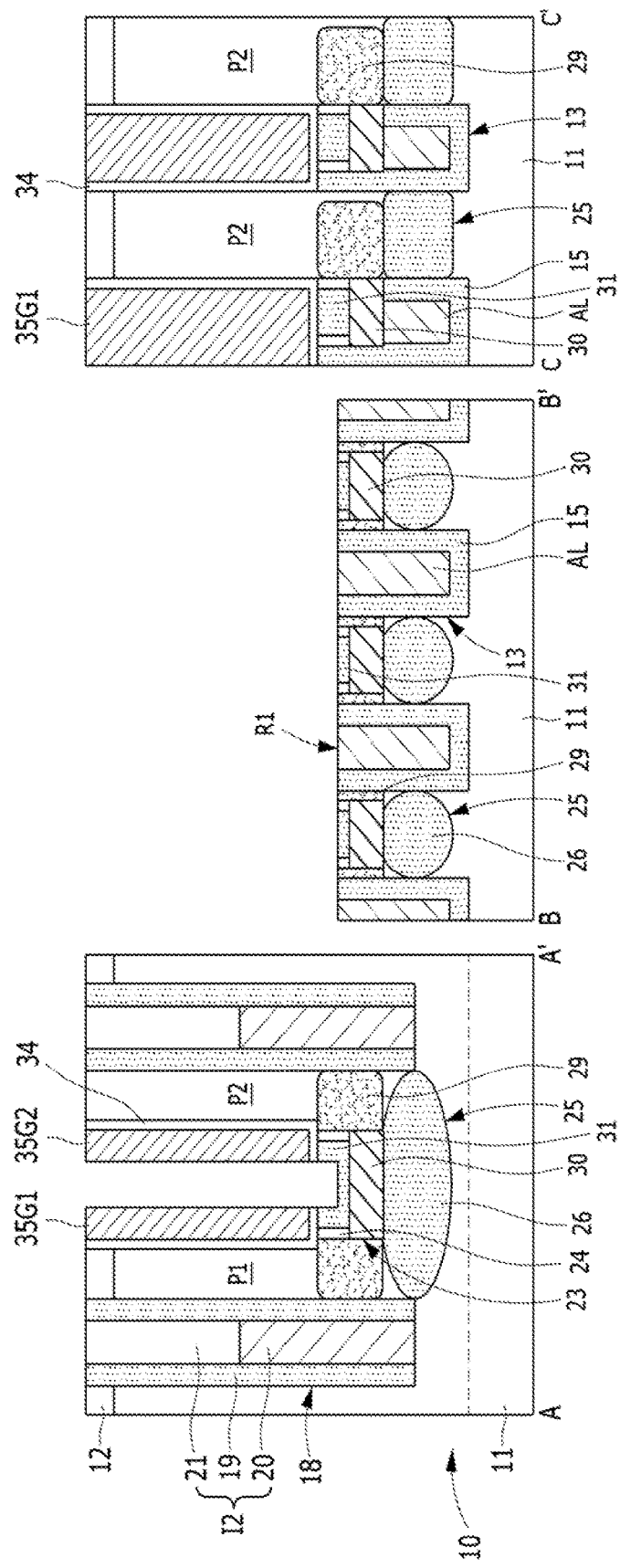
FIGS. 12A to 12D are views illustrating an example of a method for manufacturing the semiconductor in accordance with the third embodiment.

As shown in FIG. 12A, after forming the pillars P1 and P2, a gate dielectric layer 34 may be formed.

Then, a dry etch process may be performed such that preliminary lower gate electrodes 35G1 and 35G2 remain on the sidewalls of a gate trench 33T. For example, it may be performed by an etch-back process. The preliminary lower gate electrodes 35G1 and 35G2 may be formed by performing an etch-back process of a gate conductive layer 35A. The etch-back process of the first gate conductive layer 35A may be sufficiently performed to expose a dielectric pillar AL (see, reference number R1). Here, the dielectric pillar AL may be exposed without attacking a buried bit line 30. That is, the dielectric pillar AL may be exposed by removing a first isolation dielectric layer 16.

Figure 12B:
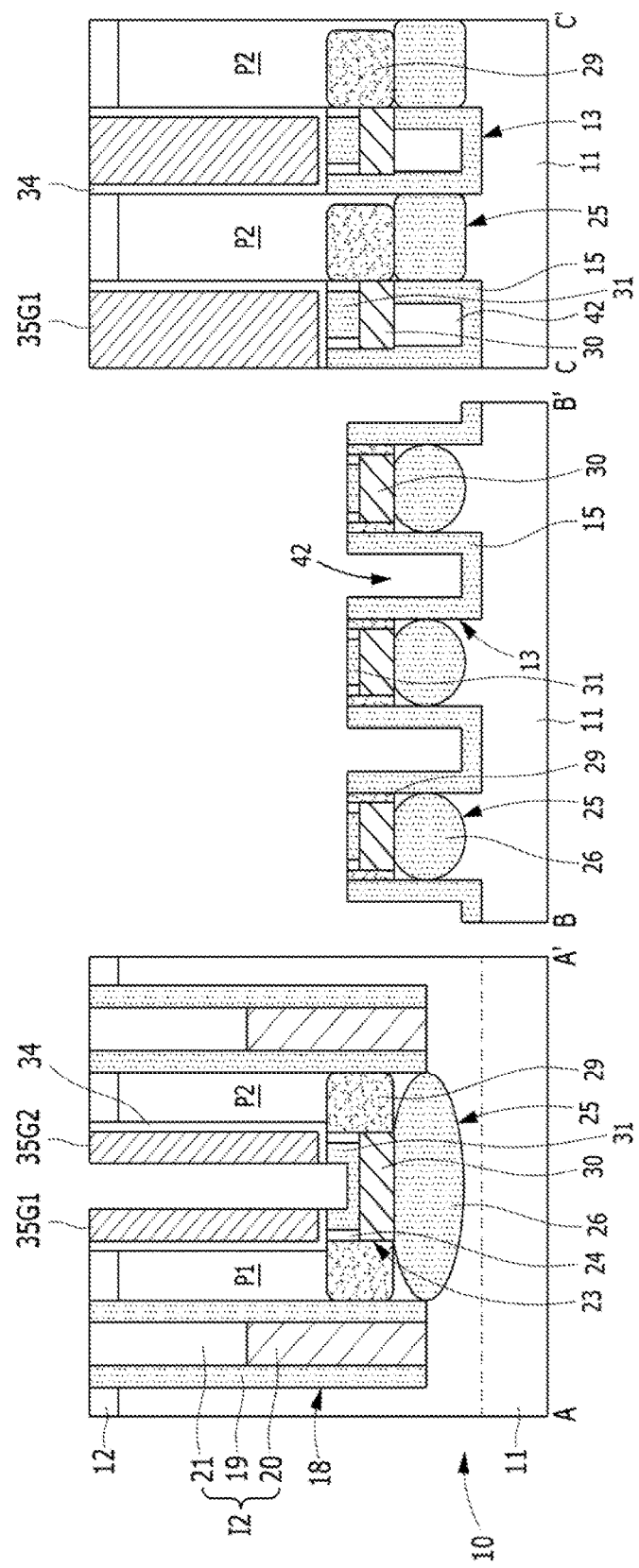

As shown in FIG. 12B, the dielectric pillar AL may be selectively removed. Thus, the first air gap 42 may be formed. When forming the first air gap 42, a first liner 15 may not be removed.

Figure 12C:
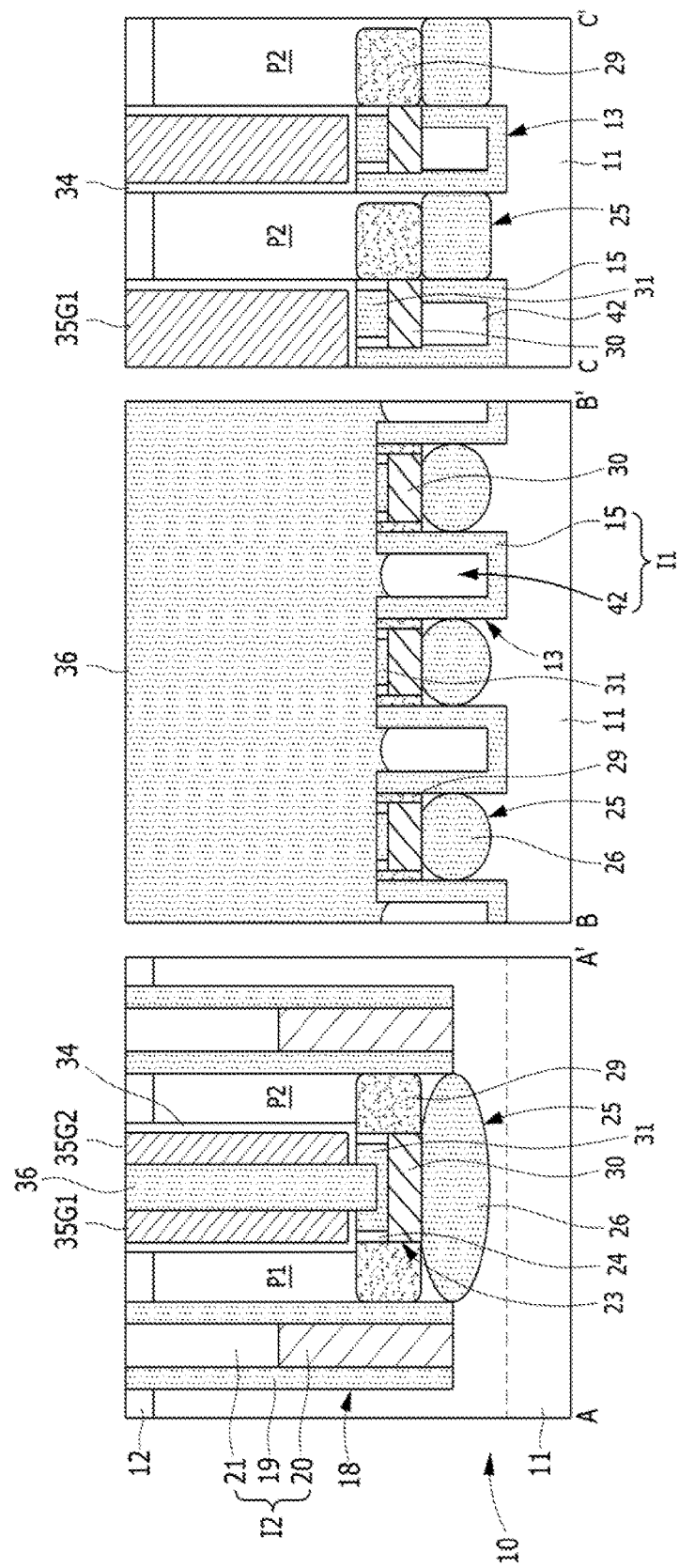

As shown in FIG. 12C, a first gate capping layer 36 may be formed. The first gate capping layer 36 may include a dielectric material. The first gate capping layer 36 may fill the space between the preliminary lower gate electrodes 35G1 and 35G2. The first gate capping layer 36 may include silicon nitride. Subsequently, the first gate capping layer 36 may be planarized such that the top surface of a first hard mask layer 12 is exposed.

During forming the first gate capping layer 36, the top of the first air gap 42 may be capped. That is, the top of the first air gap 42 may be closed by the first gate capping layer 36. In another embodiment, when initially forming the first gate capping layer 36, the first gate capping layer 36 may be thinly formed on the surface of the first liner 15. During continuously forming the first gate capping layer 36, the top of the first air gap 42 may be closed.

As above, the first air gap 42 may be embedded in the first device isolation region I1.

Figure 12D:
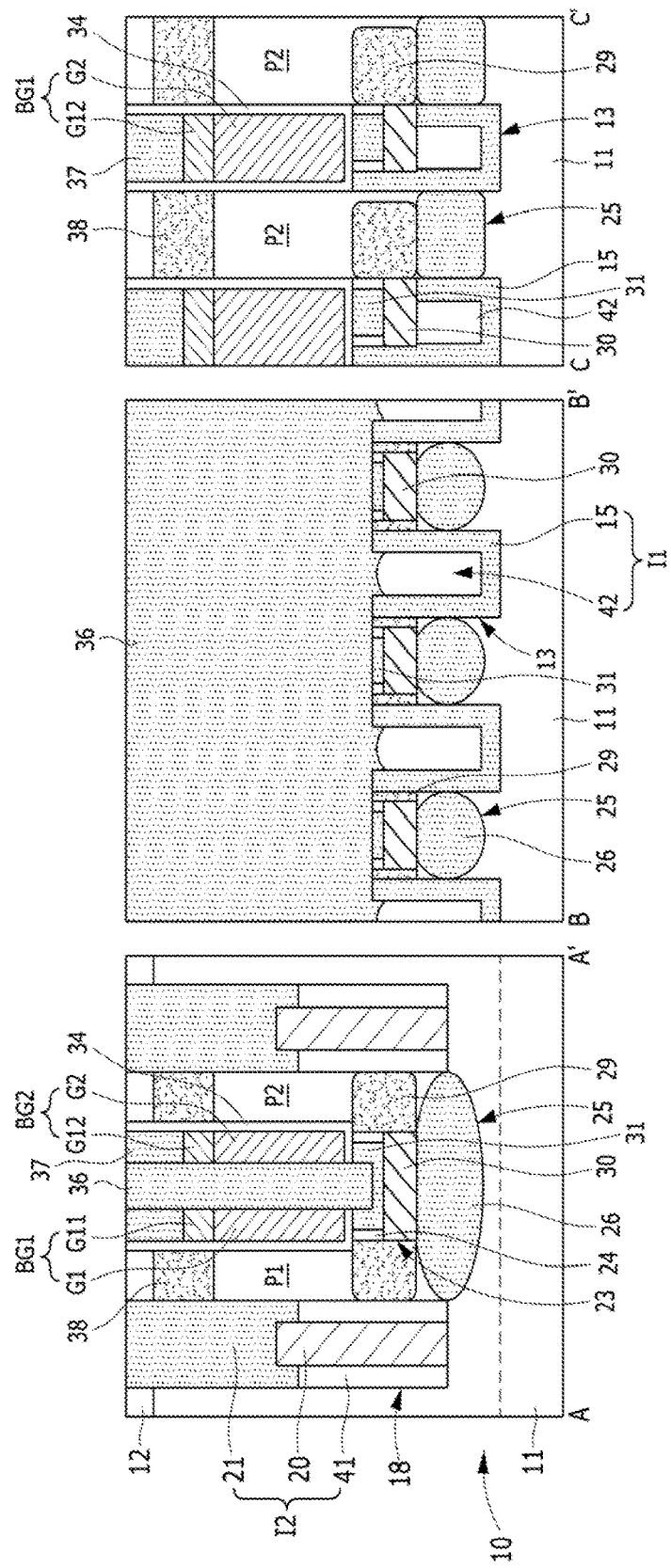

As shown in FIG. 12D, subsequently gate electrodes G1 and G2, a second gate capping layer 37 and a second junction region 38 may be formed according to the method illustrated in FIGS. 8F to 8H.

According to the third embodiment, the first air gap 42 may be positioned between the minor axes of the island type active region 14I. Thus, parasitic capacitance between the minor axes of the island type active region 14I may be reduced.

In accordance with the third embodiment, the second air gap 41 may be positioned between the major axes of the island type active region 141, and the first air gap 40 may be positioned between the minor axes of the island type active region 14I. Thus, parasitic capacitance between neighboring bit lines 30 may be reduces to improve speed of the semiconductor device. Moreover, PG effect may be further suppressed.

According to the embodiments, a shield pillar embedded in a device isolation region may be formed to suppress passing gate effect. Moreover, according to the embodiments, threshold voltage may be controlled by the shield pillar. Further, according to the embodiments, parasitic capacitance may be reduced by forming the air gap.

Figure 13:
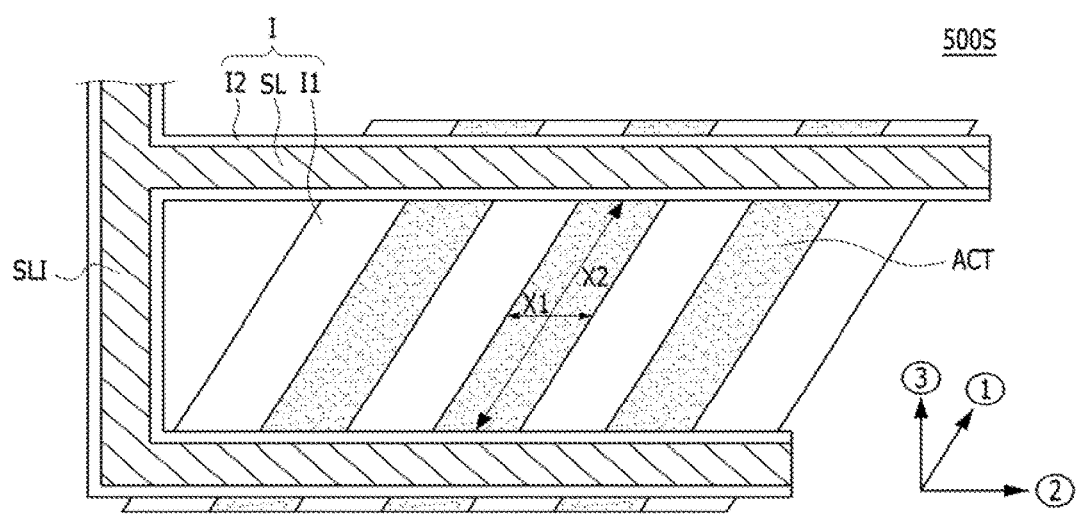
FIG. 13 is a plan view of a semiconductor device in accordance with a fourth embodiment.

FIG. 13 is a plan view of a semiconductor device in accordance with a fourth embodiment. Referring to FIG. 13, the semiconductor device 500S may include a plurality of active regions ACT and a device isolation region I. The device isolation region I may include a first device isolation region I1 and a second device isolation region I2. The plurality of active regions ACT may be defined by the first device isolation region I1 and the second device isolation region I2.

The active region ACT may be formed in an island shape. The active region ACT may extend in a first direction $\hat{1}$. The plurality of active regions ACT may be arrayed in a second direction $\hat{2}$, with the first device isolation region I1 interposed therebetween. The plurality of active regions ACT may be arrayed with the same interval and with the same size as each other. The active region ACT may have a minor axis X1 and a major axis X2. The second device isolation region I2 may be positioned between the major axes X2 of the neighboring active regions ACT. The first device isolation region I1 may be positioned between the minor axes X1 of the neighboring active regions ACT.

The first device isolation region I1 may extend in the first direction $\hat{1}$, and the second device isolation region I2 may extend in the second direction $\hat{2}$ crossing the first direction $\hat{1}$. The first device isolation region I1 may be discontinuous by the second device isolation region I2. The first device isolation region I1 and the second device isolation region I2 may be STI regions formed by trench etching.

The first device isolation region I1 and the second device isolation region I2 may be formed of the same material as each other or different materials from each other. For example, the first device isolation region I1 and the second device isolation region I2 may be formed of silicon oxide, silicon nitride or a combination thereof. The second device isolation region I2 may have a shielding line SL embedded therein. The shielding line SL may be formed of a silicon-containing material. The shielding line SL may include a polysilicon layer. The shielding line SL may be doped with an impurity. The shielding line SL may include a boron-doped polysilicon layer.

The neighboring shielding lines SL may be connected to each other through a shielding line interconnection SLI. The shielding line interconnection SLI may be extended in a third direction $\hat{3}$, and connected to the respective ends of the shielding lines SL. The shielding line interconnection SLI may be arranged at the edge region. The shielding line interconnection SLI may be formed of the same material as the shielding line SL.

Referring to FIG. 13, the second device isolation region I2 having the shielding line SL embedded therein may be positioned between the major axes X2 of the active region ACT. The active region ACT may include various semiconductor devices formed therein.

Figure 14A:
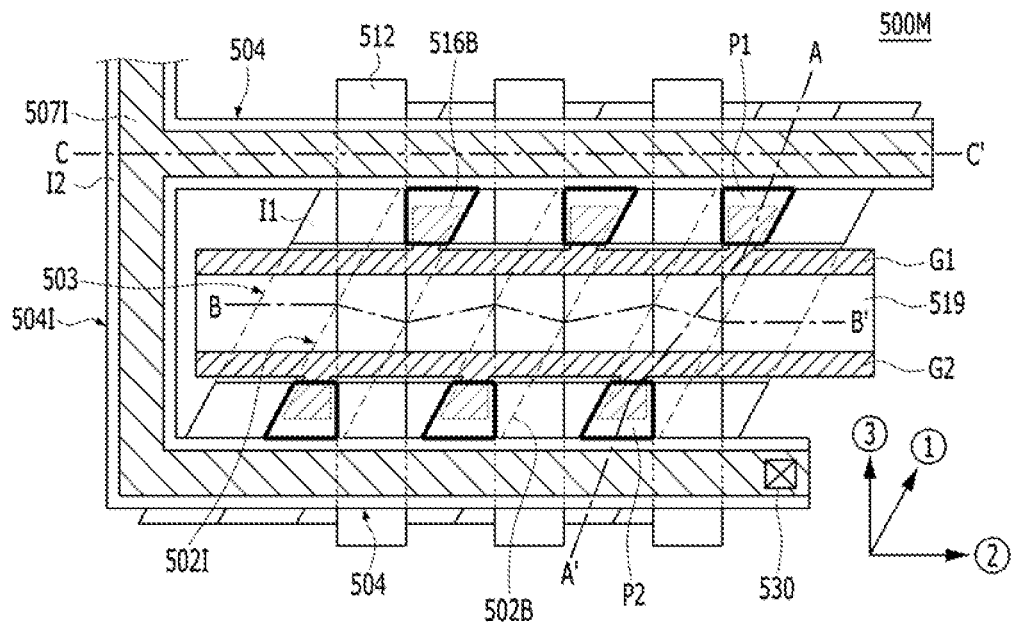
FIG. 14A is a plan view of the semiconductor device to which the fourth embodiment is applied.
Figure 14B:
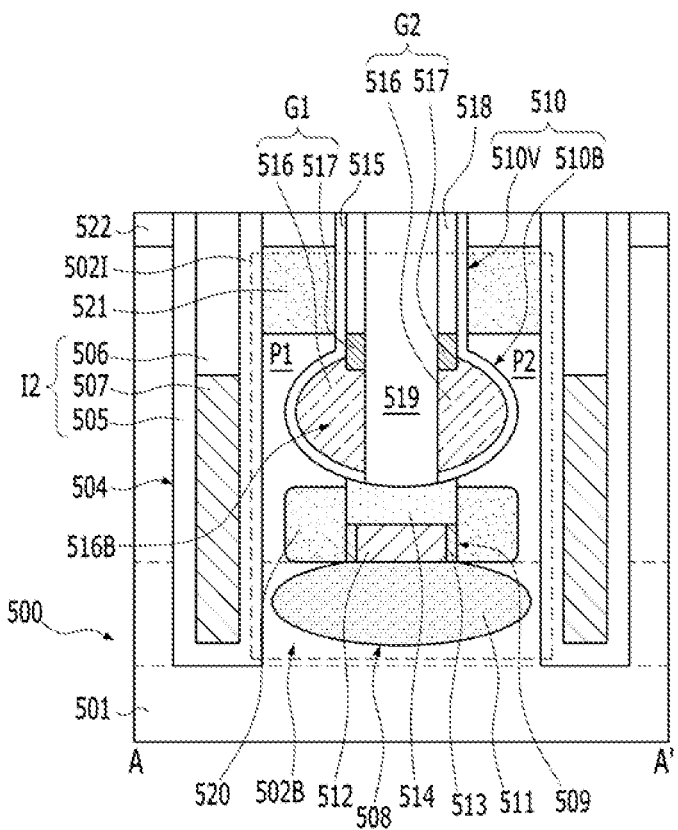
FIG. 14B is a cross-sectional view taken along the line A-A' of FIG. 14A.
Figure 14C:
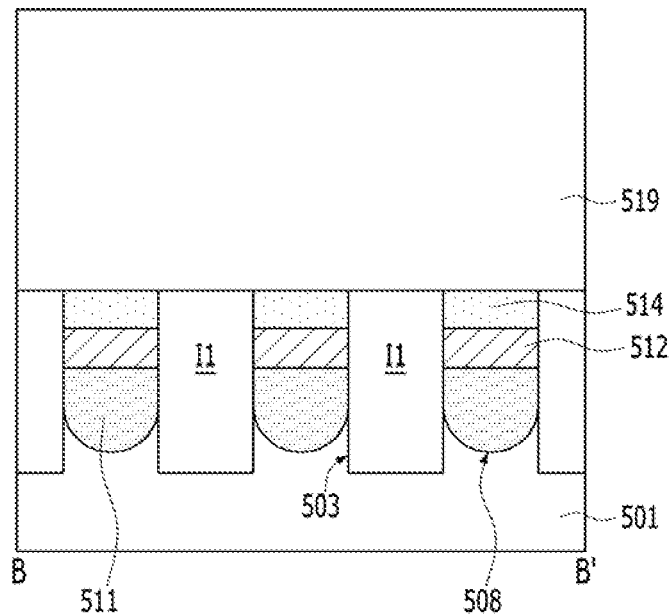
FIG. 14C is a cross-sectional view taken along the line B-B' of FIG. 14A.
Figure 14D:
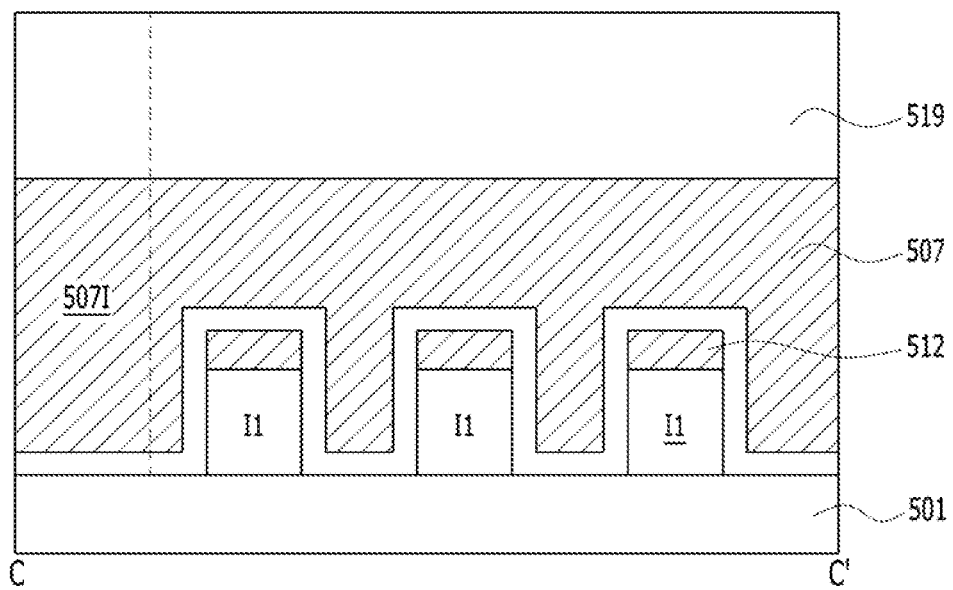
FIG. 14D is a cross-sectional view taken along the line C-C' of FIG. 14A.

FIG. 14A is a plan view of the semiconductor device to which the fourth embodiment is applied. FIG. 14B is a cross-sectional view taken along the line A-A' of FIG. 14A. FIG. 14C is a cross-sectional view taken along the line B-B' of FIG. 14A. FIG. 14D is a cross-sectional view taken along the line C-C' of FIG. 14A.

The semiconductor device 500M may include memory cells. The semiconductor device 500M may include an active region 502I, a first device isolation region I1, and a second device isolation region I2.

The active region 502I, the first device isolation region I1 and the second device isolation region I2 may be formed in a substrate 500. The substrate 500 may include a semiconductor substrate. The substrate 500 may be formed of a silicon-containing material. The substrate 500 may include silicon, monocrystalline silicon, polysilicon, amorphous silicon, silicon germanium, monocrystalline silicon germanium, polycrystalline silicon germanium, carbon-doped silicon, combinations thereof or multi-layers thereof. The substrate 500 may include another semiconductor material such as germanium. The substrate 500 may include III/V group semiconductor substrate, for example, a compound semiconductor substrate such as GaAs. The substrate 500 may include an SOI (Silicon On Insulator) substrate. A part of the substrate 500 under the active region 502I may become a bulk portion 501.

The active region 502I may be formed in an island shape. The active region 502I may include a body portion 502B, a first pillar P1 and a second pillar P2. The first pillar P1 and the second pillar P2 may form a pair while being symmetrical with each other. Parts of the first and second pillars P1 and P2 may be connected to the bulk portion 501 of the substrate 500 through the body portion 502B. That is, each of the first and second pillars P1 and P2 may have a body-tied structure.

The first device isolation region I1 may be formed in a first isolation trench 503. The second device isolation region I2 may be formed in a second isolation trench 504. The first device isolation region I1 may be filled with a dielectric material. The second device isolation region I2 may include a liner 505 and an isolation dielectric layer 506, and further include a shielding line 507 between the liner 505 and the isolation dielectric layer 506. That is, the shielding line 507 may be embedded in the second device isolation region I2. The liner 505 may be formed on both sidewalls and the bottom surface of the second isolation trench 504, and the isolation dielectric layer 506 may be positioned over the shielding line 507. The liner 505 may include silicon oxide. The isolation dielectric layer 506 may include silicon oxide, silicon nitride or a combination thereof.

The shielding line 507 may be formed of a silicon-containing material. The shielding line 507 may include a polysilicon layer. The shielding line 507 may be doped with an impurity. The shielding line 507 may include a boron-doped polysilicon layer. The shielding line 507 may be positioned between the major axes X2 of the active regions 502I. The top surface of the shielding line 507 may be recessed to a lower level than the top surface of the active region 502I. The first device isolation region I1 may be formed of the same dielectric material as the isolation dielectric layer 506.

The neighboring shielding lines 507 may be connected to each other through a shielding line interconnection 507I. The shielding line interconnection 507I may be extended in the third direction $\hat{3}$, and connected to the respective ends of the shielding lines 507. The shielding line interconnection 507I may be arranged at the edge region. The shielding line interconnection 507I may be formed of the same material as the shielding line 507. The shielding line interconnection 507I may be formed in a connection trench 504I. The connection trench 504I may connect one ends of the second isolation trenches 504 to each other. The shielding line interconnection 507I may be connected to a contact 530.

The active region 502I may further include a plurality of trenches. The trenches may include a body trench 508, a bit line trench 509 and a gate trench 510. The bit line trench 509 may be formed over the body trench 508, and the gate trench 510 may be formed over the bit line trench 509. The body trench 508 and the gate trench 510 may be formed in a bulb shape, and the bit line trench 509 may have vertical sidewalls.

The body trench 508 may be formed in the body portion 502B of the active region 502I. Both ends of the body trench 508 may not contact the second device isolation region I2. The height and width of the first and second pillars P1 and P2 may be determined by the bit line trench 509 and the gate trench 510. The bit line trench 509 may extend in the third direction $\hat{3}$. The third direction $\hat{3}$ may cross the first direction $\hat{1}$ and the second direction $\hat{2}$.

The gate trench 510 may extend in the second direction $\hat{2}$. The second direction $\hat{2}$ may cross the first direction $\hat{1}$ and the third direction $\hat{3}$. The body trench 508 may extend in the first direction $\hat{1}$, and the extension length of the body trench 508 may be equal to or less than the active region 502I.

The first and second pillars P1 and P2 may be isolated from each other by the gate trench 510 and the bit line trench 509. For example, each of the first and second pillars P1 and P2 may include a bottom portion, a center portion and a top portion. The height of the bottom portions of the first and second pillars P1 and P2 may be determined by the bit line trench 509. The height of the center portions of the first and second pillars P1 and P2 may be determined by a bulb-shaped trench 510B of the gate trench 510. The height of the top portions of the first and second pillars P1 and P2 may be determined by a vertical trench 510V of the gate trench 510.

The body trench 508 may have a punch-through preventing layer 511 formed therein. The punch-through preventing layer 511 may be formed of a dielectric material. The punch-through preventing layer 511 may prevent a punch between the neighboring buried bit lines 512. The buried bit line 512 may float from the bulk portion 501 of the substrate 500 by the punch-through preventing layer 511, The buried bit line 512 may be embedded in the bit line trench 509. A bit line capping layer 514 may be formed over the buried bit line 512. The buried bit line 512 may include a low resistance metal. The buried bit line 512 may include tungsten. The bit line capping layer 514 may include a dielectric material. The bit line capping layer 514 may include silicon oxide, silicon nitride or a combination thereof. The bit line capping layer 514 may cover the top surface of the buried bit line 512. Thus, the buried bit line 512 may be referred to as an embedded buried bit line in the substrate 500. Under the buried bit line 512, the punch-through preventing layer 511 may be positioned.

The gate trench 510 may correspond to the space between the first and second pillars P1 and P2. The gate trench 510 may include the bulb-shaped trench 510B and the vertical trench 510V. The bulb-shaped trench 510B may be formed in the middle of the first and second pillars P1 and P2. The vertical trench 510V may be formed over the bulb-shaped trench 510B. The bulb-shaped trench 510B may have a larger width than the vertical trench 510V.

A gate dielectric layer 515 may be formed on the gate trench 510. That is, the gate dielectric layer 515 may cover the gate trench 510. Furthermore, the gate dielectric layer 515 may cover the sidewalls of the first and second pillars P1 and P2. The gate dielectric layer 515 may include silicon oxide, silicon nitride, silicon oxynitride, a high-k material or combinations thereof.

The high-k material may include a material having a higher dielectric constant than silicon oxide. For example, the high-k material may include a material having a higher dielectric constant than 3.9. For another example, the high-k material may include a material having a higher dielectric constant than 10. For another example, the high-k material may include a material having a dielectric constant of 10 to 30. The high-k material may include at least one metallic element. The high-k material may include a hafnium-containing material. The hafnium-containing material may include hafnium oxide, hafnium silicon oxide, hafnium silicon oxynitride or combinations thereof. In another embodiment, the high-k material may include lanthanum oxide, lanthanum aluminum oxide, zirconium oxide, zirconium silicon oxide, zirconium silicon oxynitride, aluminum oxide and combinations thereof. As for the high-k material, any known high-k material may be selectively used.

In the gate trench 510, a pair of gate electrodes G1 and G2 may be embedded. The first gate electrode G1 may overlap a side surface of the first pillar P1, and the second gate electrode G2 may overlap a side surface of the second pillar P2. The first and second gate electrodes G1 and G2 may be isolated from each other. Each of the first and second gate electrodes G1 and G2 may include a first electrode portion 516 and a second electrode portion 517. The second electrode portion 517 may be vertically stacked over the first electrode portion 516. The first electrode portion 516 may overlap the bulb-shaped trench 510B of the gate trench 510. A part of the second electrode portion 517 may overlap the vertical trench 510V of the gate trench 510.

The first electrode portion 516 may include a low resistance metal. The first electrode portion 516 may include tungsten. The second electrode portion 517 may include polysilicon. The second electrode portion 517 may include polysilicon doped with an N-type impurity. The first electrode portion 516 may include a bulb-shaped portion 516B. That is, the bulb-shaped portion 516B of the first electrode portion 516 may fill the bulb-shaped trench 510B of the gate trench 510.

The second electrode portion 517 may overlap lower sidewall of the vertical trench 510V. In another embodiment, a part of the electrode portion 517 may be extended to fill the top portion of the bulb-shaped trench 510B. In another embodiment, each of the first and second gate electrodes G1 and G2 may have a single structure which is formed of a metallic material. For example, the first and second gate electrodes G1 and G2 may include titanium nitride.

Between the first and second gate electrodes G1 and G2, a gate capping layer 519 may be formed. Over the first and second gate electrodes G1 and G2, a gate spacer 518 may be formed. The gate spacer 518 may be positioned over the second electrode portion 517. The gate capping layer 519 and the gate spacer 518 may include a dielectric material.

The first and second gate electrodes G1 and G2 may overlap the side surfaces of the first and second pillars P1 and P2. The top surfaces of the first and second gate electrodes G1 and G2 may be positioned at a lower level than the top surfaces of the first and second pillars P1 and P2. The top surface of the gate capping layer 519 may be positioned at the same level as the top surfaces of the first and second pillars P1 and P2. Since the first and second gate electrodes G1 and G2 are positioned in the gate trench 510, the first and second gate electrodes G1 and G2 may be referred to as being buried in the gate trench 510. Thus, the first and second gate electrodes G1 and G2 may be referred to as buried gate electrodes. The semiconductor device 500M may be applied to a memory cell. Thus, the first and second gate electrodes G1 and G2 may serve as buried word lines.

A first junction region 520 and a second junction region 521 may be formed in the first and second pillars P1 and P2. The first junction region 520 may be positioned in the bottom portions of the first and second pillars P1 and P2, and the second junction region 521 may be positioned in the top portions of the first and second pillars P1 and P2. The first junction region 520 may be connected to the buried bit line 512.

Between the first junction region 520 and the buried bit line 512, an ohmic contact layer 513 may be further formed. The ohmic contact layer 513 may include metal silicide. The first junction region 520 may be positioned at a lower level than the second junction region 521. A vertical channel may be defined between the first and second junction regions 520 and 521.

The first and second junction regions 520 and 521 may be doped with a conductive impurity. For example, the conductive impurity may include phosphorous (P), arsenic (As), antimony (Sb) or boron (B). The first and second junction regions 520 and 521 may be doped with impurities having the same conductivity type as each other. The first junction region 520 and the second junction region 521 may be referred to as a source region and a drain region. A hard mask layer 522 may be formed over the first and second pillars P1 and P2.

In accordance with the fourth embedment, the shielding line 507 may be positioned between the major axes X2 of the active regions 502I. Thus, a Passing Gate (PG) effect may not occur. For example, a bias may be applied to the shielding line interconnection 507I through the contact 530. As such, the bias may be applied to the shielding line 507 to shield an electric field formed by the PG.

Furthermore, as the first and second gate electrodes G1 and G2 are formed in a bulb shape, the resistance of the first and second gate electrodes G1 and G2 may improve. That is, the critical dimension (CD) of the first electrode portion 516 formed of a metallic material can be further secured to reduce the gate resistance.

Furthermore, as the first and second gate electrodes G1 and G2 are formed in a bulb shape, the areas of the top portions of the first and second gate electrodes G1 and G2 can be increased. In a DRAM cell, a Storage Node Contact (SNC) plug may easily be connected to the top portions of the first and second pillars P1 and P2. Since the areas of the top portions of the first and second pillars P1 and P2 are increased, a process margin for forming a contact hole in which the SNC plug is to be formed can be improved. Hereafter, a method for fabricating a semiconductor device in accordance with the fourth embodiment will be described.

Figure 15A:
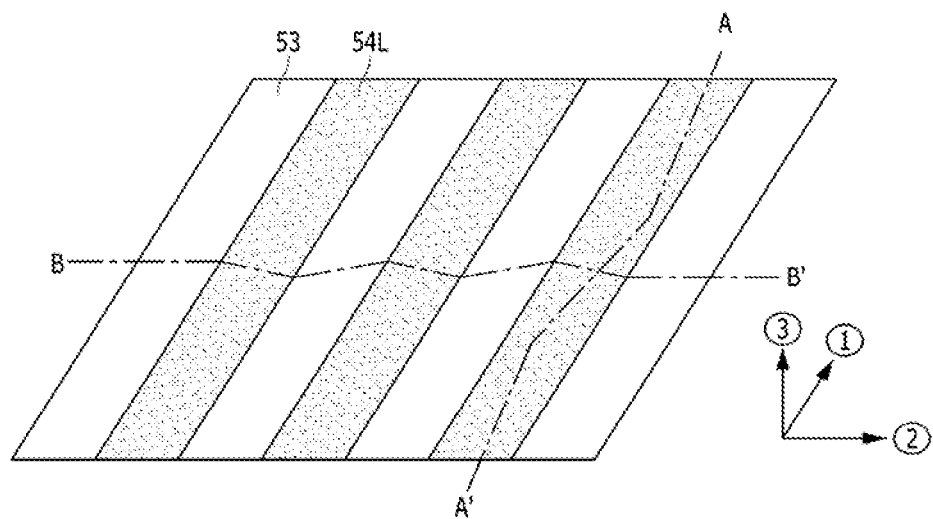
FIGS. 15A and 15B illustrate a method for fabricating a line-shaped active region of the semiconductor device in accordance with the fourth embodiment.
Figure 15B:
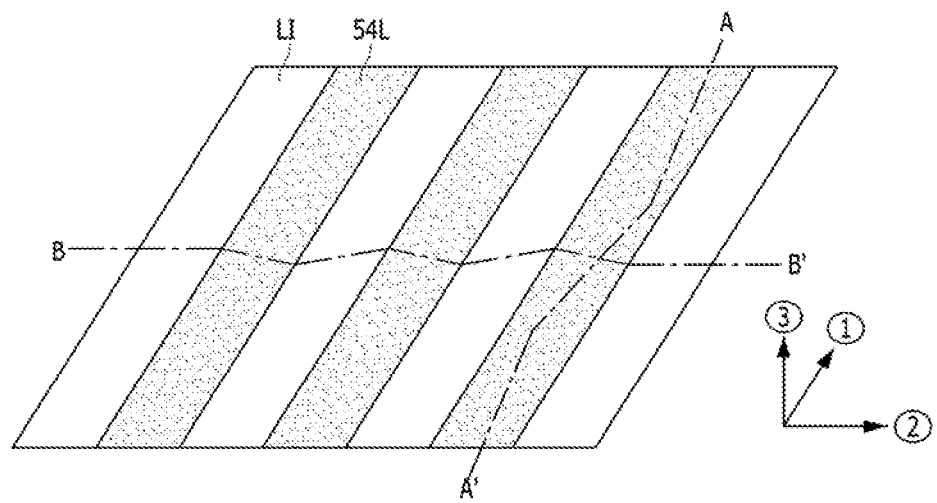
Figure 16A:
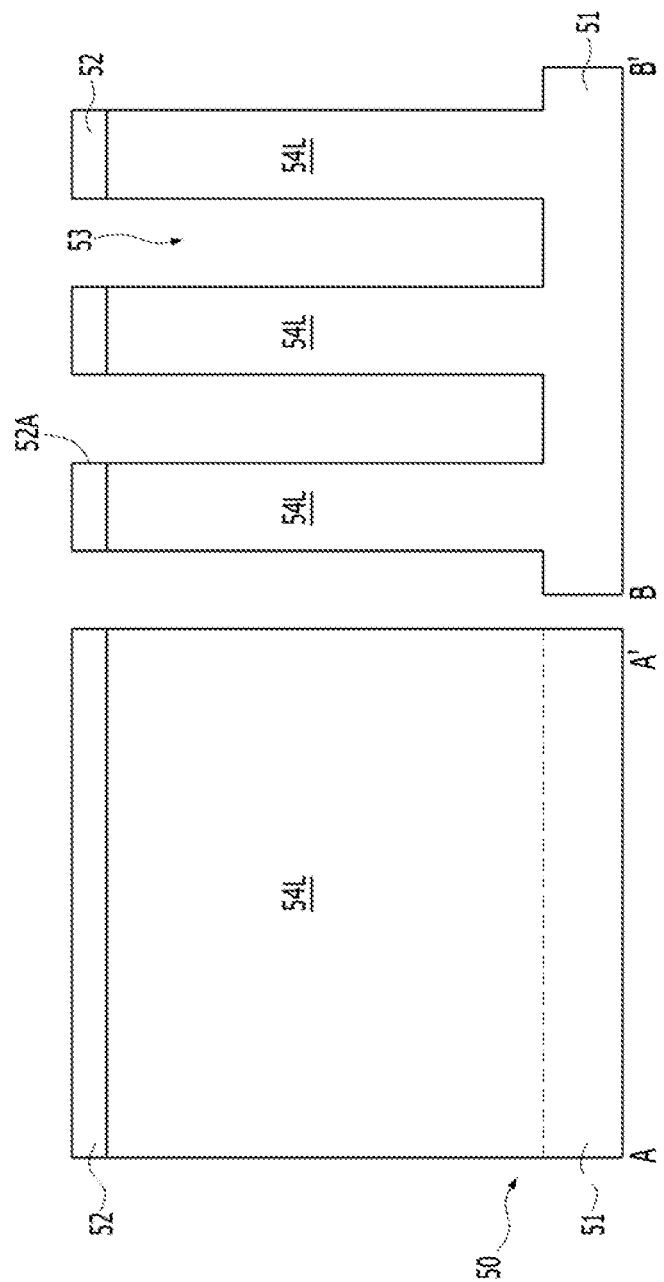

FIGS. 15A and 15B are diagrams for describing a method for fabricating a line-shaped active region of the semiconductor device in accordance with the fourth embodiment. FIGS. 16A and 16B are cross-sectional views taken along the lines A-A' and B-B' of FIGS. 15A and 15B, respectively.

As shown in FIGS. 15A and 16A, a substrate 50 may be prepared. The substrate 50 may include a material suitable for semiconductor processing. The substrate 50 may include a semiconductor substrate. The substrate 50 may include a silicon-containing material. The substrate 50 may include silicon, monocrystalline silicon, polysilicon, amorphous silicon, silicon germanium, monocrystalline silicon germanium, polycrystalline silicon germanium, carbon-doped silicon, combinations thereof or multi-layers thereof. The substrate 50 may include a semiconductor material such as germanium. The substrate 50 may include a III/V group semiconductor substrate, for example, a compound semiconductor substrate such as GaAs. The substrate 50 may include a Silicon On Insulator (SOI) substrate.

A first hard mask layer 52 may be formed over the substrate 50. The first hard mask layer 52 may have a plurality of line-shaped openings 52A formed therein. To form the plurality of line-shaped openings 52A, the first hard mask layer 52 may be etched through a mask (not illustrated). The plurality of line-shaped openings 52A may be formed by a Spacer Pattern Technology (SPT) process. The first hard mask layer 52 may include a material having etch selectivity with respect to the substrate 50. For example, the first hard mask layer 52 may include silicon nitride. Although not illustrated, a buffer layer or pad layer may be further formed between the first hard mask layer 52 and the substrate 50. The buffer layer may be formed of silicon oxide.

A first isolation trench 53 may be formed. The first hard mask layer 52 having the line-shaped openings 52A may be used as a mask to etch the substrate 50. Thus, the first isolation trench 53 may be formed. The first isolation trench 53 may have a line shape. The first isolation trench 53 may define a first line-shaped active region 54L in the substrate 50. The space between the line-shaped active regions 54L may serve as the first isolation trench 53. The line-shaped active region 54L and the first isolation trench 53 may extend in the first direction $\hat{1}$. For convenience of description, the first direction $\hat{1}$ may be referred to as a diagonal direction. The bottom portion of the substrate 50, which remains since the process for forming the line-shaped active region 54L and the first isolation trench 53 is not performed in the bottom portion, may be referred to as a bulk portion 51.

As shown in FIGS. 15B and 16B, a line-shaped device isolation region LI may be formed in the first isolation trench 53. The line-shaped active regions 54L and the line-shaped device isolation regions LI may be alternately formed. The line-shaped active region 54L and the line-shaped device isolation region LI may have the same line width. The line-shaped active region 54L and the line-shaped device isolation region LI may extend in the first direction $\hat{1}$. The line-shaped active region 54L and the line-shaped device isolation region LI may be parallel to each other.

The line-shaped device isolation region LI may be formed of a dielectric layer. The line-shaped device isolation region LI may include silicon oxide, silicon nitride, silicon germanium, Spin On Dielectric (SOD) or combinations thereof. Although not illustrated, the line-shaped device isolation region LI may include a liner layer, a dielectric pillar layer and an isolation dielectric layer. For example, the line-shaped device isolation region LI may be formed through the method shown in FIGS. 4A to 4C.

After the line-shaped device isolation region and the line-shaped active region are formed, a buried bit line may be formed. FIGS. 17A to 17G are diagrams for describing a method for fabricating a buried bit line of the semiconductor device in accordance with the fourth embodiment. FIGS. 18A to 18G are cross-sectional views taken along the lines A-A' and B-B' of FIGS. 17A to 17G, respectively.

Figure 17A:
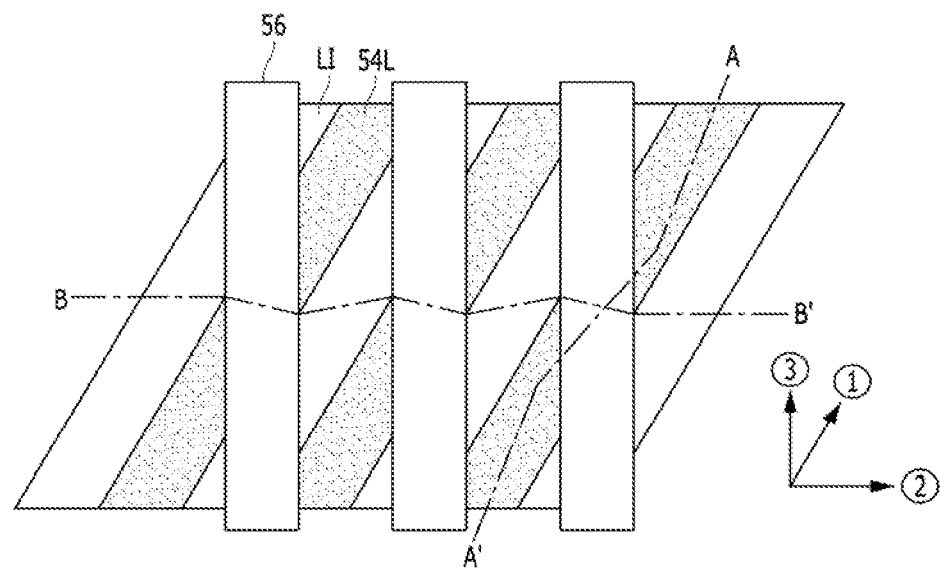
FIGS. 17A to 17G illustrate a method for fabricating a buried bit line of the semiconductor device in accordance with the fourth embodiment.
Figure 18A:
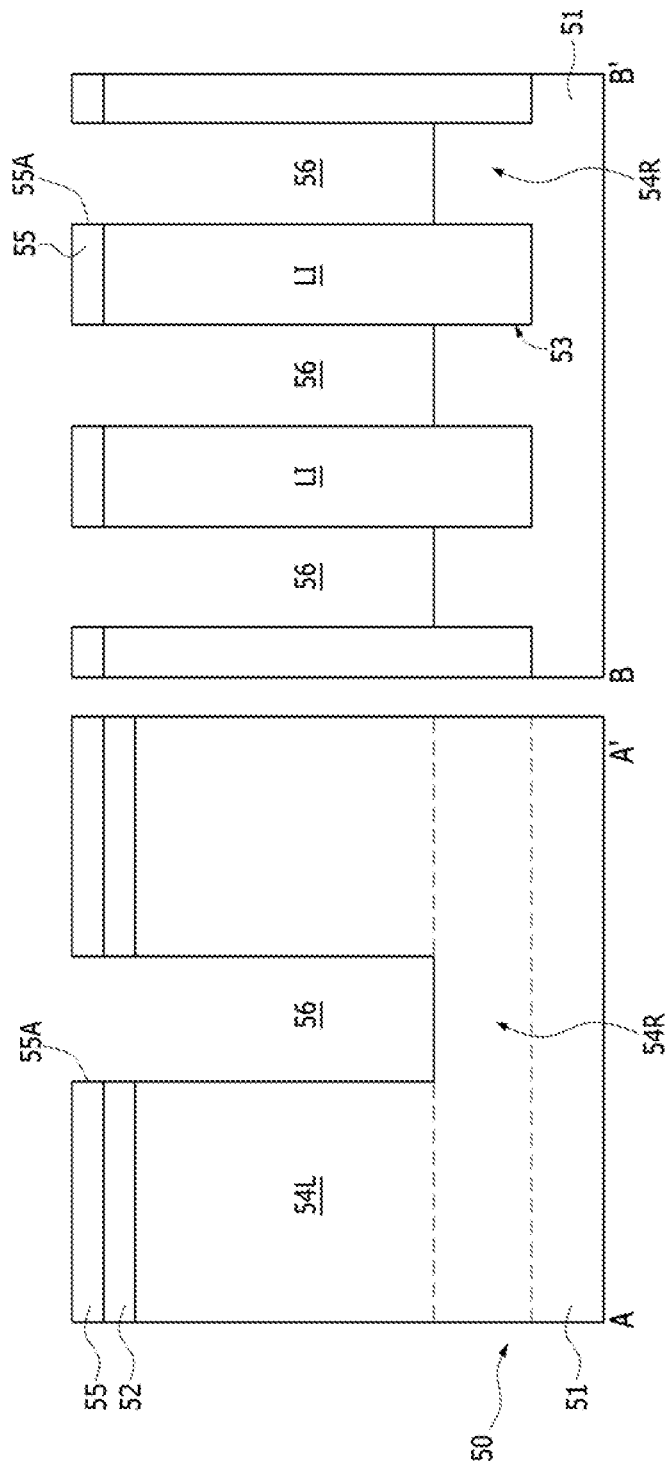
FIGS. 18A to 18G are cross-sectional views taken along the lines A-A' and B-B' of FIGS. 17A to 17G, respectively.

As shown in FIGS. 17A and 18A, a second hard mask layer 55 may be formed. The second hard mask layer 55 may be formed over the substrate 50 in which the line-shaped device isolation region LI and the line-shaped active region 54L of FIG. 15B are formed. The second hard mask layer 55 may have a plurality of second line-shaped openings 55A formed therein. The second hard mask layer 55 may be formed of a material having etch selectivity with respect to the substrate 50. For example, the second hard mask layer 55 may include silicon nitride.

A bit line trench 56 may be formed. Through the second hard mask layer 55 used as a mask, the first hard mask layer 52, the line-shaped active region 54L and the line-shaped device isolation region LI may be etched. Thus, the line-shaped bit line trench 56 may be formed. The bit line trench 56 may be formed in a line shape extending in the third direction $\hat{3}$. The bit line trench 56 may extend in a direction crossing the first isolation trench 53. The bit line trench 56 may be formed to a shallower depth than the first isolation trench 53. The bit line trench 56 may cross the line-shaped active region 54L and the line-shaped device isolation region LI. Under the bit line trench 56, a remaining portion 54R of the line-shaped active region 54L may be formed. The remaining portion 54R may be referred to as an active region body portion 54R.

Figure 17B:
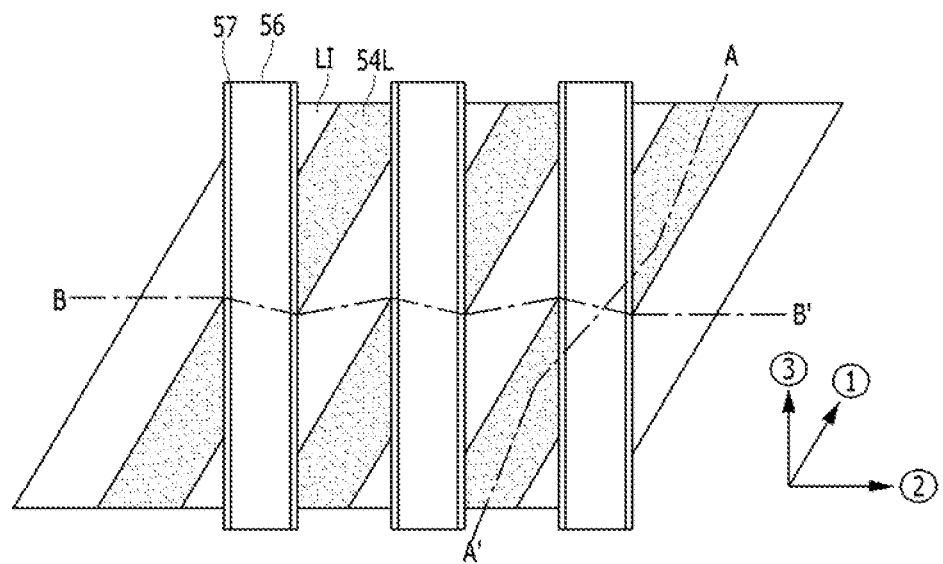
Figure 18B:
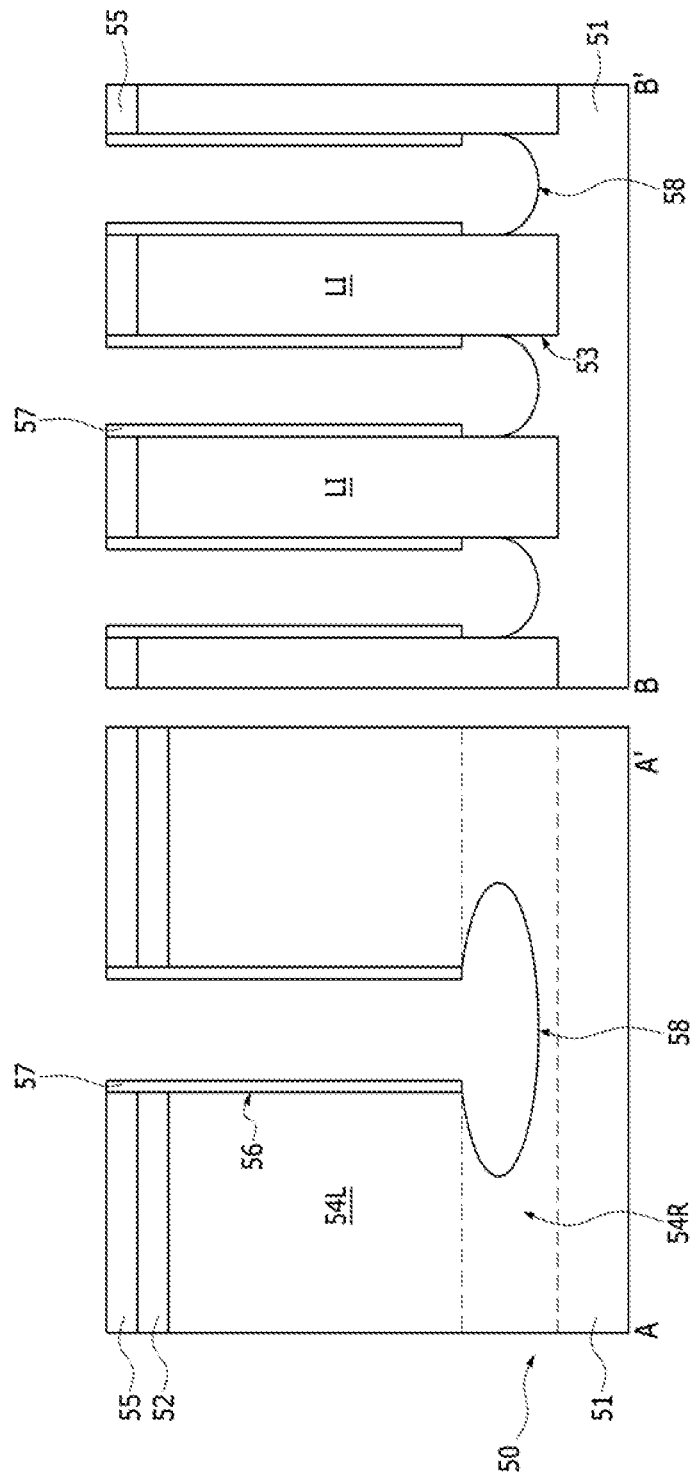

As shown in FIGS. 17B and 18B, a liner spacer 57 may be formed. The liner spacer 57 may be formed on both sidewalls of the bit line trench 56. The liner spacer 57 may be formed through a series of processes of depositing silicon oxide and performing an etch-back process.

A body trench 58 may be formed. The body trench 58 may be formed by etching the bottom surface of the bit line trench 56 to a predetermined depth. Through the second hard mask layer 55 and the liner spacer 57 which are used as a mask, the bottom surface of the bit line trench 56 may be expanded. Thus, a part of the active region body portion 54R may be etched to form the body trench 58. To form the body trench 58, isotropic etching may be performed. Through the isotropic etching, the body trench 58 may be formed in a bulb shape. The body trench 58 may have a larger line width than the bit line trench 56. A bottom of the body trench 58 may be located at a higher level than a bottom the first isolation trench 53. The body trench 58 may be expanded in the first direction $\hat{1}$ under the bit line trench 56. The body trenches 58 adjacent to each other in the first direction $\hat{1}$ may be spaced apart from each other.

Figure 17C:
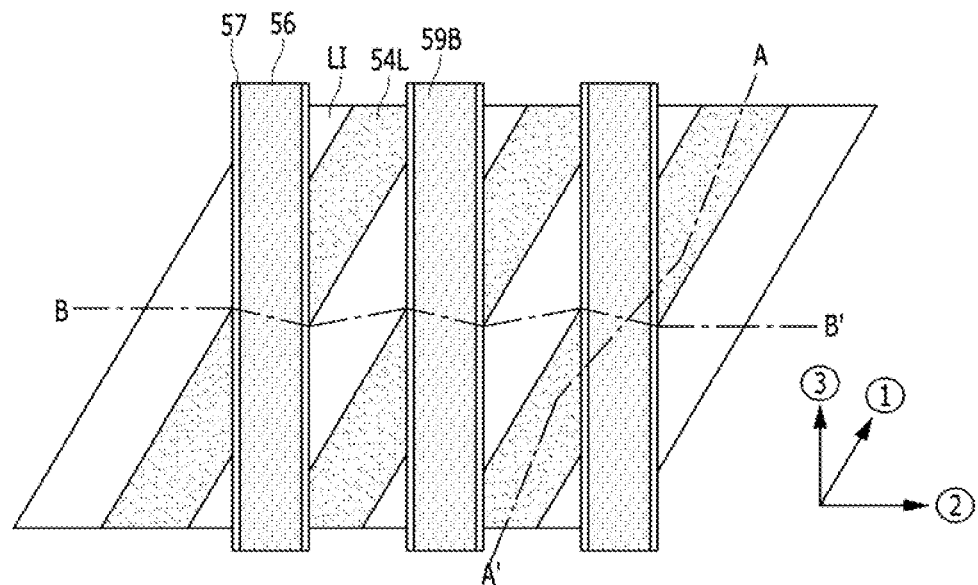
Figure 18C:
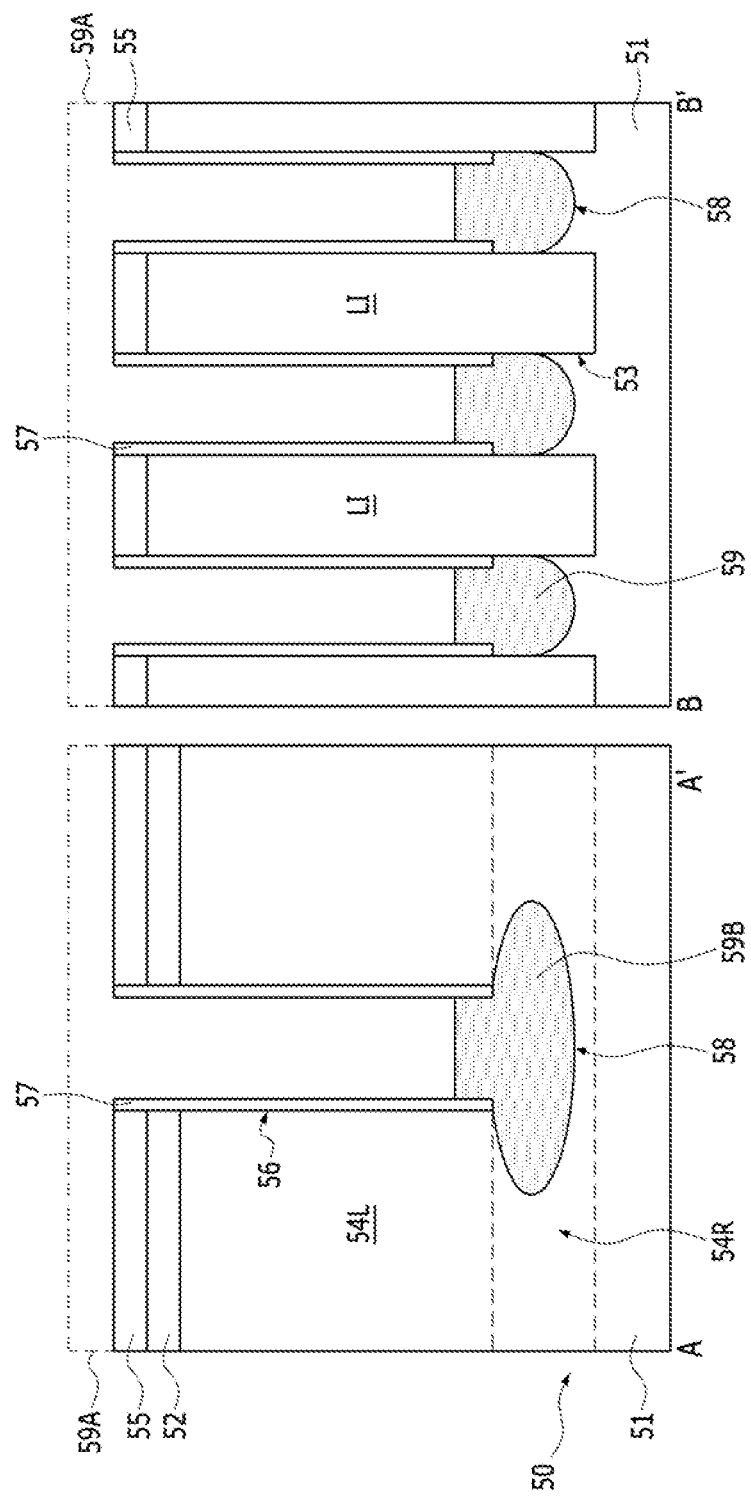

As shown in FIGS. 17C and 18C, a punch-through preventing layer 59B may be formed in the body trench 58. For example, the body trench 58 and the bit line trench 56 may be filled with a pre-punch-through preventing layer 59A. The pre-punch-through preventing layer 59A may be formed of a dielectric material. To form the pre-punch-through preventing layer 59A, the bit line trench 56 and the body trench 58 may be filled with SOD. Then, the pre-punch-through preventing layer 59A may be recessed to a predetermined depth. Thus, the recessed punch-through preventing layer 59B may fill at least the body trench 58. To form the recessed punch-through preventing layer 59B, a planarization process and an etch-back process may be sequentially performed.

Figure 17D:
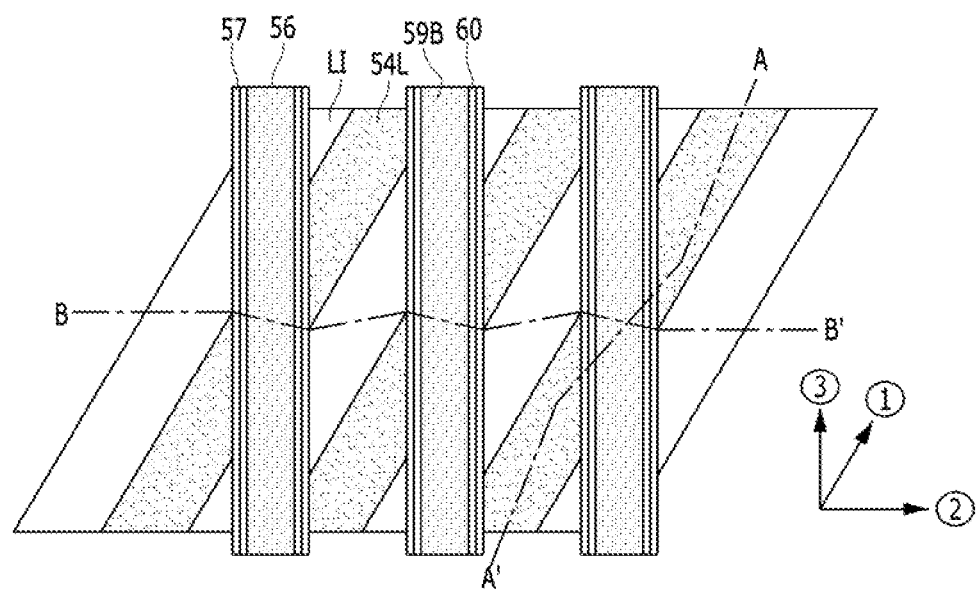
Figure 18D:
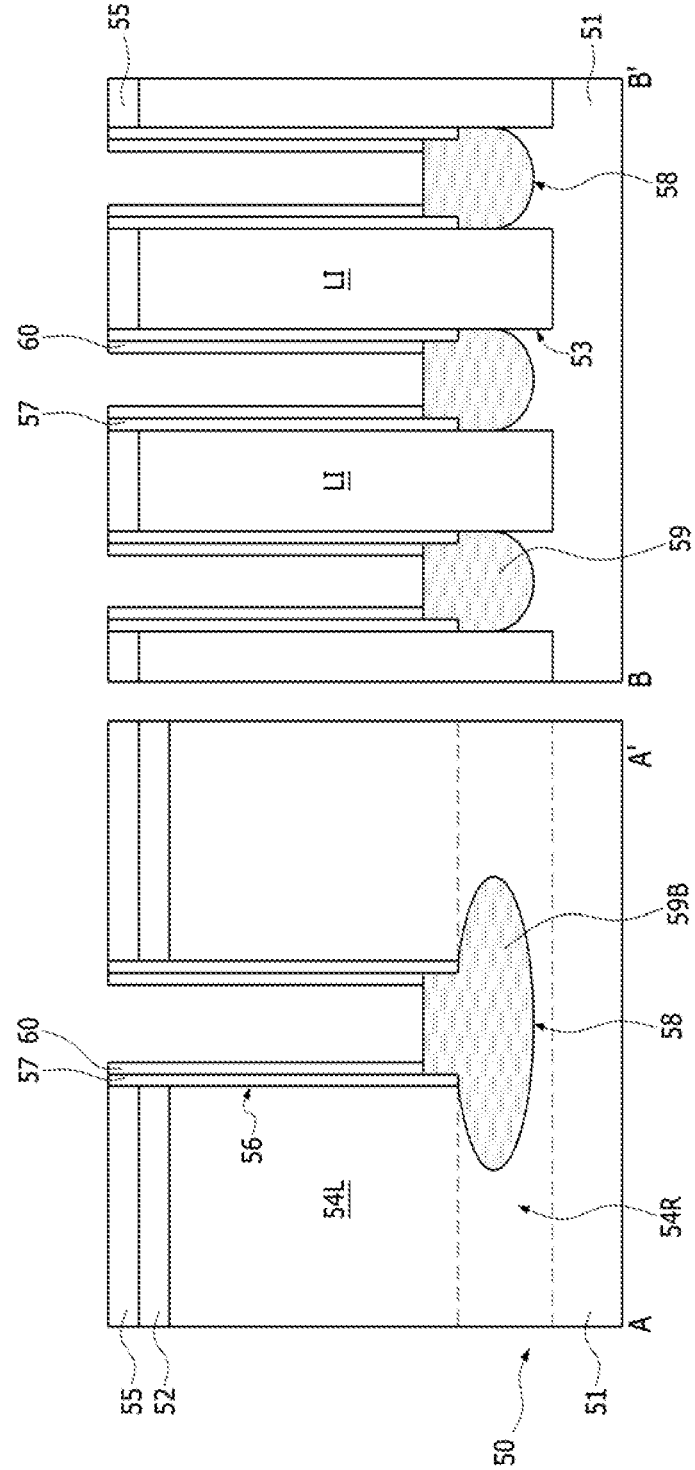

As shown in FIGS. 17D and 18D, a sacrificial spacer 60 may be formed. The sacrificial spacer 60 may cover the sidewalls of the liner spacer 57. The sacrificial spacer 60 may be formed of titanium nitride. For example, titanium nitride may be conformally deposited, and an etch-back process may be performed to form the sacrificial spacer 60.

Figure 17E:
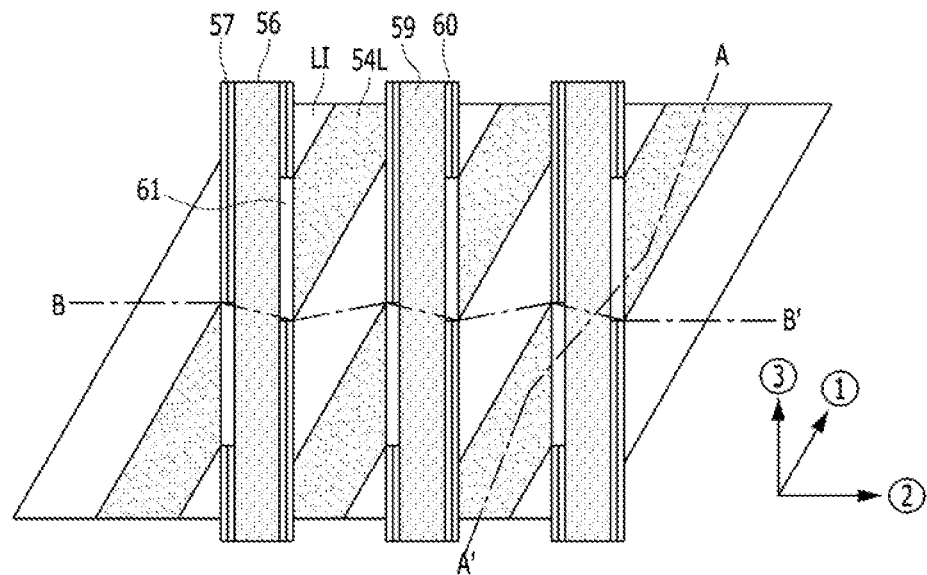
Figure 18E:
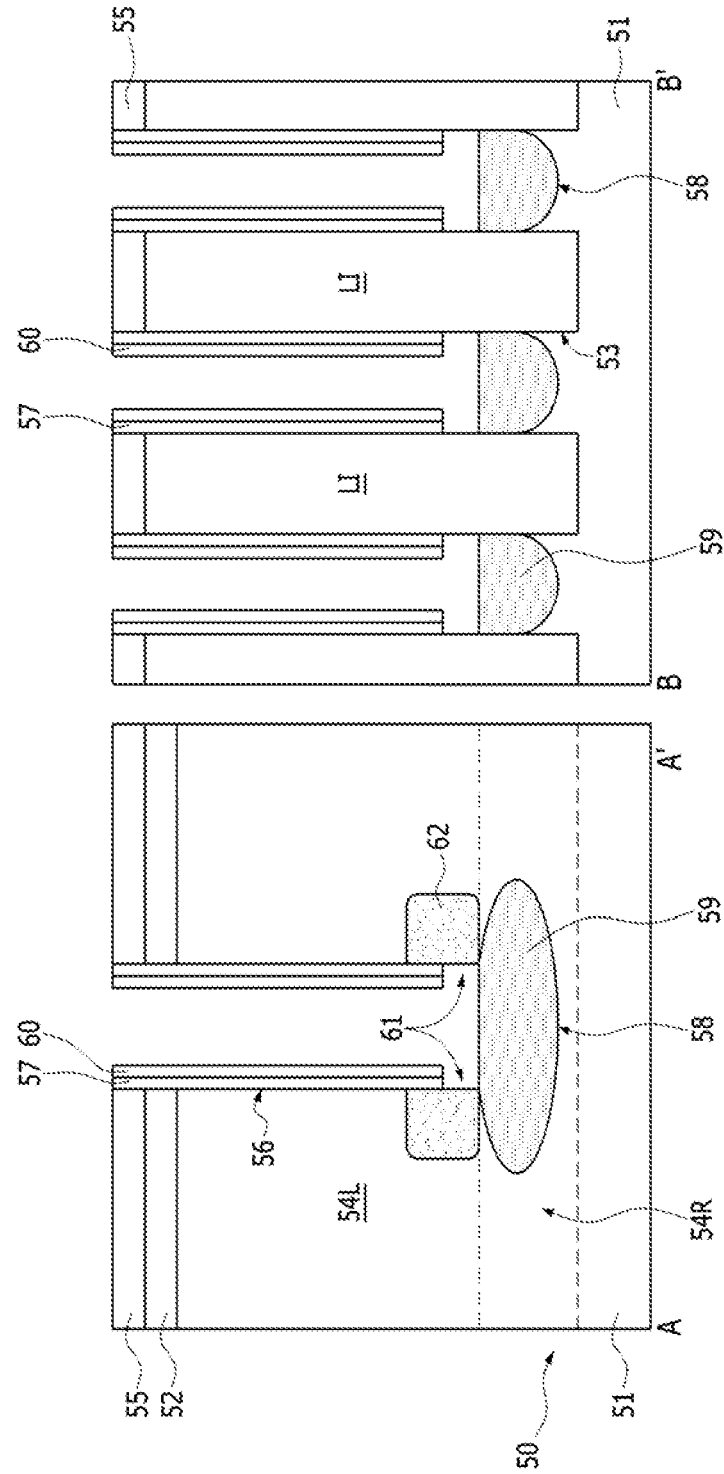

As shown in FIGS. 17E and 18E, a contact opening 61 may be formed. To form a contact opening 61, the recessed punch-through preventing layer 59B may be recessed to a predetermined depth using the sacrificial spacer 60 as a barrier. Thus, a punch-through preventing layer 59 may remain in the body trench 58. The punch-through preventing layer 59 may fill the body trench 58. The recessed punch-through preventing layer 59 may expose a lower portion of the liner spacer 57. Then, the exposed lower portion of the liner spacer 57 may be selectively removed. Thus, the contact opening 61 may be formed.

The contact opening 61, with which a subsequent buried bit line is in contact, may have a Both Side Contact (BSC) shape. For example, both sidewalls of the bottom portion of the bit line trench 56 may be exposed to the same contact opening 61. An upper sidewall of the bit line trench 56, which is not exposed through the contact opening 61, may be covered by the liner spacer 57. As such, the present embodiment may not require a separate contact mask for forming the contact opening 61.

Then, a first junction region 62 may be formed. To form the first junction region 62, an impurity doping process may be performed by plasma doping technology. For example, the first junction region 62 may be formed by plasma-doping an impurity through the contact opening 61. During the doping process, the impurity may include an N-type impurity or P-type impurity. For example, phosphorous (P) or arsenic (As) may be used as the impurity. The first junction region 62 may be formed in the bottom portion of the line-shaped active region 54L. The first junction region 62 may float from the bulk portion 51. That is, the first junction region 62 may be isolated from the bulk portion 51 by the punch-through preventing layer 59. Furthermore, side diffusion of the first junction region 62 may be suppressed by the line-shaped device isolation region LI.

Figure 17F:
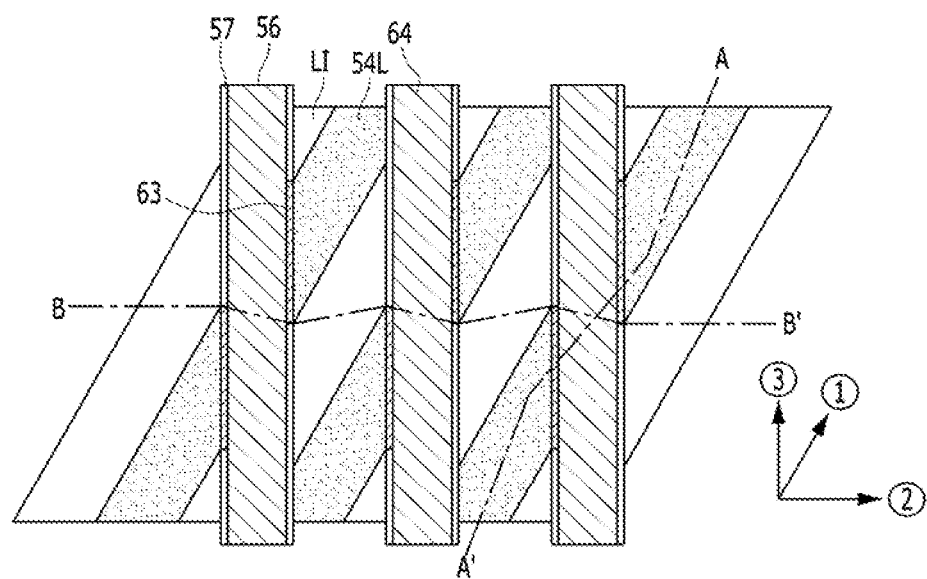
Figure 18F:
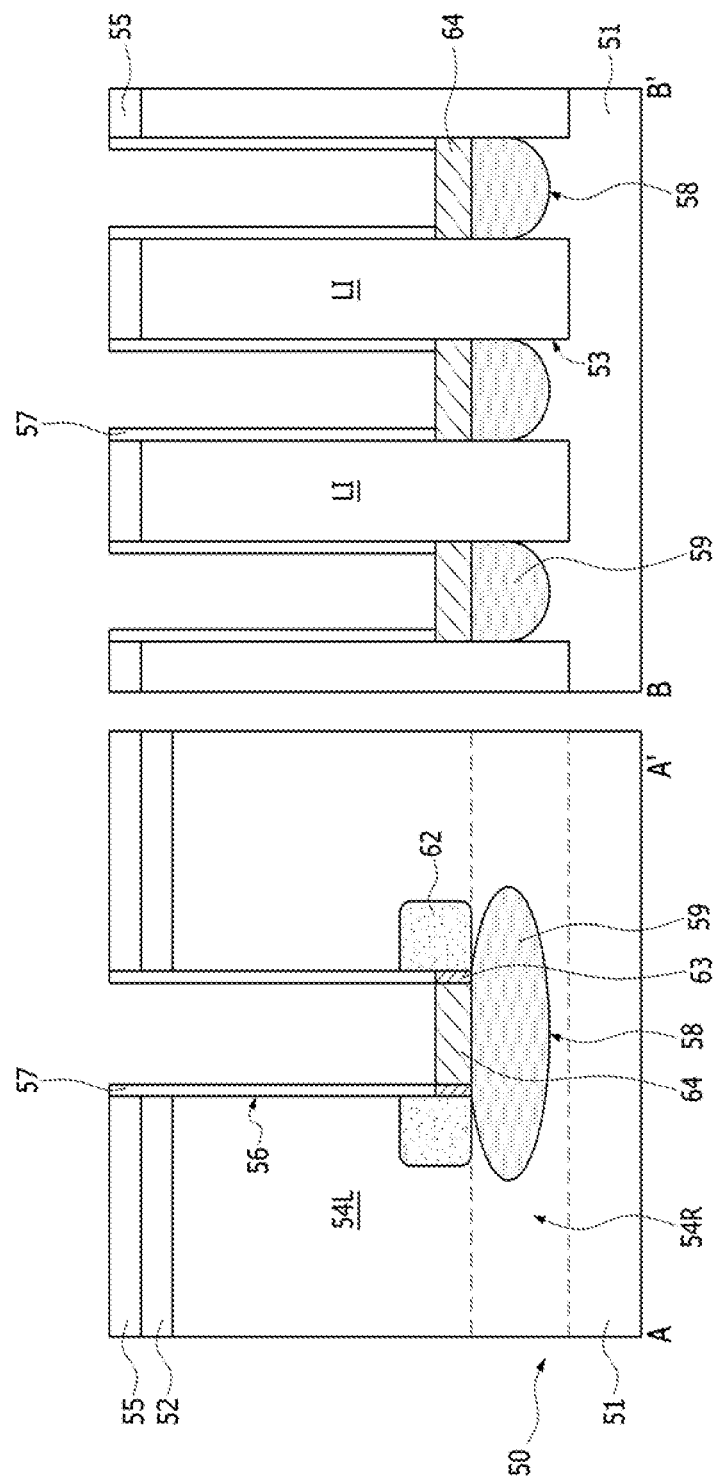

As shown in FIGS. 17F and 18F, the sacrificial spacer 60 may be removed. Then, a buried bit line 64 may be formed. For example, a metal layer (not shown) may be formed to fill the bit line trench 56, and then etched back to form the buried bit line 64 which fills the bottom portion of the bit line trench 56. At this time, the buried bit line 64 may include tungsten (W). Both ends of the buried bit line 64 may be connected to the first junction regions 62, respectively. The punch-through preventing layer 59 may be positioned between the buried bit line 64 and the bulk portion 51.

Before the buried bit line 64 is formed, an ohmic contact layer 63 may be formed between the first junction region 62 and the buried bit line 64. The ohmic contact layer 63 may include metal silicide. For example, the ohmic contact layer 63 may include cobalt silicide. To form cobalt silicide, a cobalt layer may be deposited on the first junction region 62, and a heat treatment may be performed. Then, the unreacted cobalt layer may be removed.

As such, the buried bit line 64 and the first junction region 62 may contact each other without a plug. Such a contact may be referred to as a plug less contact.

Figure 17G:
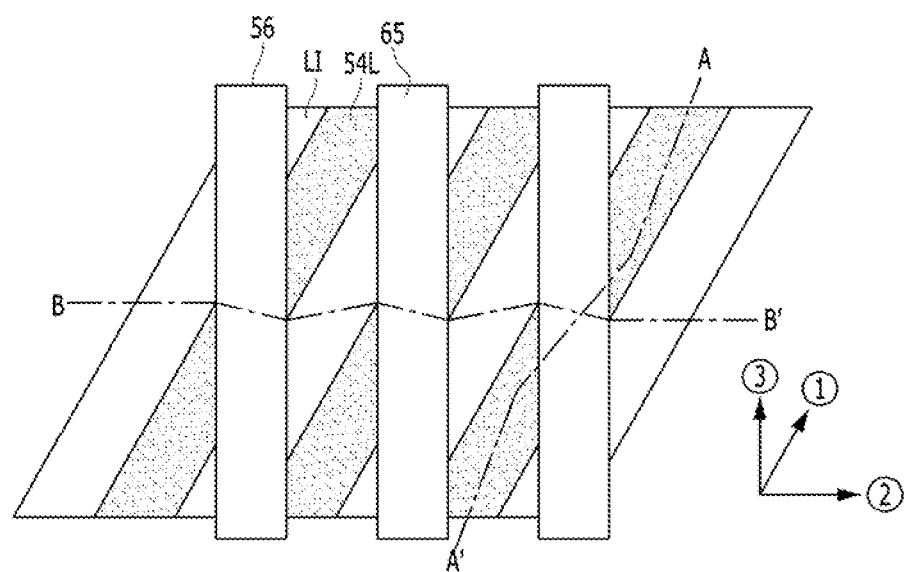
Figure 18G:
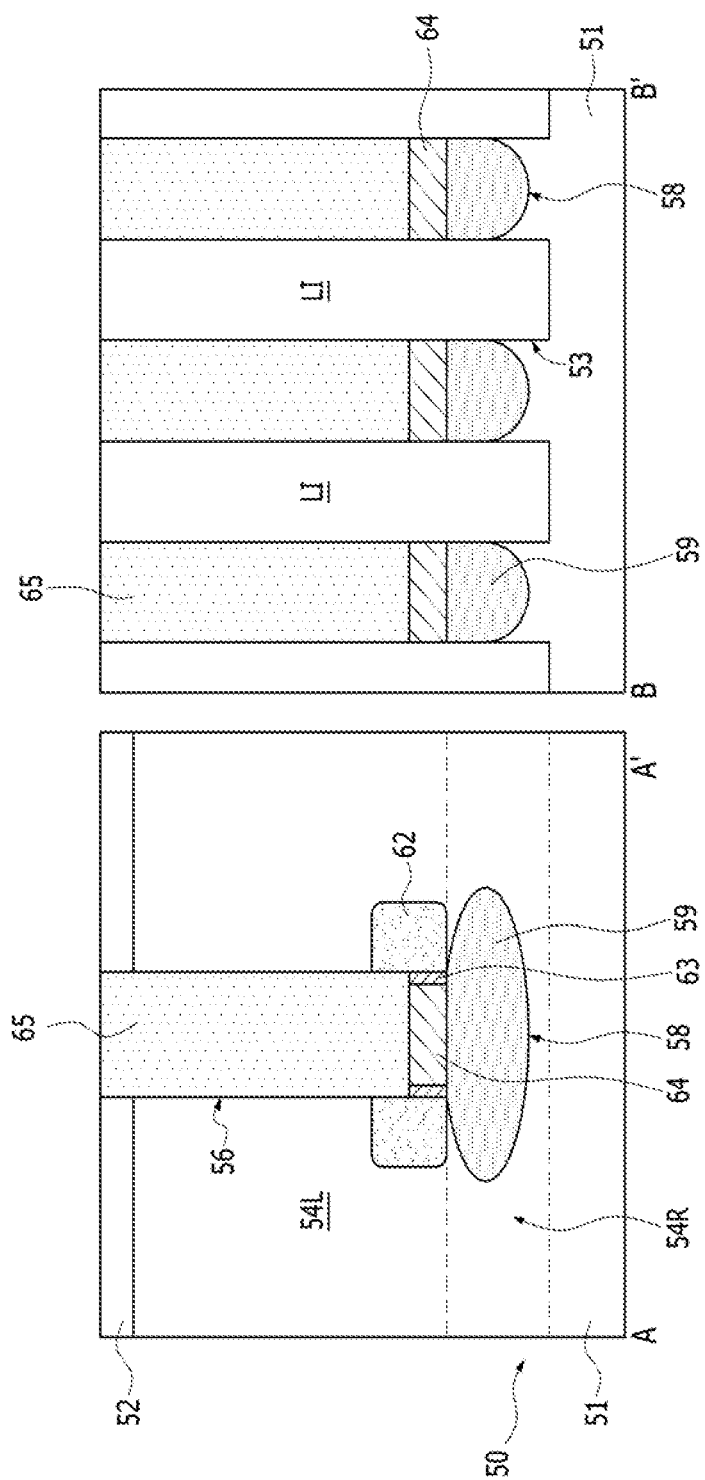

As illustrated in FIGS. 17G and 18G, the liner spacer 57 may be selectively removed. To cover the buried bit line 64, a bit line capping layer 65 may be formed to fill the bit line trench 56. The bit line capping layer 65 may include silicon oxide. Subsequently, the bit line capping layer 65 may be planarized until the surface of the first hard mask layer 52 is exposed.

During the planarization process for the bit line capping layer 65, the second hard mask layer 55 may be removed.

Figure 19A:
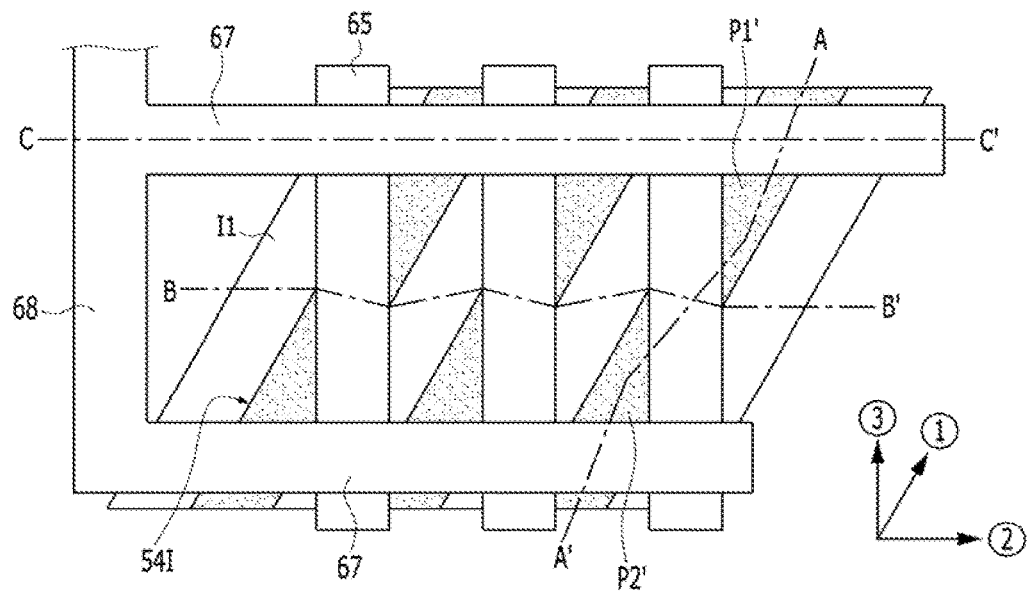
FIGS. 19A to 19C illustrate a method for fabricating a second device isolation region of the semiconductor device in accordance with the fourth embodiment.
Figure 19B:
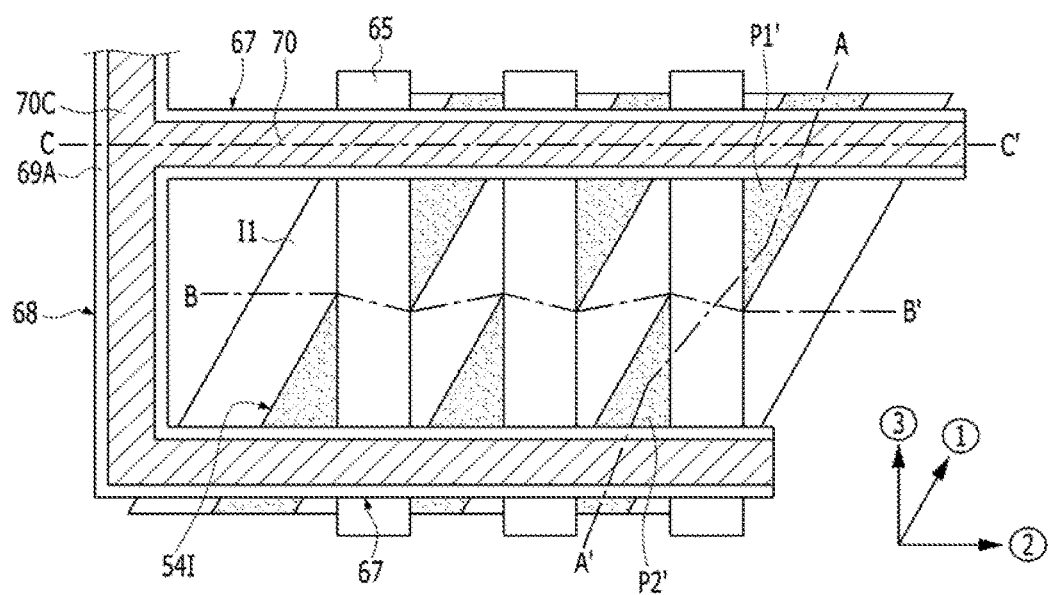
Figure 19C:
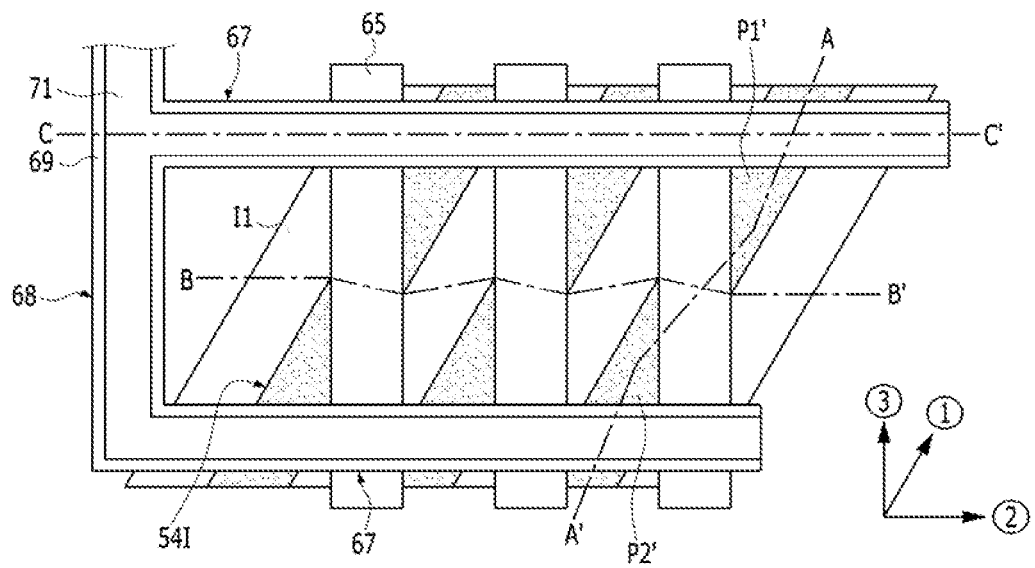
Figure 20A:
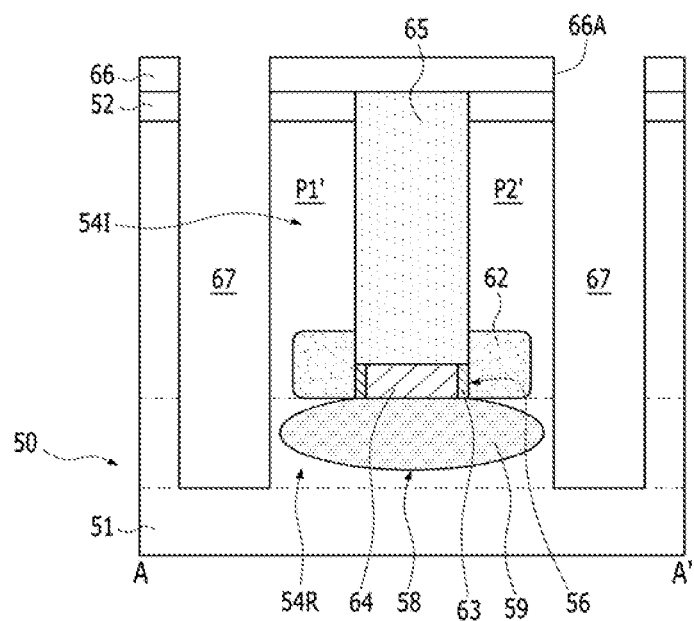
FIGS. 20A to 20C are cross-sectional views taken along the line A-A' of FIGS. 19A to 19C, respectively.
Figure 20B:
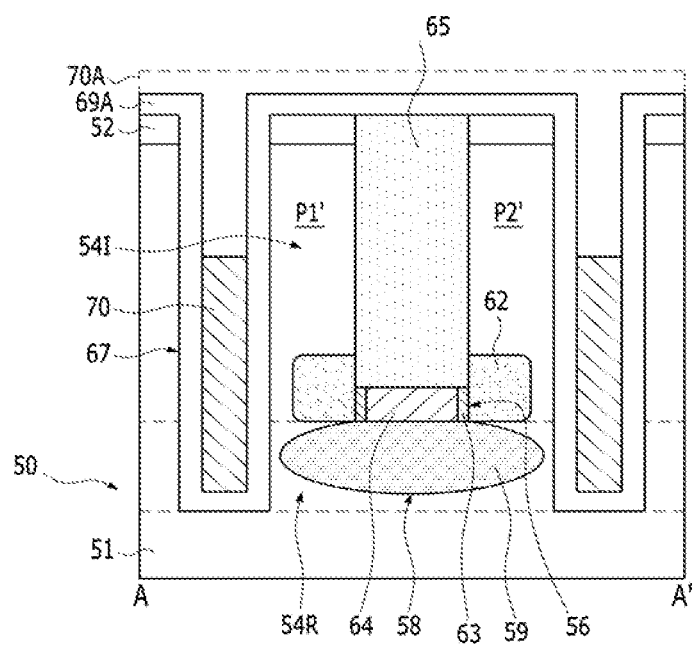
Figure 20C:
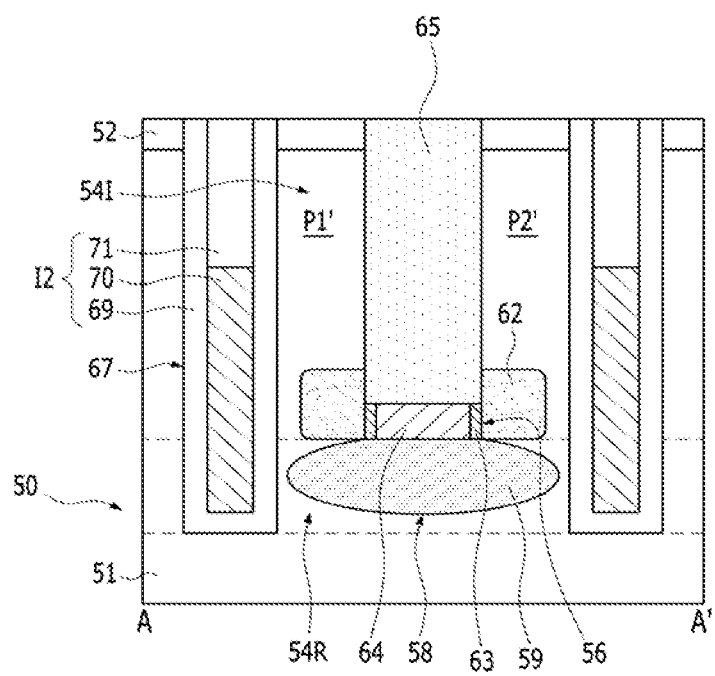
Figure 21A:
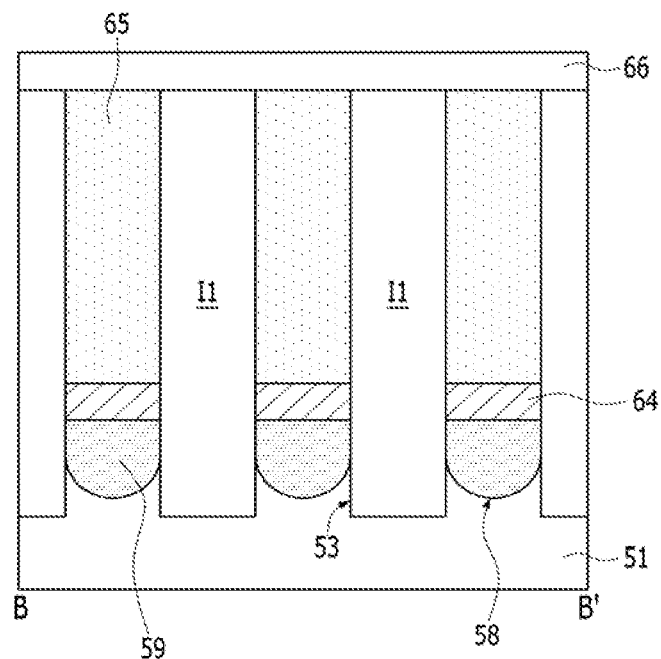
FIGS. 21A to 21C are cross-sectional views taken along the line B-B' of FIGS. 19A to 19C, respectively.
Figure 21B:
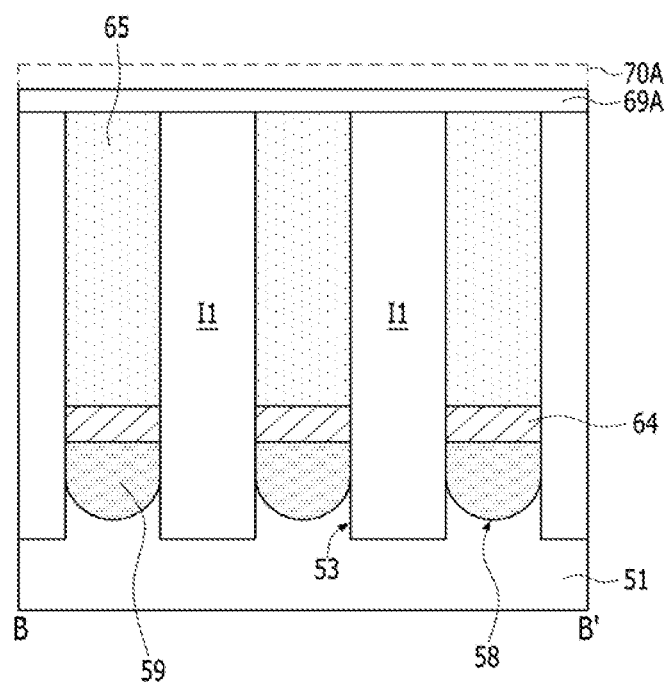
Figure 21C:
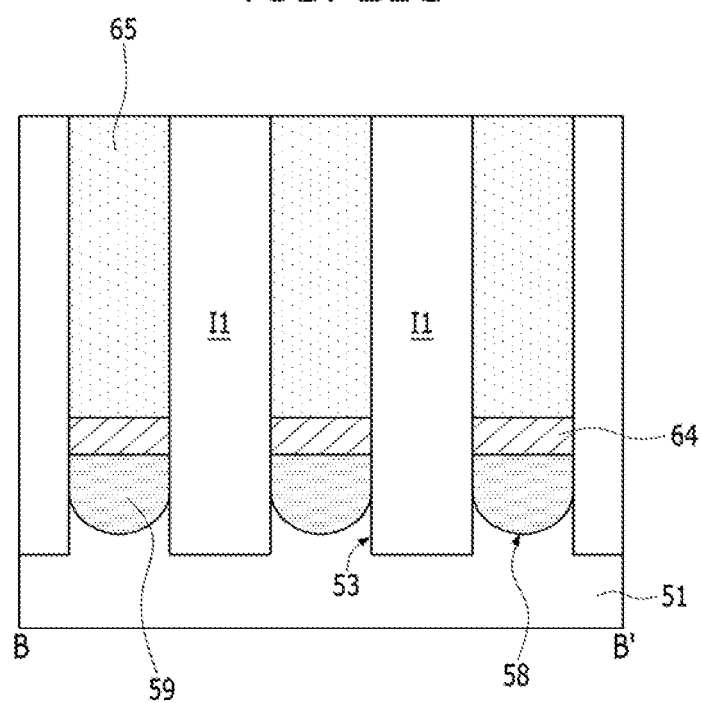
Figure 22A:
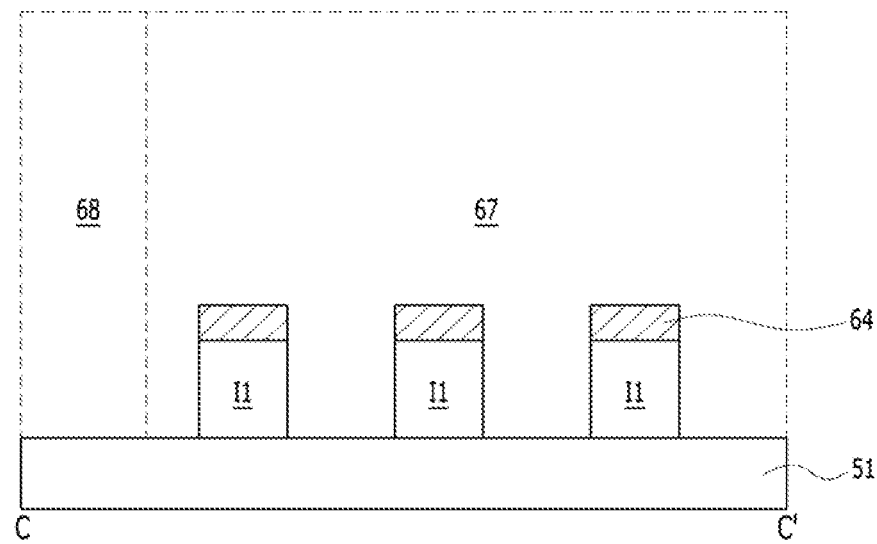
FIGS. 22A to 22C are cross-sectional views taken along the line C-C' of FIGS. 19A to 19C, respectively.
Figure 22B:
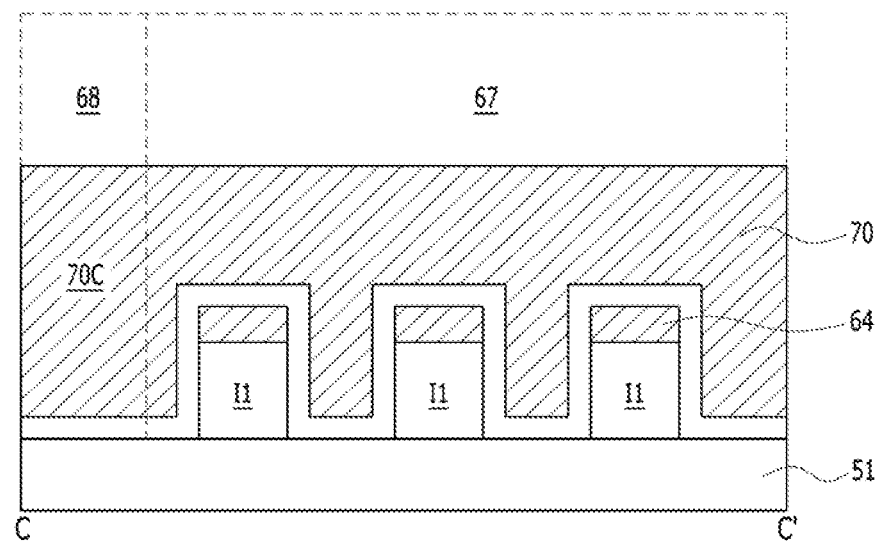
Figure 22C:
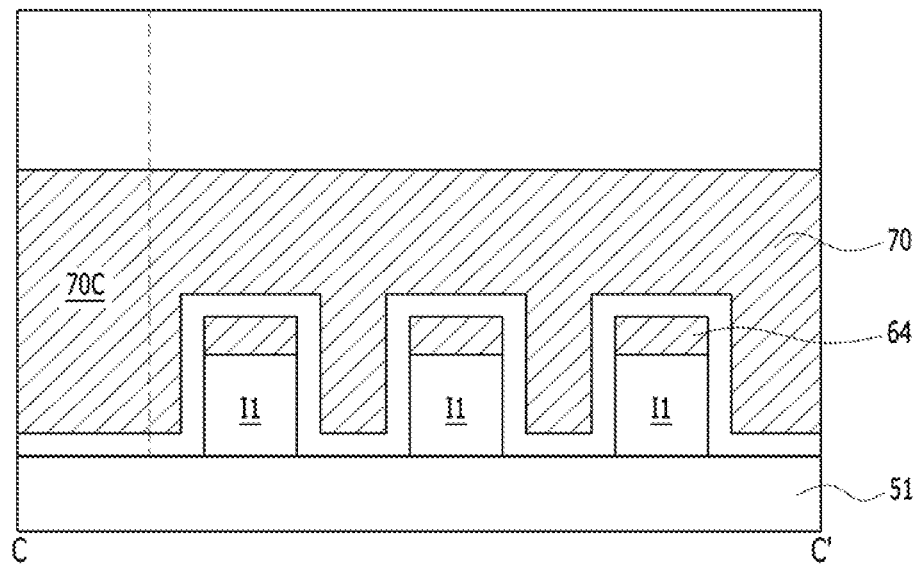

FIGS. 19A to 19C are diagrams for describing a method for fabricating a second device isolation region of the semiconductor device in accordance with the fourth embodiment. FIGS. 20A to 20C are cross-sectional views taken along the line A-A' of FIGS. 19A to 19C, respectively. FIGS. 21A to 21C are cross-sectional views taken along the line B-B' of FIGS. 19A to 19C, respectively. FIGS. 22A to 22C are cross-sectional views taken along the line C-C' of FIGS. 19A to 19C, respectively.

Referring to FIGS. 19A, 20A, 21A and 22A, the line-shaped active region 54L and the line-shaped device isolation region LI may be cut in a uniform length unit. To cut the line-shaped active region 54L and the line-shaped device isolation region LI, a first cutting mask 66 may be applied. The first cutting mask 66 may have a plurality of third line-shaped openings 66A. The plurality of third line-shaped openings 66A may extend in the second direction Z. The first cutting mask 66 may extend in the direction crossing the line-shaped active region 54L and the line-shaped device isolation region LI. The first cutting mask 66 may include a photoresist pattern.

The line-shaped active region 54L and the line-shaped device isolation region LI may be etched using the first cutting mask 66. Thus, a plurality of second isolation trenches 67 may be formed. The second isolation trench 67 may extend in the second direction $\hat{2}$.

The second isolation trenches 67 may define a plurality of island-shaped active regions 54I and a plurality of first device isolation regions I1. The plurality of island-shaped active regions 54I may be formed by cutting the line-shaped active regions 54L. The plurality of first device isolation regions I1 may be formed by cutting the line-shaped device isolation region LI.

Through such processes, the line-shaped active region 54L may be cut to form the independent island-shaped active regions 54I. When viewed along the first direction $\hat{1}$, the neighboring island-shaped active regions 54I may have the same length and spacing, while being isolated from each other by the second isolation trench 67. The island-shaped active region 54I may have a minor axis X1' and a major axis X2'. The plurality of island-shaped active regions 54I may be repeatedly arranged while being isolated from each other along the first and second directions $\hat{1}$ and $\hat{2}$. Between the major axes X2' of the neighboring island-shaped active regions 54I, the second isolation trench 67 may be formed. Between the minor axes X1 of the neighboring island-shaped active regions 54I, the first device isolation region I1 may be positioned. The second isolation trench 67 may extend in the second direction $\hat{2}$. The second isolation trench 67 may have the same depth and line width as the first isolation trench 53.

One ends of the second isolation trenches 67 may be connected to each other. For example, one ends of the second isolation trenches 67 may be connected through a connection trench 68. The connection trench 68 may extend in the third direction $\hat{3}$.

When the second isolation trenches 67 are formed, the island-shaped active regions 54I may be formed at the same time. Each of the island-shaped active regions 54I may include a pair of pre-pillars P1' and P2'. In one island-shaped active region 54I, the pair of pre-pillars P1' and P2' may be separated from each other by the bit line trench 56. The pre-pillars P1' and P2' arranged in the first direction $\hat{1}$ may be isolated from each other by the second isolation trench 67. The pre-pillars P1' and P2' arranged in the second direction $\hat{2}$ may be isolated from each other by the first device isolation region I1.

As shown in FIGS. 19B, 20B, 21B and 22B, a liner layer 69A may be formed on the sidewalls of the second isolation trench 67 and the connection trench 68. The liner layer 69A may be formed of a material having etch selectivity with respect to the substrate 50. The liner layer 69A may include silicon oxide.

Then, a shield layer 70A may be formed. The shield layer 70A may fill the second isolation trench 67 and the connection trench 68. The shield layer 70A may include a conductive material. The shield layer 70A may be formed of a silicon-containing material. The shield layer 70A may include a polysilicon layer. The shield layer 70A may be doped with an impurity. The shield layer 70A may include a boron-doped polysilicon layer.

A shielding line 70 and a shielding line interconnection 70C may be formed. The shielding line 70 and the shielding line interconnection 70C may be formed by selectively etching the shield layer 70A. For example, the shield layer 70A may be etched through an etch-back process. Thus, the shielding line 70 may be formed in each of the second isolation trenches 67, and the shielding line interconnection 70C may be formed in the connection trench 68.

One ends of the shielding lines 70 may be connected to each other. For example, one ends of the shielding lines 70 may be connected through the shielding line interconnection 70C. The shielding line 70 may extend in the second direction $\hat{2}$. The shielding line interconnection 70C may extend in the third direction $\hat{3}$. The top surfaces of the shielding line 70 and the shielding line interconnection 70C may be recessed to a lower level than the top surface of the island-shaped active region 54I. Between the shielding line 70 and the sidewalls of the second isolation trench 67, the liner layer 69A may be positioned. Between the shielding line interconnection 70C and the connection trench 68, the liner layer 69A may also be positioned.

As shown in FIGS. 19C, 20C, 21C and 22C, an isolation dielectric layer 71 may be formed. The isolation dielectric layer 71 may be formed of silicon oxide. The isolation dielectric layer 71 may fill the space over the shielding line 70. Then, the isolation dielectric layer 71 and the liner layer 69A may be planarized. Thus, the isolation dielectric layer 71 may remain while filling the spaces over the shielding line 70 and the shielding line interconnection 70C. The planarized surface of the isolation dielectric layer 71 may be at the same level as the top surface of the first hard mask layer 52. The isolation dielectric layer 71 may include silicon oxide.

As such, the isolation dielectric layer 71 may be planarized to form a second device isolation region I2. The second device isolation region I2 may include a liner 69, a shielding line 70 and an isolation dielectric layer 71. The second device isolation region I2 may be formed in the second isolation trench 67. The second device isolation region I2 may include the shielding line 70 embedded therein. One ends of the shielding lines 70 may be connected to each other through the shielding line interconnection 70C.

The island-shaped active region 54I may be defined by the first device isolation region I1 and the second device isolation region I2. The plurality of island-shaped active regions 54I may be defined by the plurality of first device isolation regions I1 and the plurality of second device isolation regions I2. The plurality of island-shaped active regions 54I may be arranged in parallel. Thus, the plurality of island-shaped active regions may be referred to as parallel active regions.

In accordance with the above embodiment, the shielding line 70 may be formed between the major axes of the island-shaped active regions 54I, thereby improving a neighbor gate (NG) effect or passing gate (PG) effect. Subsequently, a buried bit line may be formed.

FIGS. 23A to 23H are diagrams illustrating a method for forming a gate electrode of the semiconductor device in accordance with the fourth embodiment. FIGS. 24A to 24H are cross-sectional views taken along the lines A-A', B-B' and C-C' of FIGS. 23A to 23H, respectively.

Figure 23A:
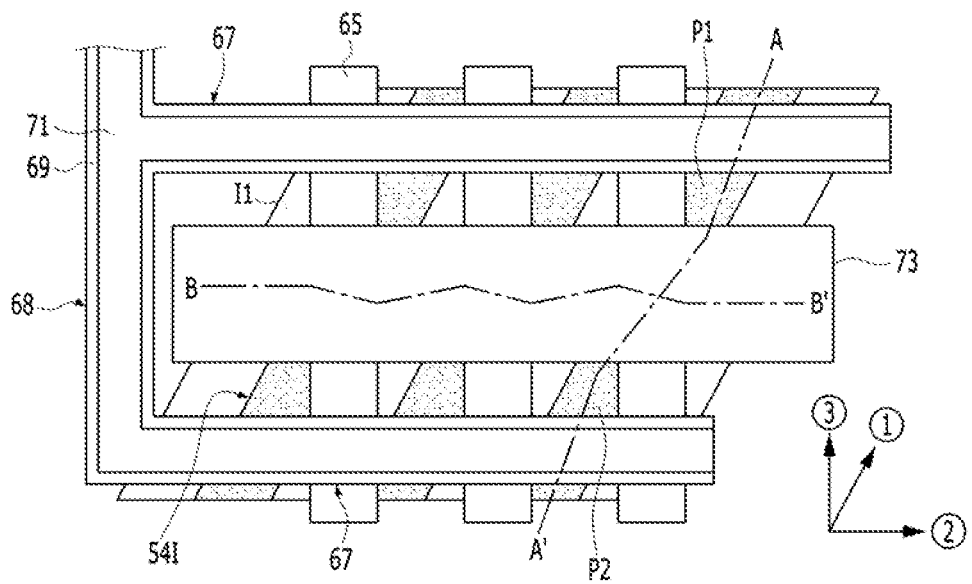
FIGS. 23A to 23H illustrate a method for forming a gate electrode of the semiconductor device in accordance with the fourth embodiment.
Figure 24A:
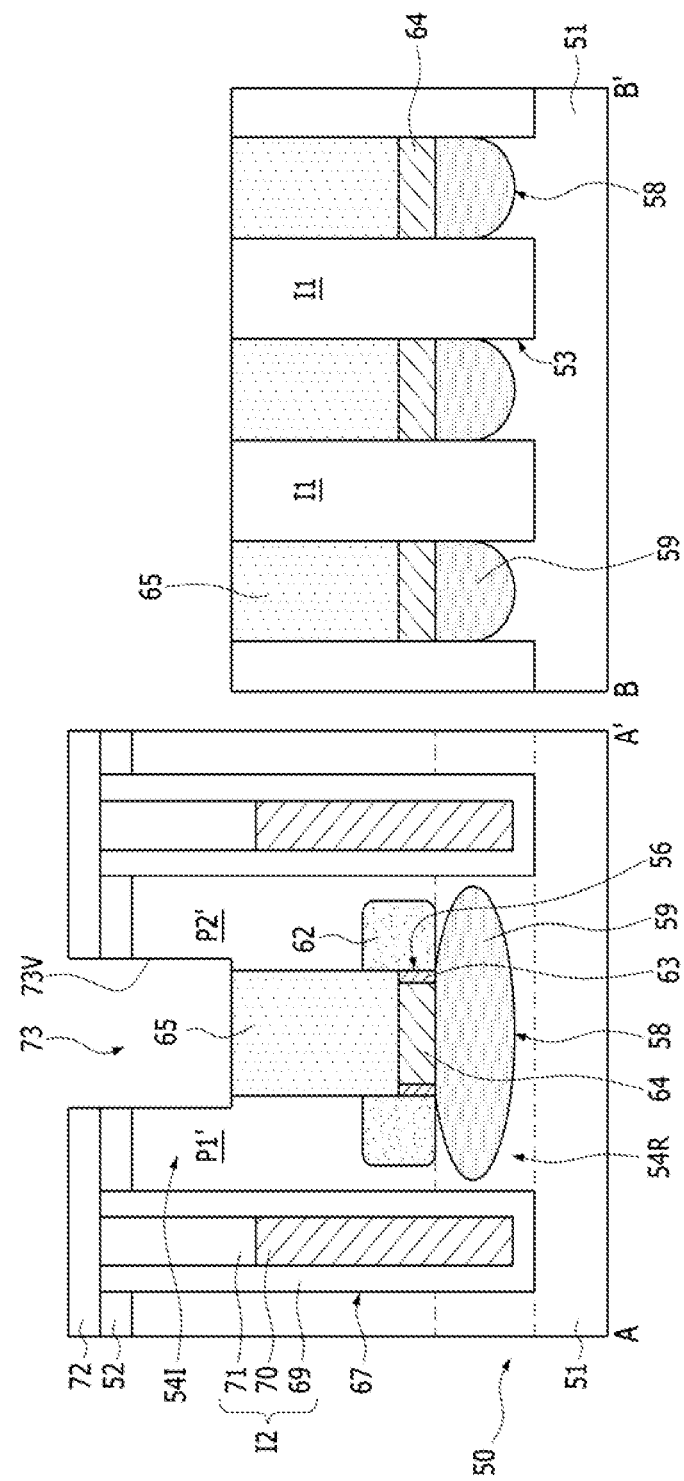
FIGS. 24A to 24H are cross-sectional views taken along the lines A-A', and B-B' of FIGS. 23A to 23H, respectively.

As shown in FIGS. 23A and 24A, a gate trench 73 may be prepared. Through a third hard mask layer 72 used as a mask, the bit line capping layer 65, the first device isolation region I1 and the pre-pillars P1' and P2' may be etched (refer to reference numeral 32A), in order to form the gate trench 73. The etching process for forming the gate trench 73 may be performed until the bit line capping layer 65 remains at a predetermined thickness. The gate trench 73 may be formed in a direction crossing the buried bit line 64. The gate trench 73 may extend in the second direction $\hat{2}$. At the bottom portion of the gate trench 73, the first junction region 62 may be exposed.

Through the gate trench 73, a pair of first and second pillars P1 and P2 may be formed. The first and second pillars P1 and P2 may be formed by etching the first and second pre-pillars P1' and P2'. Each of the first and second pillars P1 and P2 may have a plurality of sidewalls. When viewed along the direction B-B', the top surfaces of the first device isolation region I1 and the bit line capping layer 65 under the gate trench 73 may be at the same level.

Figure 23B:
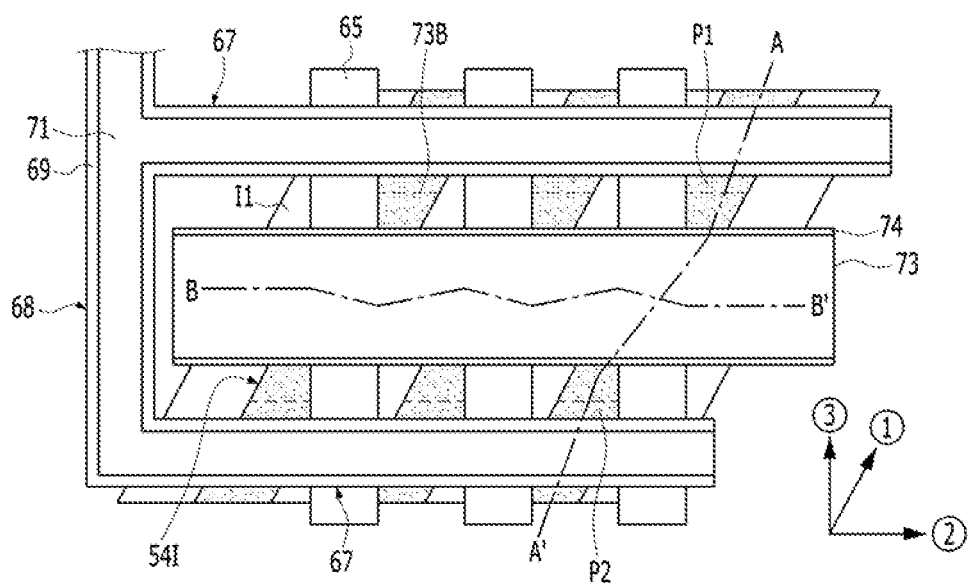
Figure 24B:
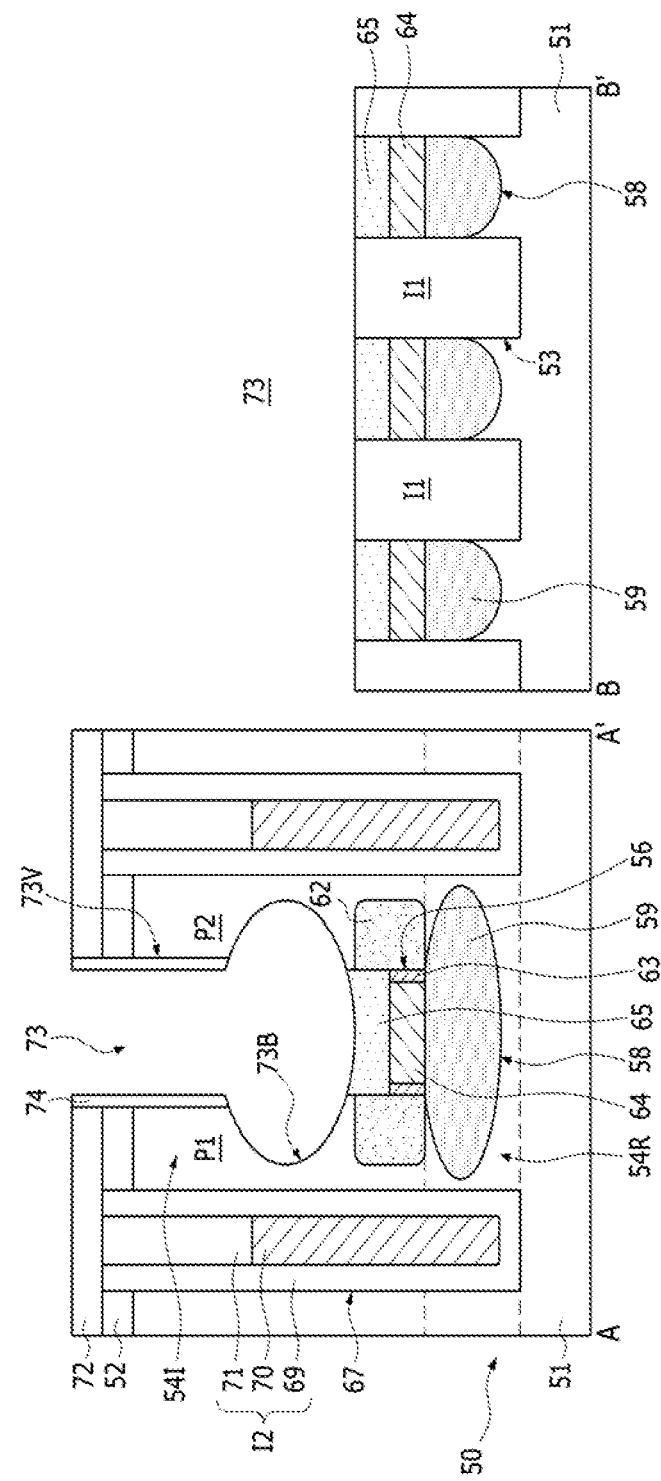

As shown in FIGS. 23B and 24B, the gate trench 73 may be expanded. For example, an isotropic etching process may be performed to selectively etch one sidewalls of the first and second pillars P1 and P2. Through such an expansion process, the bottom portion of the gate trench 73 may be expanded in the first direction $\hat{1}$. As a result, the gate trench 73 may include a vertical trench 73V and a bulb-shaped trench 73B. In order to form the bulb-shaped trench 73B, a sacrificial spacer 74 may be formed, and an isotropic etching process may be then performed. The sacrificial spacer 74 may include silicon oxide. The vertical trench 73V may contact with the sacrificial spacer 74. The bulb-shaped trench 73B may correspond to the bottom portion of the gate trench 73.

After the expansion process for the gate trench 73, the bit line capping layer 65 may remain with a predetermined thickness over the buried bit line 64.

Figure 23C:
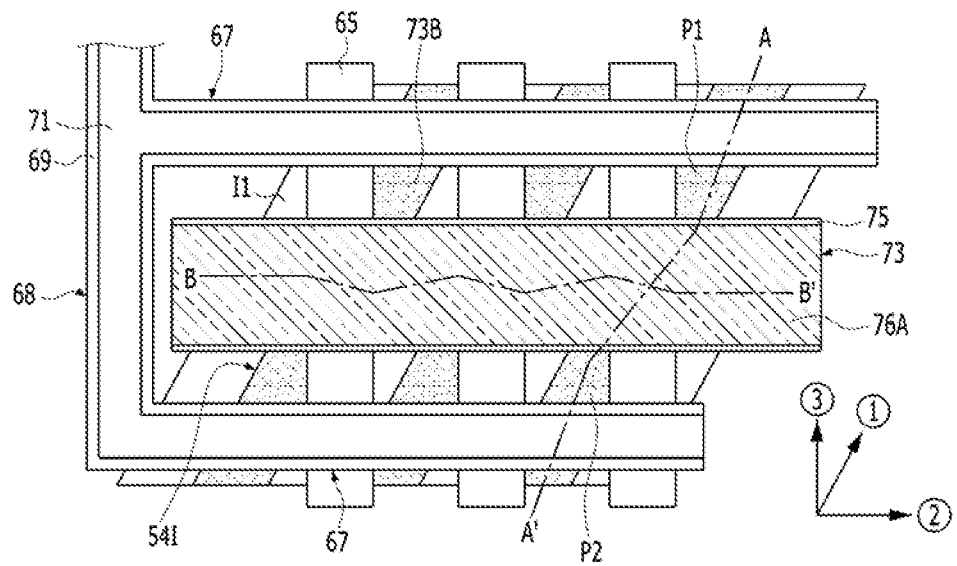
Figure 24C:
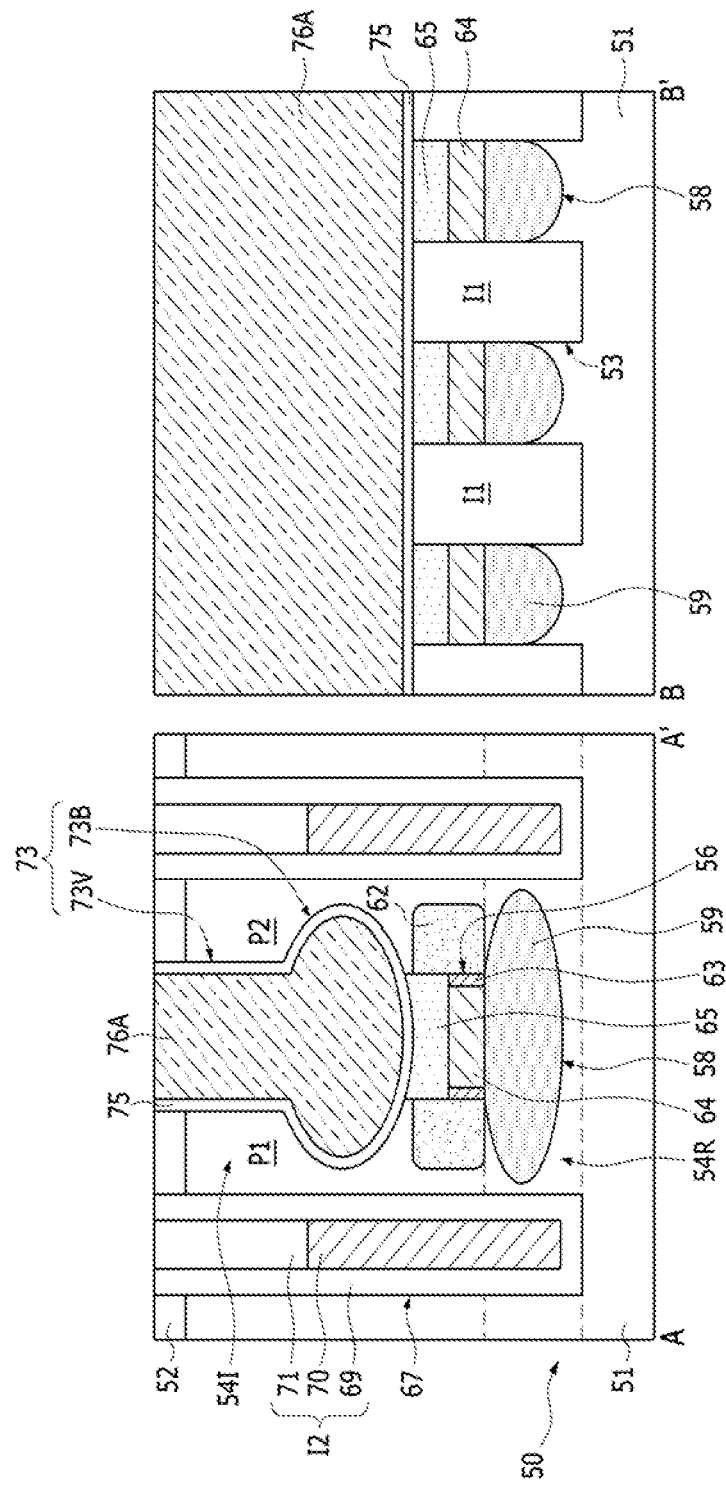

As shown in FIGS. 23C and 24C, the third hard mask layer 72 and the sacrificial spacer 74 may be removed. Then, a gate dielectric layer 75 may be formed on the surface of the gate trench 73. The gate dielectric layer 75 may be formed through thermal oxidation. In another embodiment, the gate dielectric layer 75 may be formed through Chemical Vapor Deposition (CVD) or Atomic Layer Deposition (ALD). The gate dielectric layer 75 may include a high-k dielectric, oxide, nitride, oxynitride, or combinations thereof. The high-k material may include a hafnium-containing material. The hafnium-containing material may include hafnium oxide, hafnium silicon oxide, hafnium silicon oxynitride or combinations thereof. In another embodiment, the high-k material may include lanthanum oxide, lanthanum aluminum oxide, zirconium oxide, zirconium silicon oxide, zirconium silicon oxynitride, aluminum oxide and combinations thereof. As for the high-k material, any known high-k material may be selectively used.

A first gate conductive layer 76A may be formed on the surface of the gate dielectric layer 75. The first gate conductive layer 76A may fill the gate trench 73. The first gate conductive layer 76A may include a low resistance metal. The first gate conductive layer 76A may be formed of titanium nitride or tungsten. In an embodiment, the first gate conductive layer 76A may include a stack of a bottom barrier layer and a low resistance layer. Furthermore, the first gate conductive layer 76A may include a high work function material for controlling a threshold voltage. The first gate conductive layer 76A may include TiAlN as the high work function material.

Then, the first gate conductive layer 76A may be planarized until the first hard mask layer 52 is exposed.

Figure 23D:
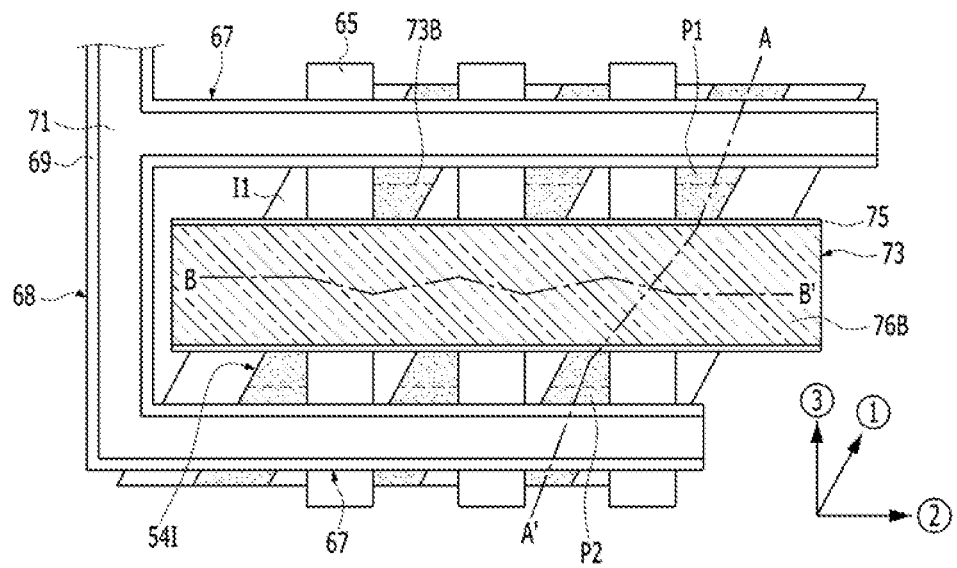
Figure 24D:
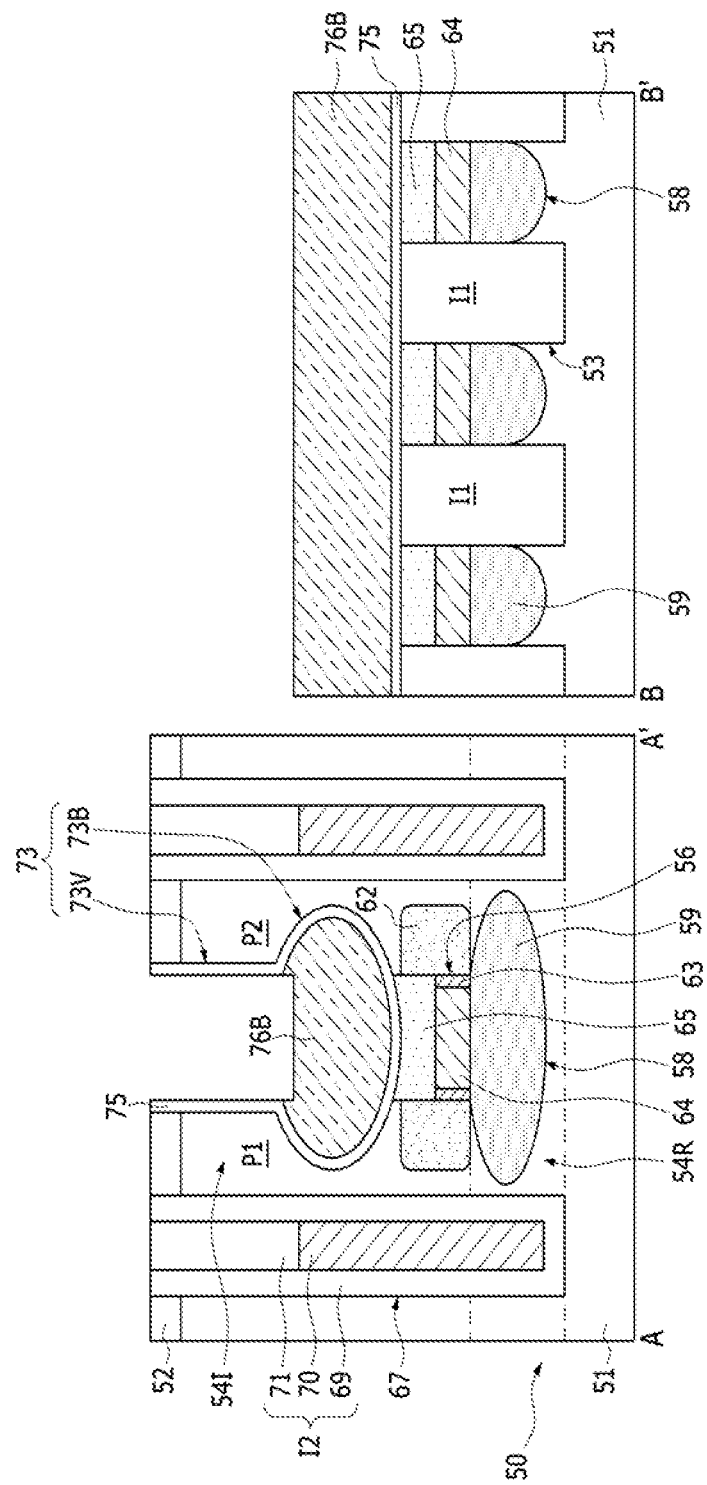

As shown in FIGS. 23D and 24D, a dry etching process may be performed in such a manner that a recessed first gate conductive layer 76B remains in the bulb-shaped trench 73B of the gate trench 73. For example, an etch-back process may be performed. The recessed first gate conductive layer 76B may be formed by an etch-back process against the first gate conductive layer 76A.

Figure 23E:
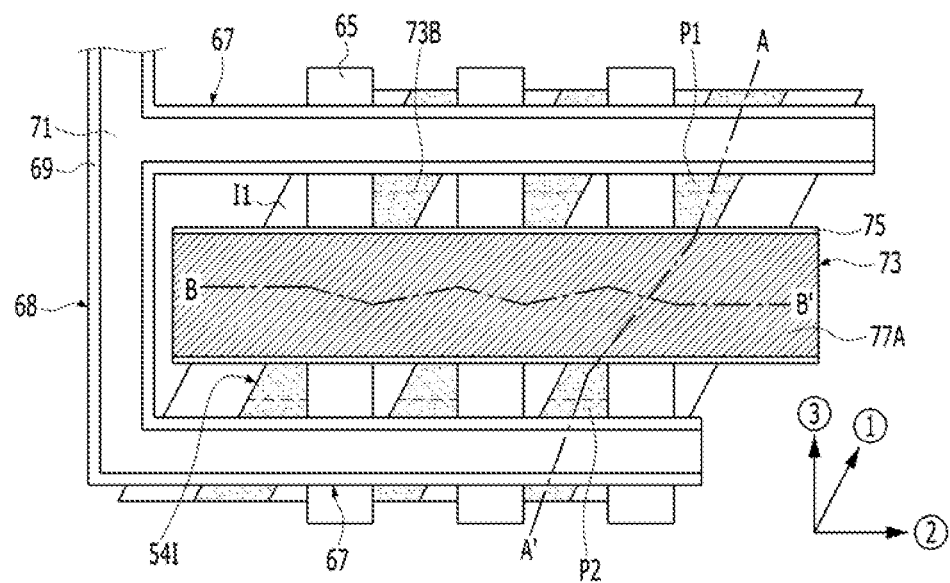
Figure 24E:
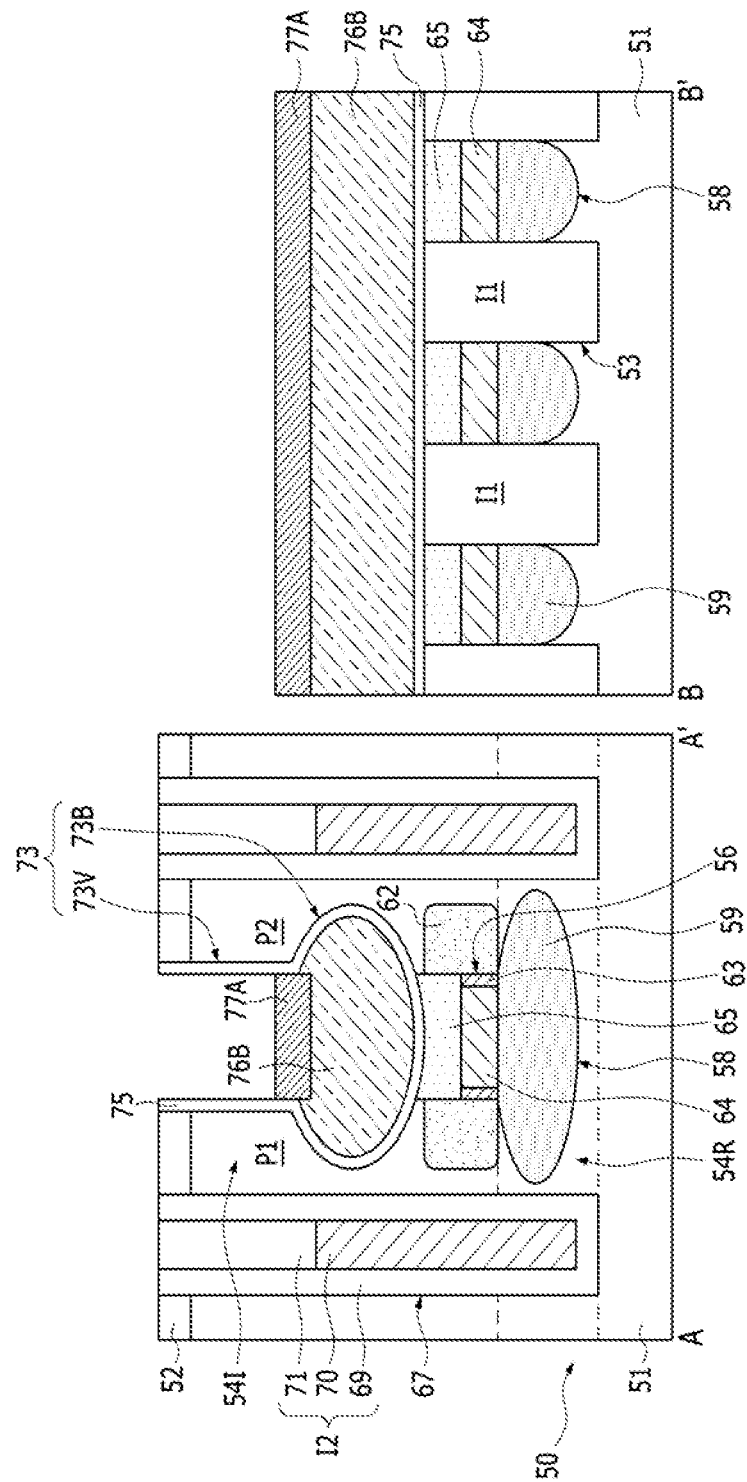

As shown in FIGS. 23E and 24E, a second gate conductive layer 77A may be formed. The second gate conductive layer 77A may be formed over the recessed first gate conductive layer 76B. For example, the second gate conductive layer 77A may be deposited on the entire surface of the resultant structure including the recessed first gate conductive layer 76B, and then recessed through an etch-back process. Thus, the second gate conductive layer 77A may remain only in the gate trench 73. The second gate conductive layer 77A may include polysilicon.

As such, the first gate conductive layer 76B and the second gate conductive layer 77A may be embedded in the gate trench 73. The top surface of the second gate conductive layer 77A may be recessed to a lower level than the top surfaces of the first and second pillars P1 and P2.

Figure 23F:
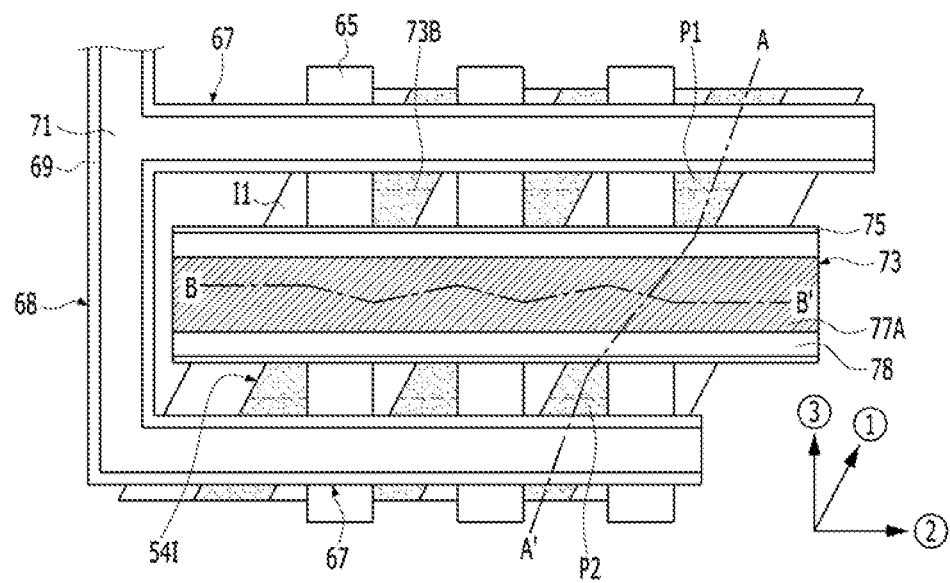
Figure 24F:
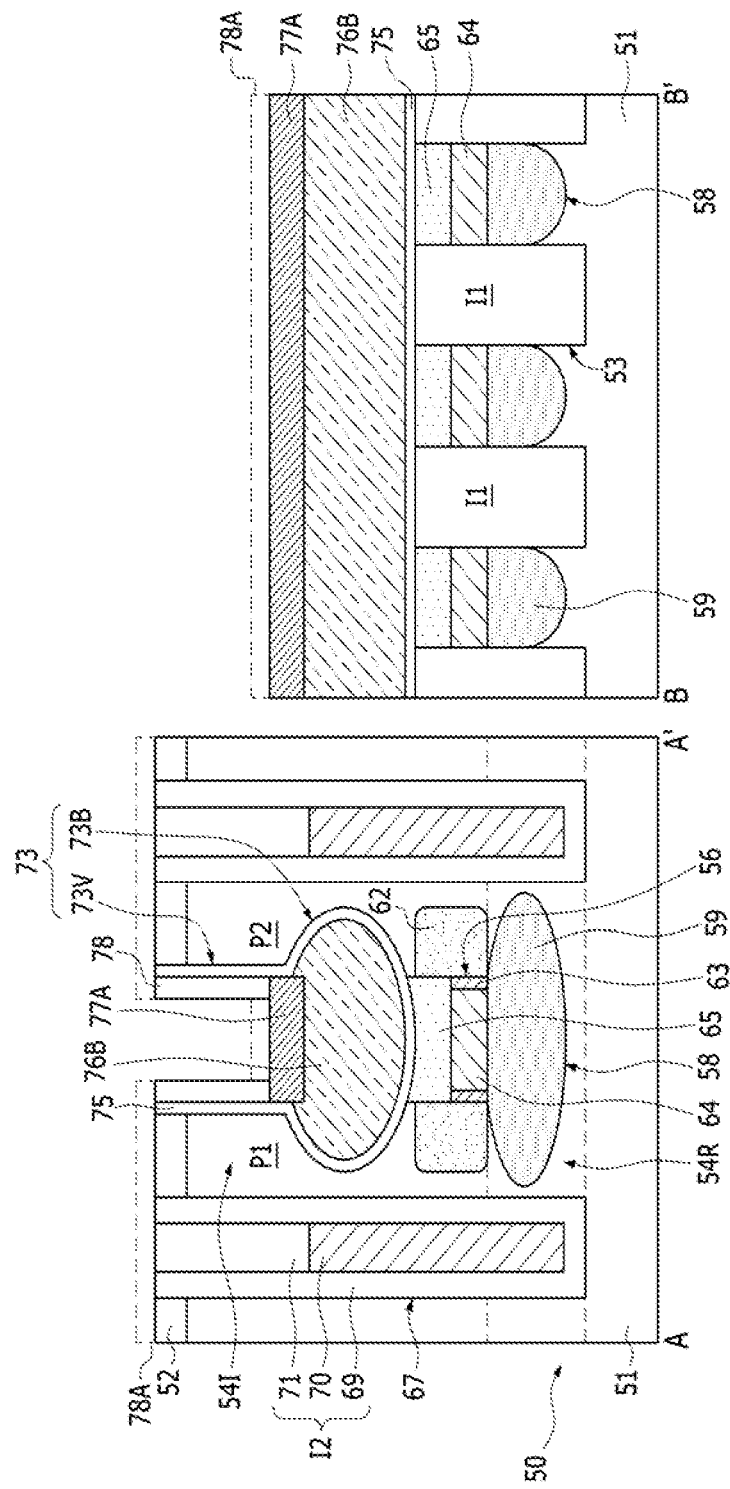

As shown in FIGS. 23F and 24F, a gate spacer layer 78A may be formed over a sidewall of the gate trench 73 and over the second gate conductive layer 77A. Then, the gate spacer layer 78A may be etched back. Thus, a gate spacer 78 may be formed over the second gate conductive layer 77A.

Figure 23G:
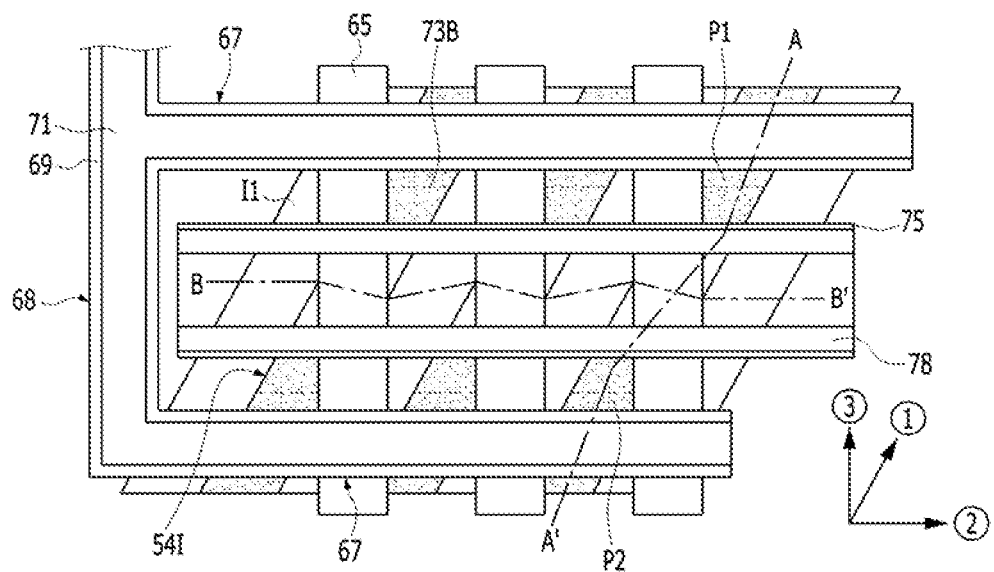
Figure 24G:
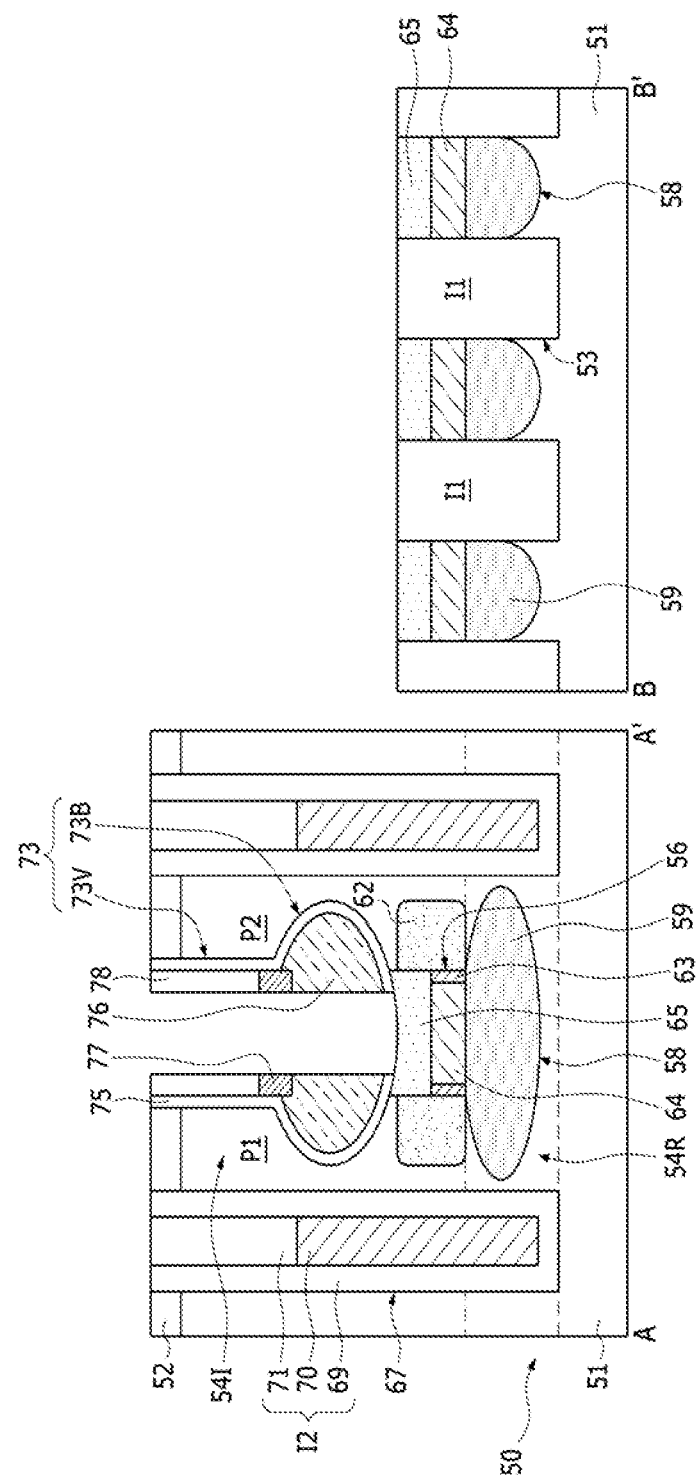

As shown in FIGS. 23G and 24G, the second gate conductive layer 77A and the first gate conductive layer 78B may be etched to be self-aligned with the gate spacer 78. Thus, a pair of gate electrodes G1 and G2 may be formed. For example, the pair of gate electrodes G1 and G2 may include a first gate electrode G1 and a second gate electrode G2. The first gate electrode G1 may overlap the sidewall of the first pillar P1.

The second gate electrode G2 may overlap the sidewall of the second pillar P2. Each of the first and second gate electrodes G1 and G2 may include a first electrode portion 76 and a second electrode portion 77. The first electrode portion 76 may be formed by etching the first gate conductive layer 76B. The second electrode portion 77 may be formed by etching the second gate conductive layer 77A. A part of the first electrode portion 76 may be formed in the bulb-shaped trench 73B of the gate trench 73. In another embodiment, the gate electrodes G1 and G2 may have a single structure, respectively. For example, the gate electrodes G1 and G2 may be formed of a metal-based material, respectively. The gate electrodes G1 and G2 may be formed of titanium nitride.

Figure 23H:
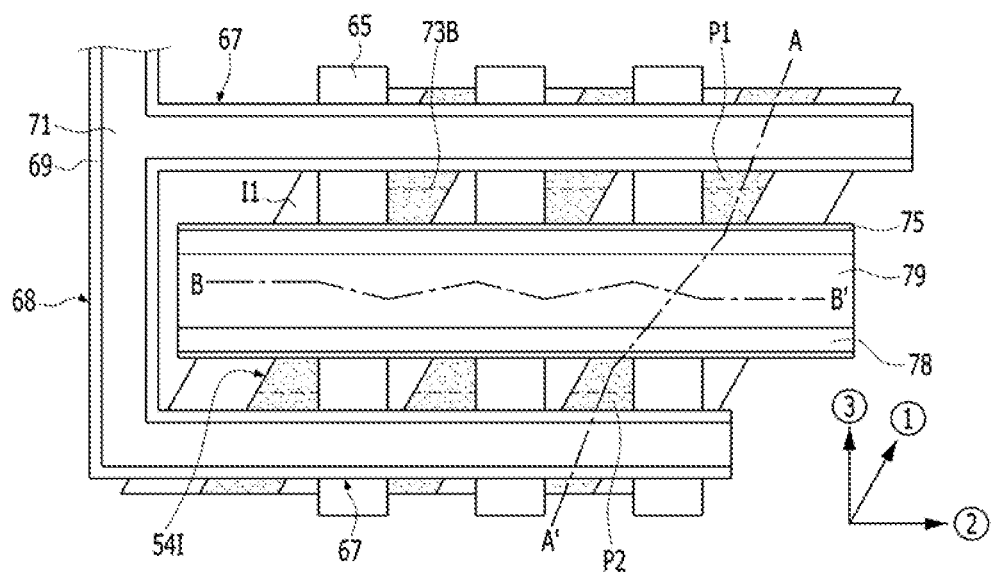
Figure 24H:
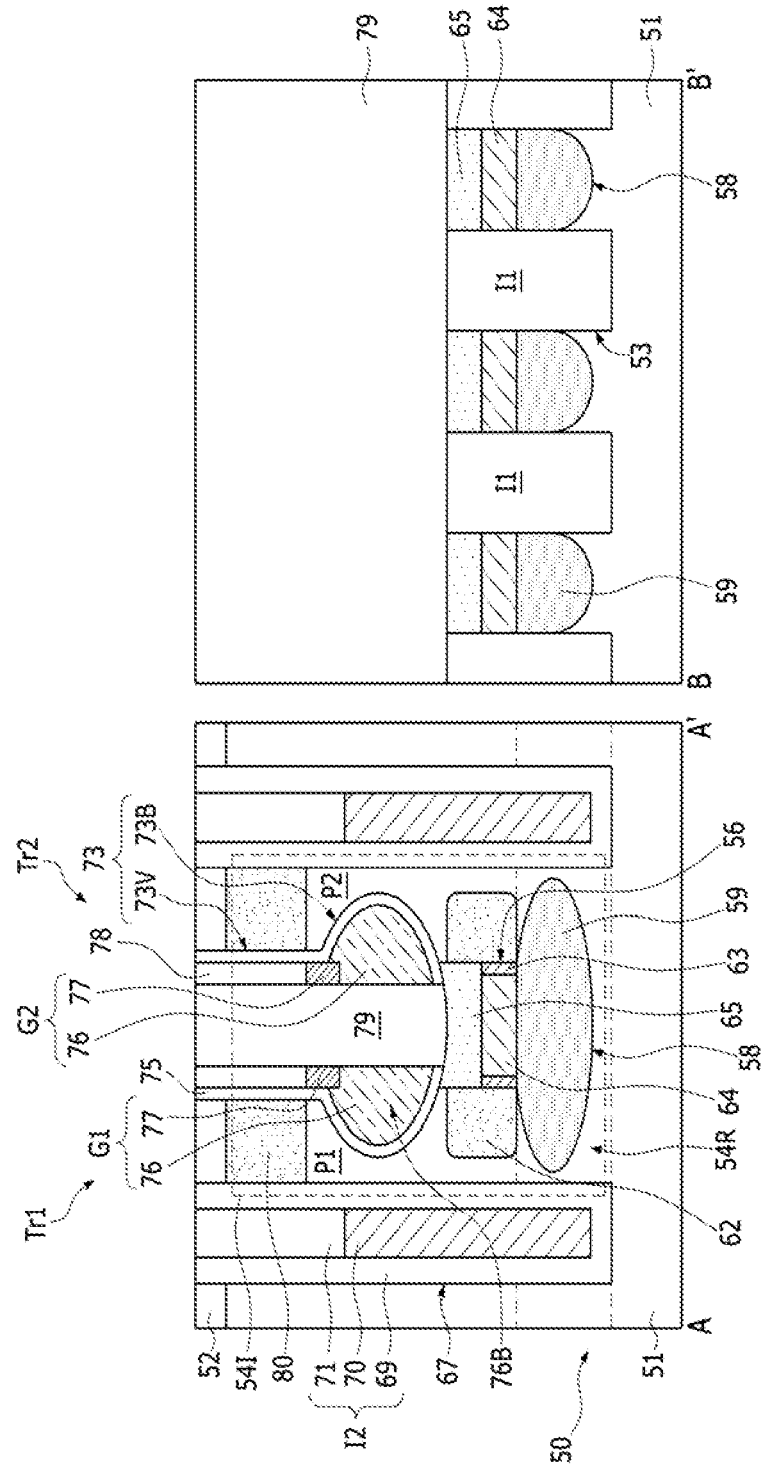

As shown in FIGS. 23H and 24H, a gate capping layer 79 may be formed. The gate capping layer 79 may include a dielectric material. Between the first and second gate electrodes G1 and G2, a gate capping layer 79 may be formed. The gate capping layer 79 may include silicon oxide. The gate capping layer 79 may be planarized until the top surface of the first hard mask layer 52 is exposed.

After the gate capping layer 79 is formed, an impurity doping process may be performed by an implant process or other doping technologies. Thus, a second junction region 80 may be formed in the first and second pillars P1 and P2. When the impurity doping process is performed, the gate capping layer 79 may be used as a barrier. The second junction region 80 may serve as a source region or a drain region. Between the first and second junction regions 62 and 80, a vertical channel may be defined.

As described above, the first gate electrode G1, the first junction region 62 and the second junction region 80 may constitute a first transistor Tr1. The second gate electrode G2, the first junction region 62 and the second junction region 80 may constitute a second transistor Tr2.

Although not illustrated, a memory element may be connected to the second junction region 80. In another embodiment, the second junction region 80 may be formed through an impurity doping process, after a contact hole (not illustrated) is formed. The contact hole may expose the top surfaces of the first and second pillars P1 and P2.

Figure 25:
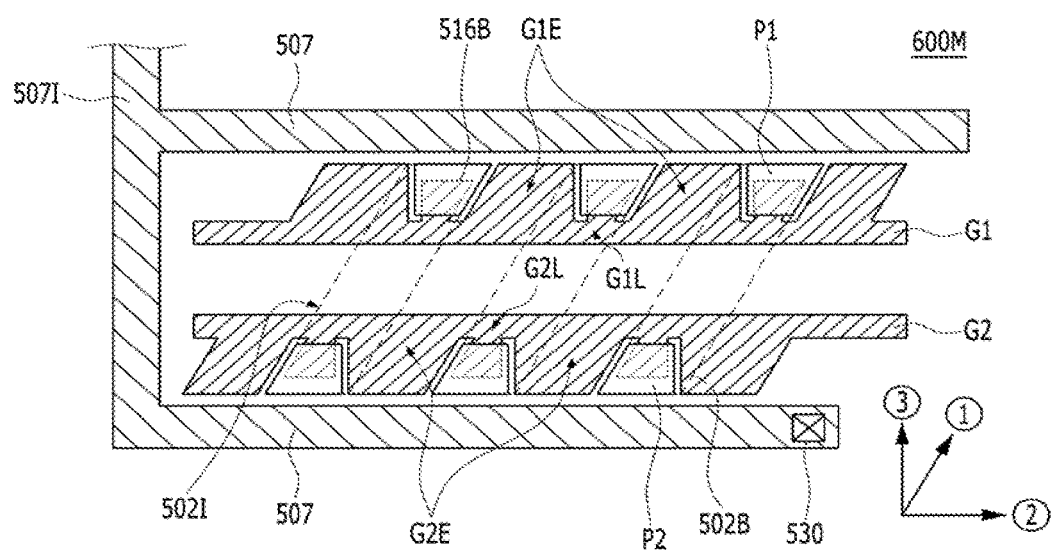
FIG. 25 is a plan view illustrating another example of the semiconductor device to which the fourth embodiment is applied.

FIG. 25 is a plan view illustrating another example of a semiconductor device to which the fourth embodiment is applied. Referring to FIG. 25, a memory cell 600M may be similar to the memory cell 500M of FIG. 14A. The first gate electrode G1 may further include a plurality of first branch portions G1E. The plurality of first branch portions G1E may extend in the first direction. The second gate electrode G2 may further include a plurality of second branch portions G2E. The plurality of second branch portions G2E may extend in the first direction. The first gate electrode G1 may further include a first elongated portion G1L extending in the second direction. The plurality of first branch portions G1E may extend from the first elongated portion G1L. The second gate electrode G2 may further include a second elongated portion G2L extending in the second direction. The plurality of second branch portions G2E may extend from the second elongated portion G2L. The plurality of first branch portions G1E and the first elongated portion G1L may partially surround a side surface of the first pillar P1. The plurality of second branch portions G2E and the second elongated portion G2L may partially surround a side surface of the second pillar P2.

The first branch portions G1E and the second branch portions G2E may correspond to the second electrode portion E2 and the third electrode portion E3 of FIG. 2A. Thus, the first branch portions G1E and the first elongated portion G1L may surround at least three side surfaces of the first pillar P1, and the second branch portions G2E and the second elongated portion G2L may surround at least three side surfaces of the second pillar P2.

The first gate electrode G1 may include the first branch portions G1E and bulb-shaped portions 516B. The second gate electrode G2 may include the second branch portions G2E and bulb-shaped portions 516B. The bulb-shaped portion 516B may be expanded into the side surface of the first and second pillars P1 and P2. The bulb-shaped portion 516B, the first and second branch portions G1E and G2E may surround at least three side surfaces of the first and second pillars P1 and P2, respectively.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising: forming a plurality of first isolation trenches and a plurality of line-shaped active regions by etching a semiconductor substrate;
   forming a line-shaped device isolation region in each of the plurality of first isolation trenches;
   forming a plurality of second isolation trenches extending in a second direction by etching the plurality of line-shaped active regions and the plurality of line-shaped device isolation regions;
   forming a connection trench to connect the plurality of second isolation trenches to each other; and
   forming a shielding line in each of the plurality of second isolation trenches;
   forming a shielding line interconnection in the connection trench;
   after the forming of the shielding line and the shielding line interconnection, forming a
   bit line trench extending in a first direction by etching the plurality of line-shaped active regions
   and the plurality of line-shaped device isolation regions;
   forming a buried bit line in the bit line trench;
   forming a bulb-shaped body trench by etching the bottom surface of the bit line trench; and
   forming only a punch-through preventing layer in the bulb-shaped body trench.

2. The method of claim 1, wherein the forming of the plurality of second isolation trenches includes:
   etching the plurality of line-shaped active regions to define a plurality of island-shaped active regions; and
   etching the plurality of line-shaped device isolation regions to define a plurality of first device isolation regions.

3. The method of claim 1, wherein the forming of the plurality of second isolation trenches and the forming of the connection trench are performed substantially at the same time.

4. The method of claim 1, wherein the forming of the shielding line and the shielding line interconnection comprises:
   forming a line layer to cover the plurality of second isolation trenches and the connection trench;
   forming a shield layer over the liner layer, wherein the shield layer fills the plurality of second isolation trenches and the connection trench; and
   etching back the shield layer.

5. The method of claim 4, wherein the shield layer comprises a boron-doped polysilicon layer.

6. The method of claim 2, further comprising, after the forming of the shielding line and the shielding line interconnection:
   forming a gate trench by etching each of the plurality of island-shaped active regions and each of the plurality of first device isolation regions; and
   forming a gate electrode in the gate trench.

7. The method of claim 6, wherein the forming of the gate trench comprises:
   forming a vertical trench in a direction crossing the buried bit line;
   forming a sacrificial spacer over a sidewall of the vertical trench; and
   forming a bulb-shaped trench by etching the bottom portion of the vertical trench through an isotropic etching process,
   wherein the bulb-shaped trench communicates with the vertical trench.

8. The method of claim 7, wherein the forming of the gate electrode comprises:
   forming a first gate conductive layer in the bulb-shaped trench;
   forming a second gate conductive layer in a lower portion of the vertical trench and over the first gate conductive layer;

forming a gate spacer on a sidewall of a upper portion of the vertical trench and over the second gate conductive layer; and etching the second gate conductive layer and the first gate conductive layer using the gate spacer as a barrier.

9. The method of claim 8, wherein the first gate conductive layer comprises a metallic material, and the second gate conductive layer comprises polysilicon.

\* \* \* \* \*